(12) United States Patent
Tremaine et al.

(10) Patent No.: US 9,819,158 B2
(45) Date of Patent: Nov. 14, 2017

(54) INTEGRATED ELECTRICAL ASSEMBLY FOR HOUSING MODULAR UNITS AND RELATED COMPONENTS THEREOF

(71) Applicant: QTran, Inc., Milford, CT (US)

(72) Inventors: John M. Tremaine, New Canaan, CT (US); Adrian R. Teschemaker, West Haven, CT (US)

(73) Assignee: QTran, Inc., Milford, CT (US)

( * ) Notice: Subject to any disclaimer, the term of this patent is extended or adjusted under 35 U.S.C. 154(b) by 0 days.

(21) Appl. No.: 15/030,529

(22) PCT Filed: Oct. 20, 2014

(86) PCT No.: PCT/US2014/061315
§ 371 (c)(1),
(2) Date: Apr. 19, 2016

(87) PCT Pub. No.: WO2015/061200
PCT Pub. Date: Apr. 30, 2015

(65) Prior Publication Data
US 2016/0241002 A1 Aug. 18, 2016

Related U.S. Application Data

(60) Provisional application No. 61/893,664, filed on Oct. 21, 2013, provisional application No. 62/003,456, filed on May 27, 2014.

(51) Int. Cl.
*H02B 1/28* (2006.01)
*H02B 1/44* (2006.01)
*H02B 1/38* (2006.01)
*H02G 3/12* (2006.01)
*H05K 5/02* (2006.01)

(52) U.S. Cl.
CPC ............... *H02B 1/28* (2013.01); *H02B 1/38* (2013.01); *H02B 1/44* (2013.01); *H02G 3/12* (2013.01); *H05K 5/0221* (2013.01)

(58) Field of Classification Search
CPC combination set(s) only.
See application file for complete search history.

(56) References Cited

U.S. PATENT DOCUMENTS

| 2,397,102 | A | 3/1946 | Graham |
| 2,398,901 | A | 4/1946 | West |
| 2,787,773 | A | 4/1957 | Potter |
| 4,334,261 | A | 6/1982 | Gonzales |

(Continued)

FOREIGN PATENT DOCUMENTS

GB 17512 0/1908

*Primary Examiner* — Dhirubhai R Patel
(74) *Attorney, Agent, or Firm* — Ware, Fressola, Maguire & Barber LLP

(57) ABSTRACT

Exemplary embodiments of the present invention are directed to an integrated electrical assembly that may include an enclosure having a frame, a mounting flange extending around a periphery of the frame, a swing door coupled to the frame by a hinge, a first gasket coupled to the frame that engages a perimeter of the swing door when the swing door is in a closed position, a second gasket coupled to a perimeter of the mounting flange, and a master tub within the enclosure. The master tub may include a plurality of coupled enclosures that may be configured to receive at least one electrical component.

9 Claims, 70 Drawing Sheets

(56) References Cited

U.S. PATENT DOCUMENTS

| | | | |
|---|---|---|---|
| 5,232,277 | A | 8/1993 | Cassady et al. |
| 5,238,133 | A | 8/1993 | Cox |
| 5,831,212 | A | 11/1998 | Whitehead et al. |
| 6,170,928 | B1 | 1/2001 | Eardley et al. |
| 8,222,522 | B1 * | 7/2012 | Easthouse ............... H02G 3/088 174/66 |
| 2001/0023772 | A1 | 9/2001 | Layne |
| 2003/0116338 | A1 * | 6/2003 | Pearce ................... H02B 1/305 174/50 |
| 2007/0145871 | A1 | 6/2007 | Christie |
| 2009/0283291 | A1 | 11/2009 | Ni |
| 2011/0005800 | A1 | 1/2011 | Magno, Jr. |
| 2012/0024803 | A1 | 2/2012 | Replogle |
| 2012/0200211 | A1 | 8/2012 | Yanni |
| 2016/0234953 | A1 * | 8/2016 | Ellingson ............... H05K 5/061 |

* cited by examiner

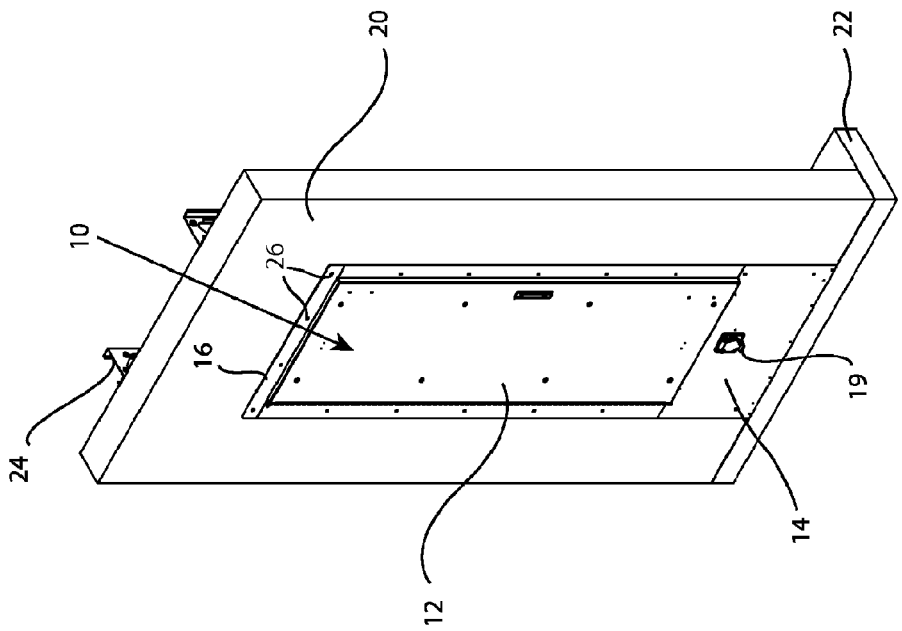
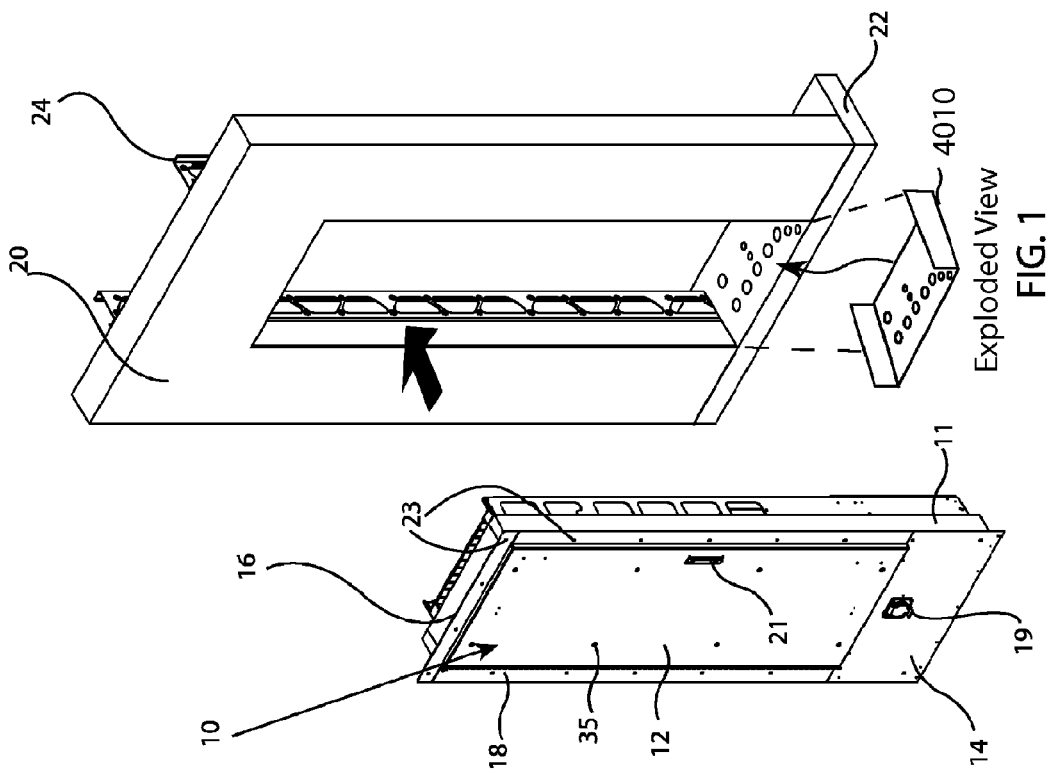

Isometric View

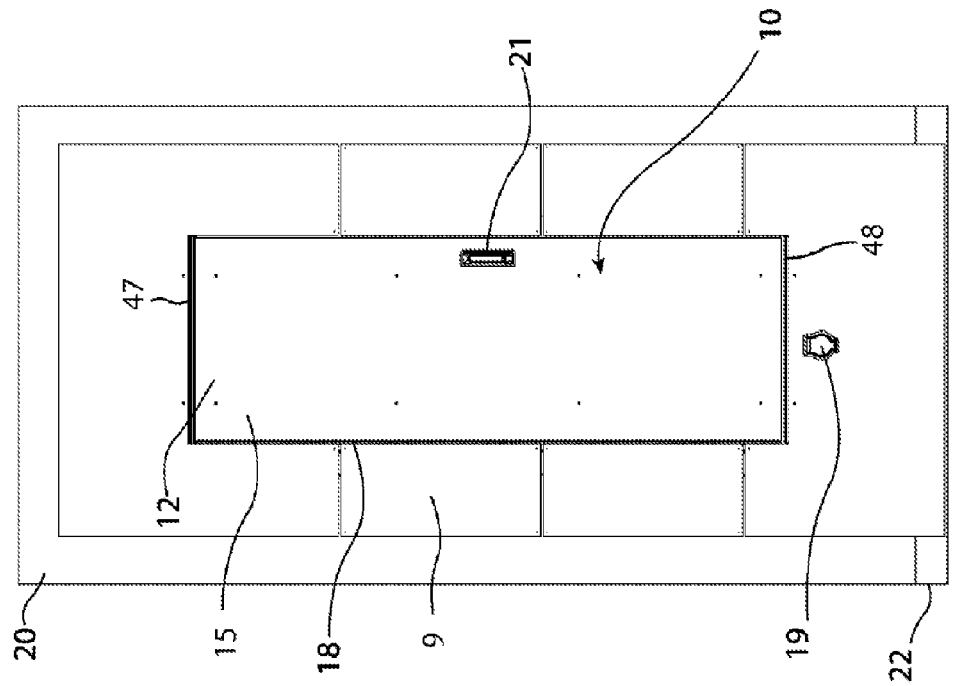
FIG. 3A Front View
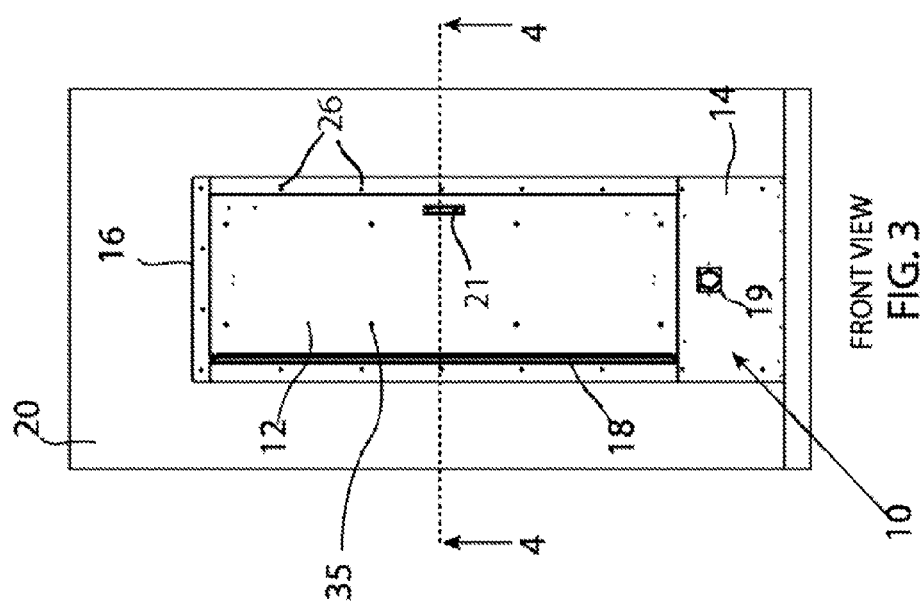
FRONT VIEW
FIG. 3

Bottom View

Top View

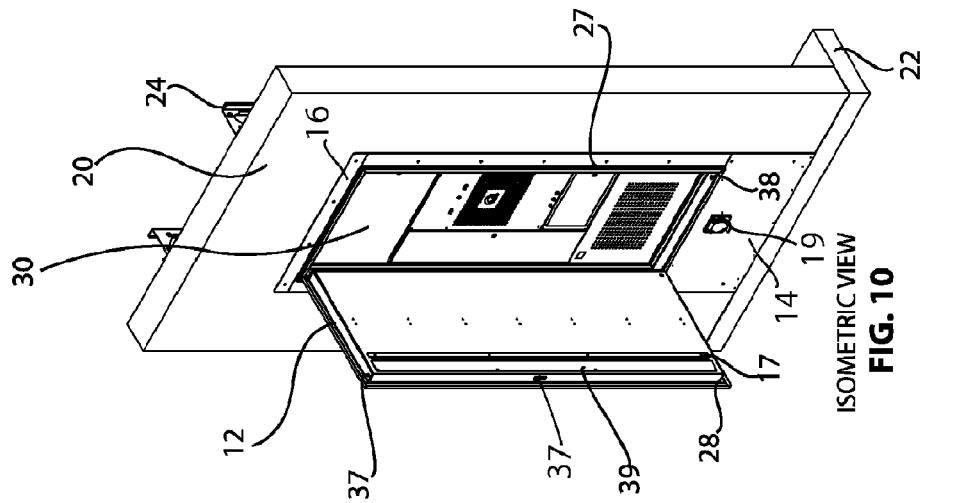
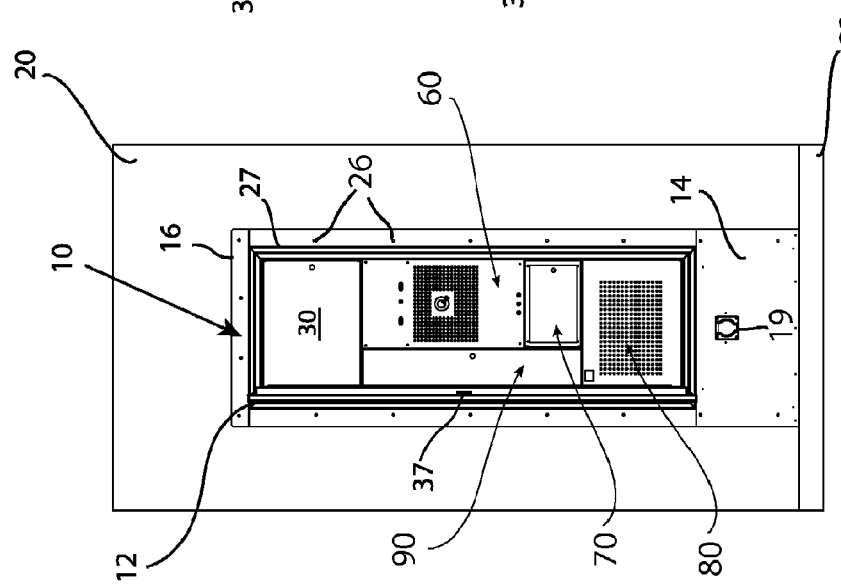
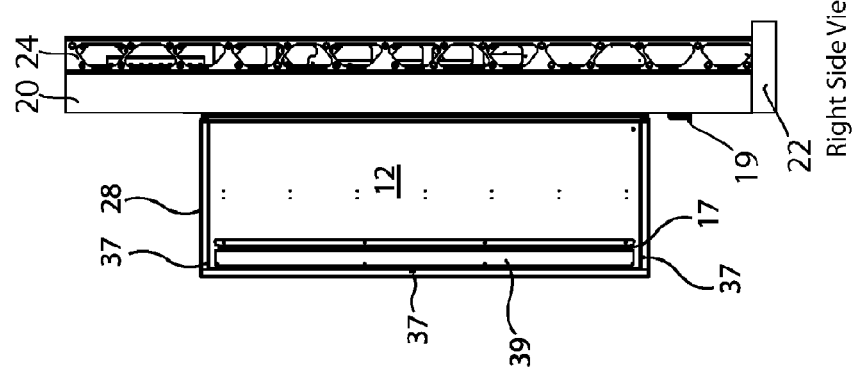

Top View

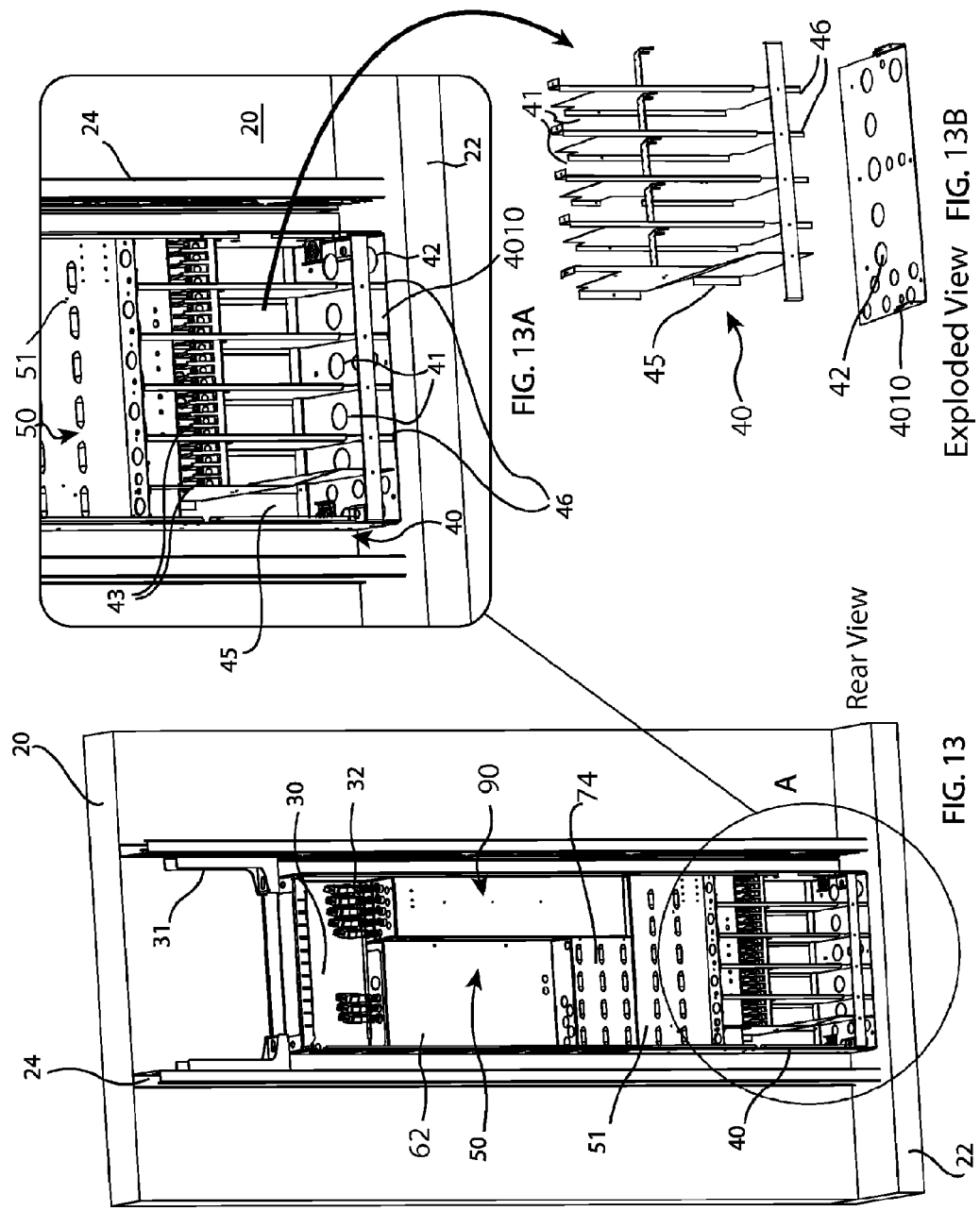

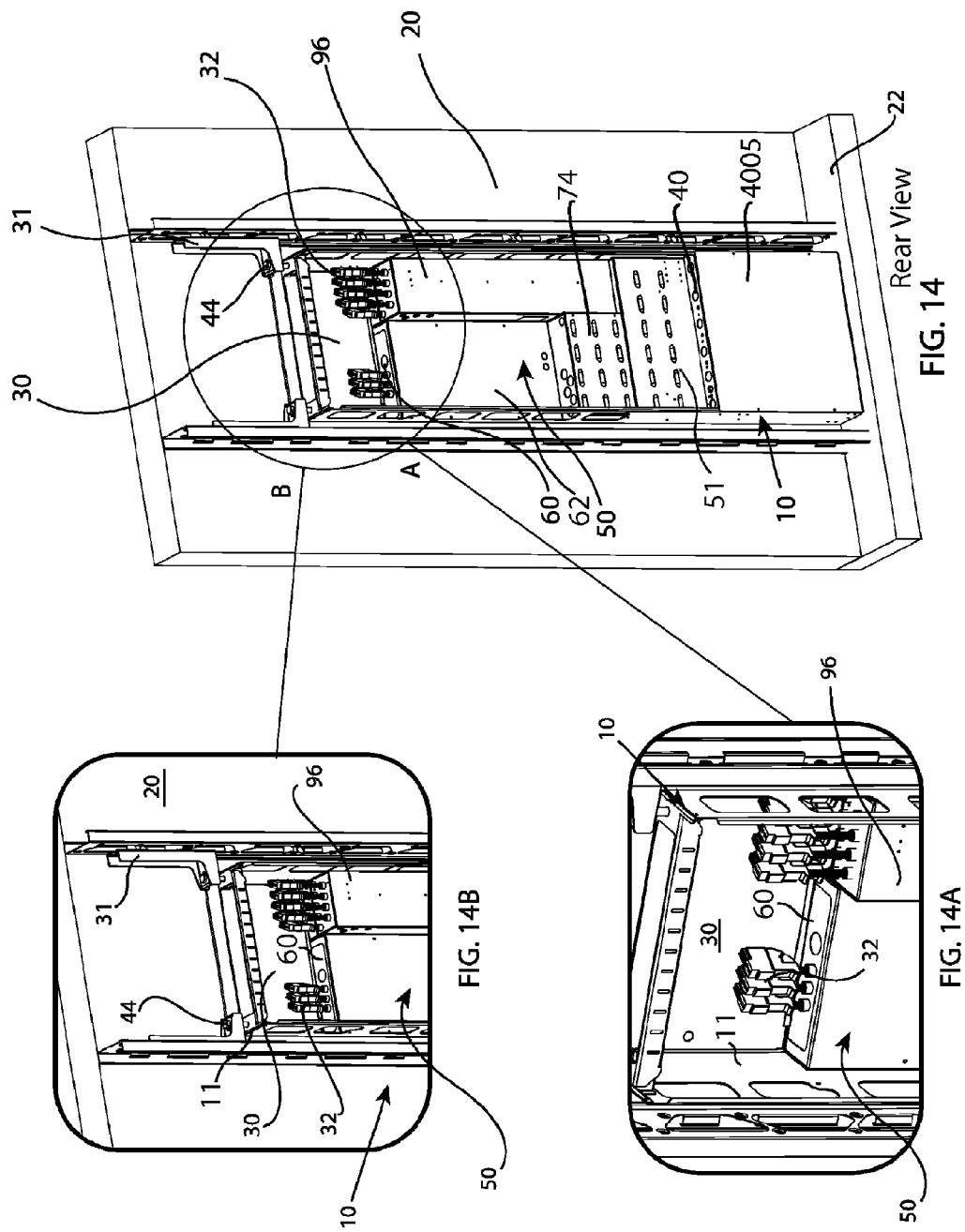

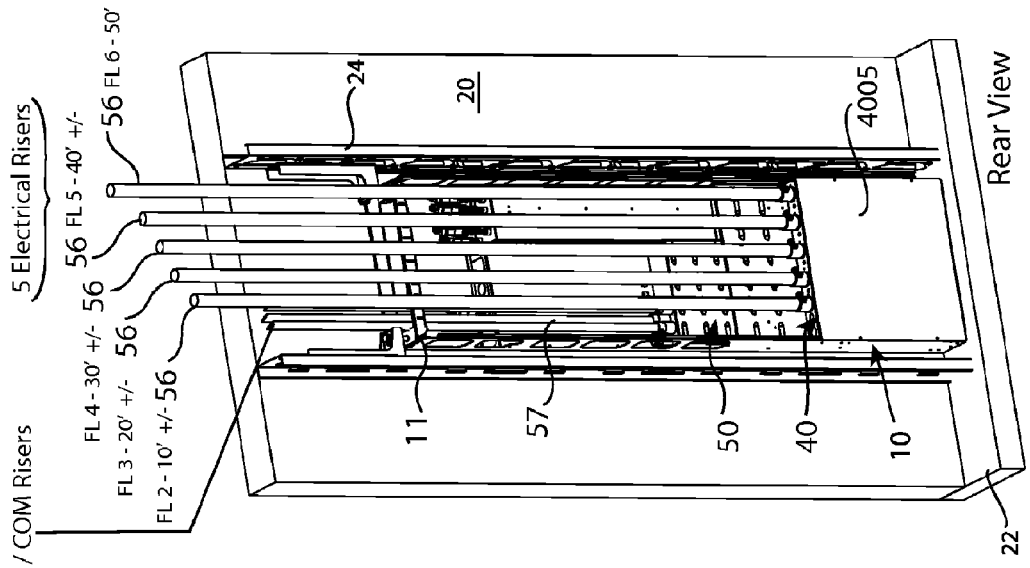
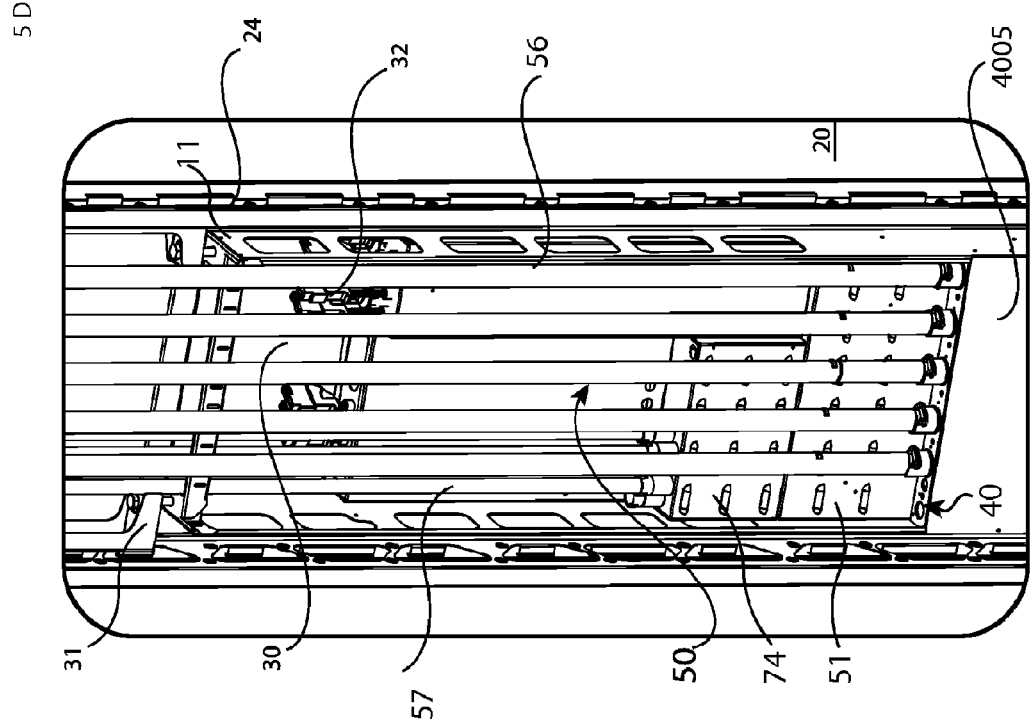

ISOMETRIC BACK VIEW

ISOMETRIC FRONT VIEW

FRONT

2ND FLOOR AND UP

LEFT SIDE

BACK  Without plate 4005

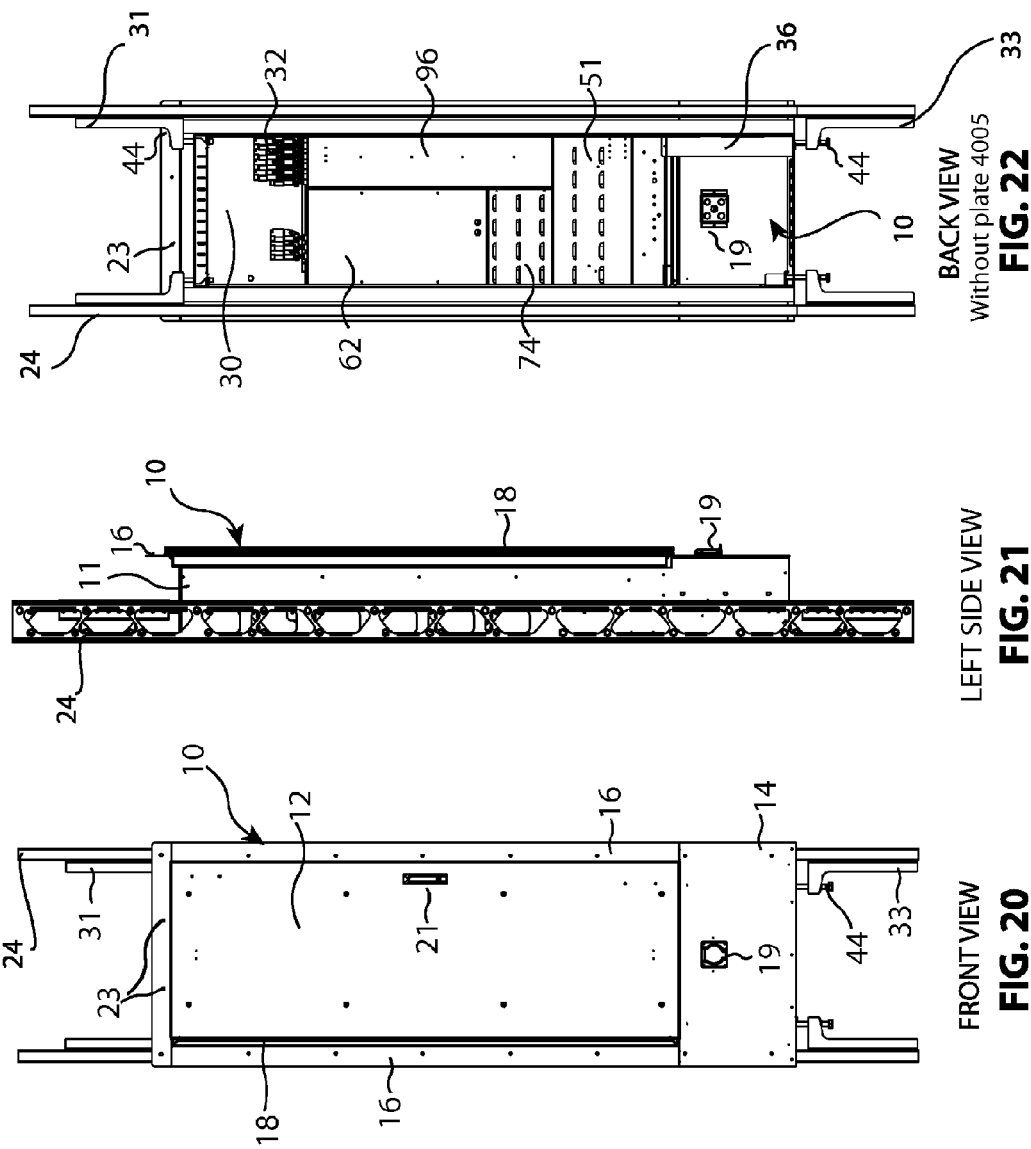

ISOMETRIC FRONT VIEW

Without Panel

ISOMETRIC BACKVIEW

ISOMETRIC VIEW

Left Side View

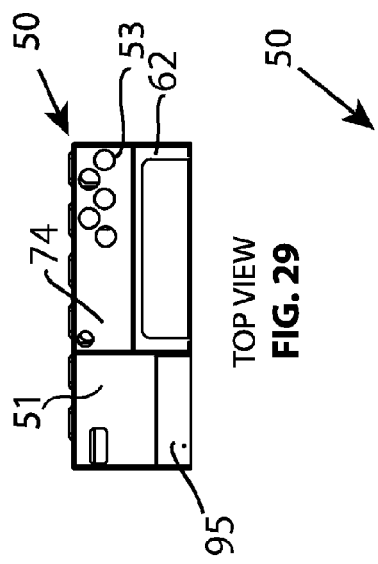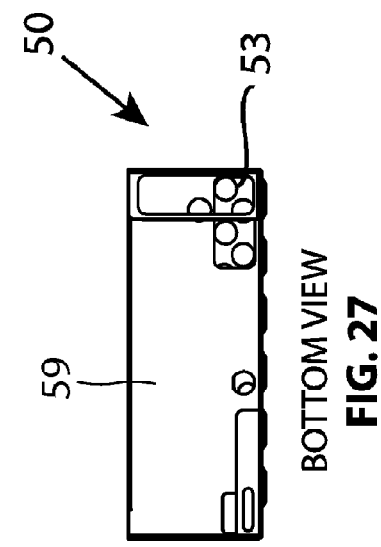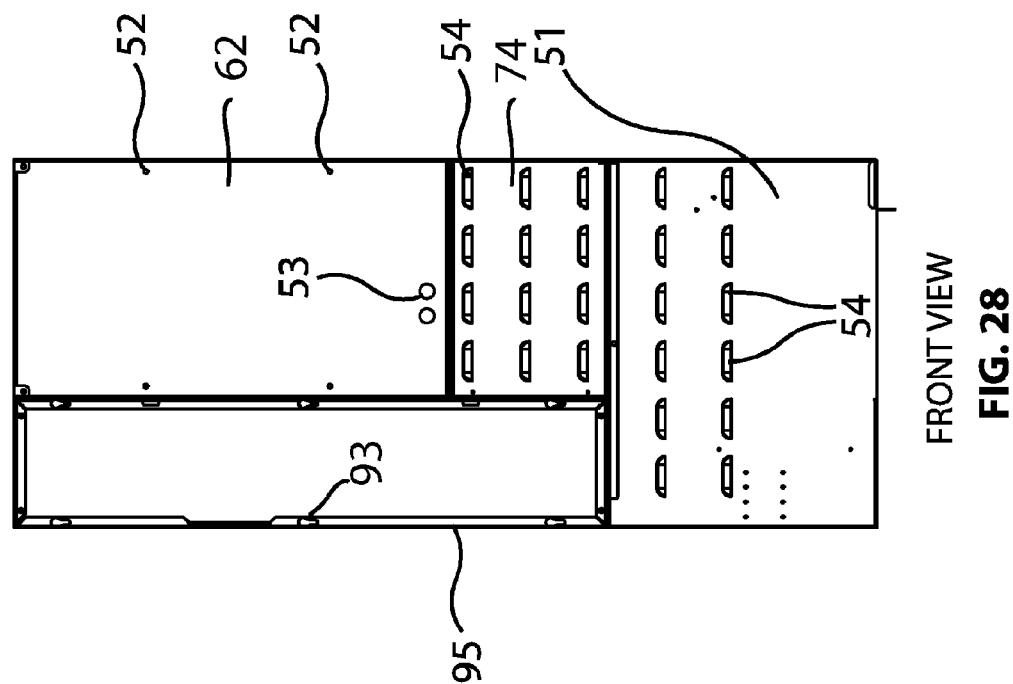

ISOMETRIC VIEW

RIGHT SIDE VIEW

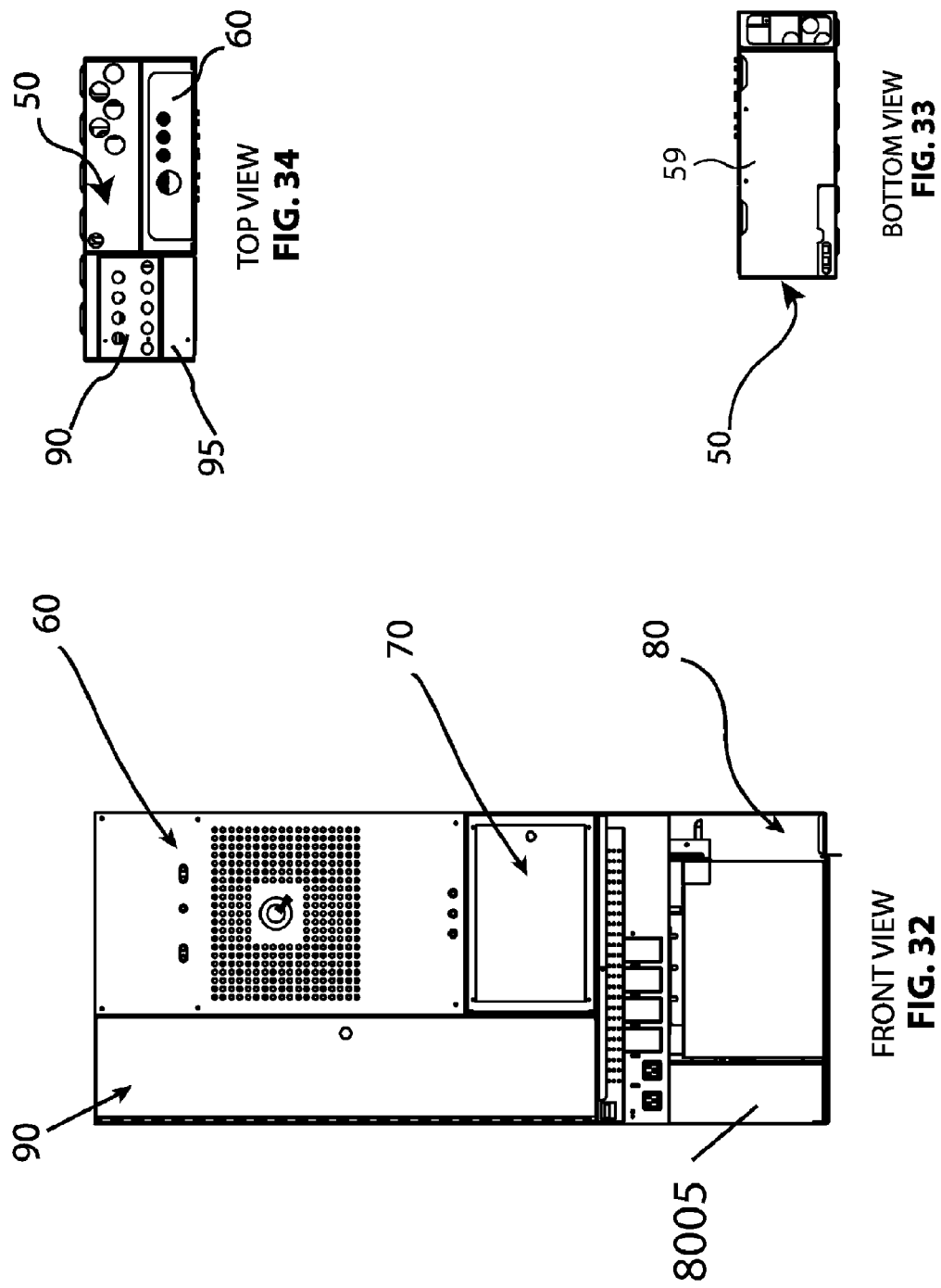

Exploded View

Front Isometric View

Right Side View

Front View

Bottom View

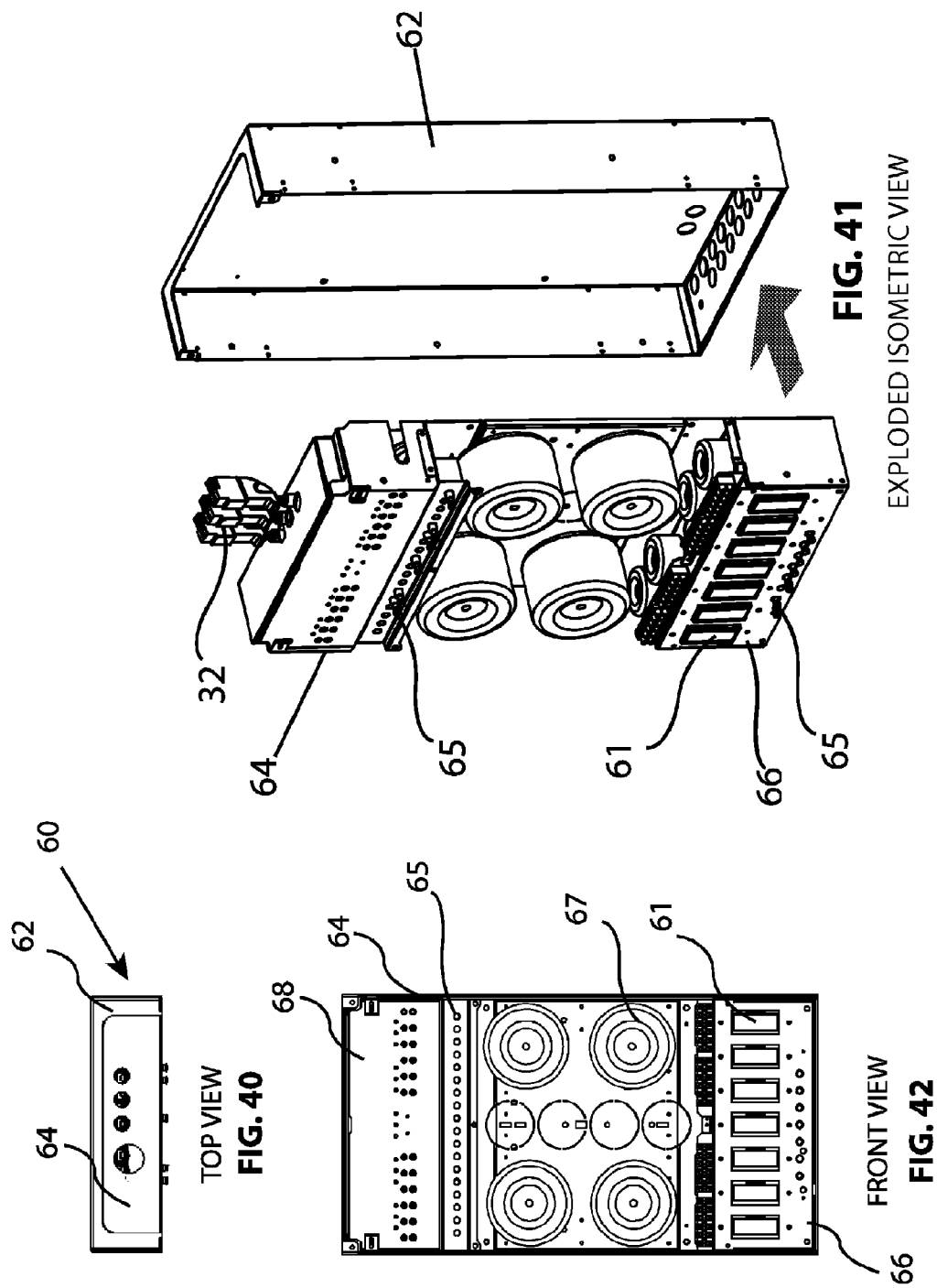

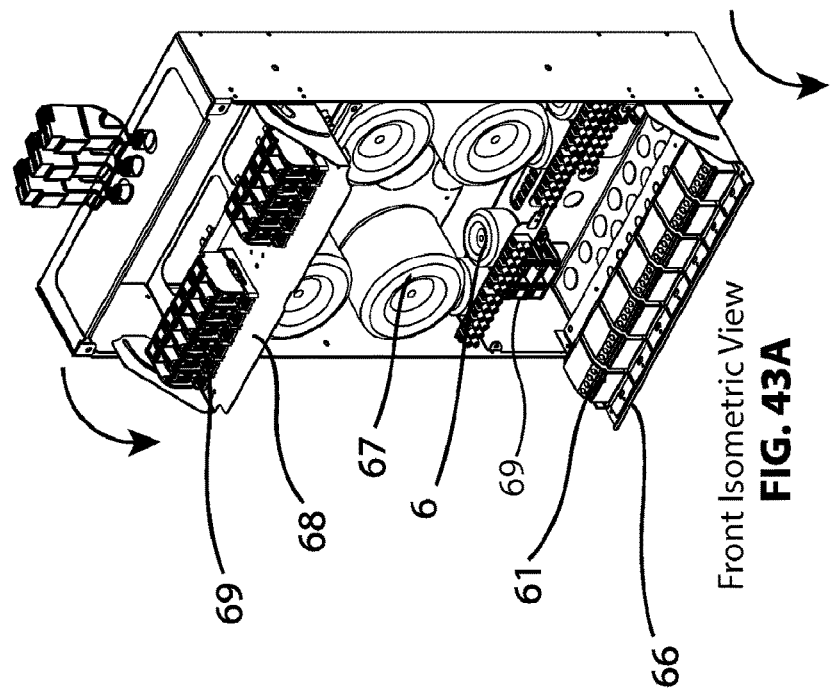
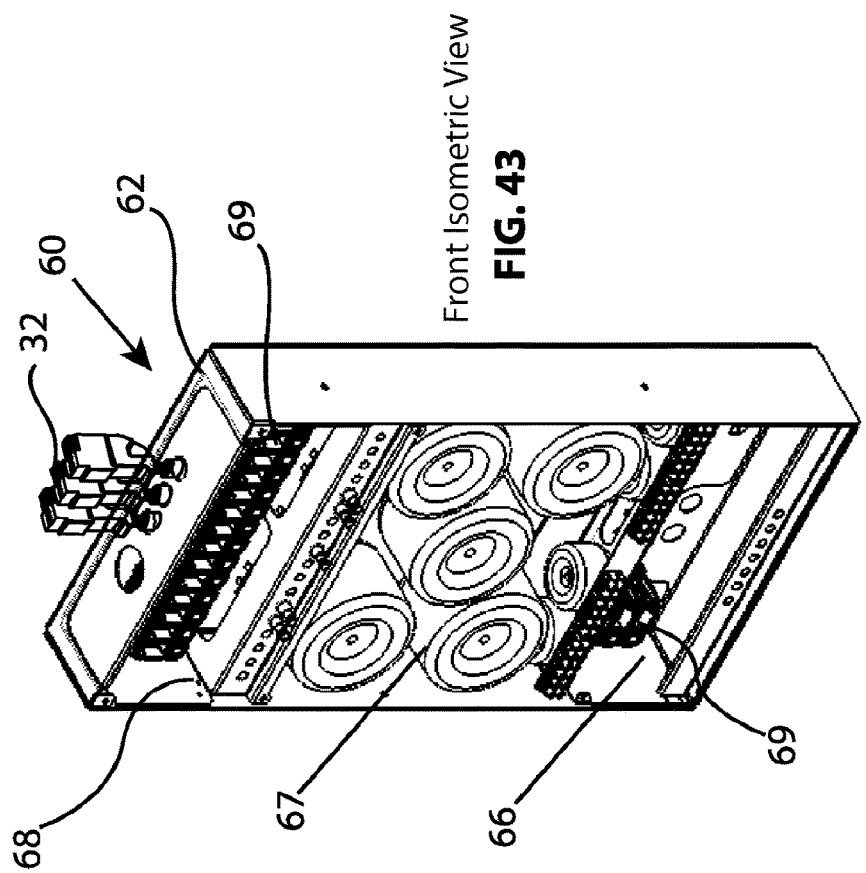

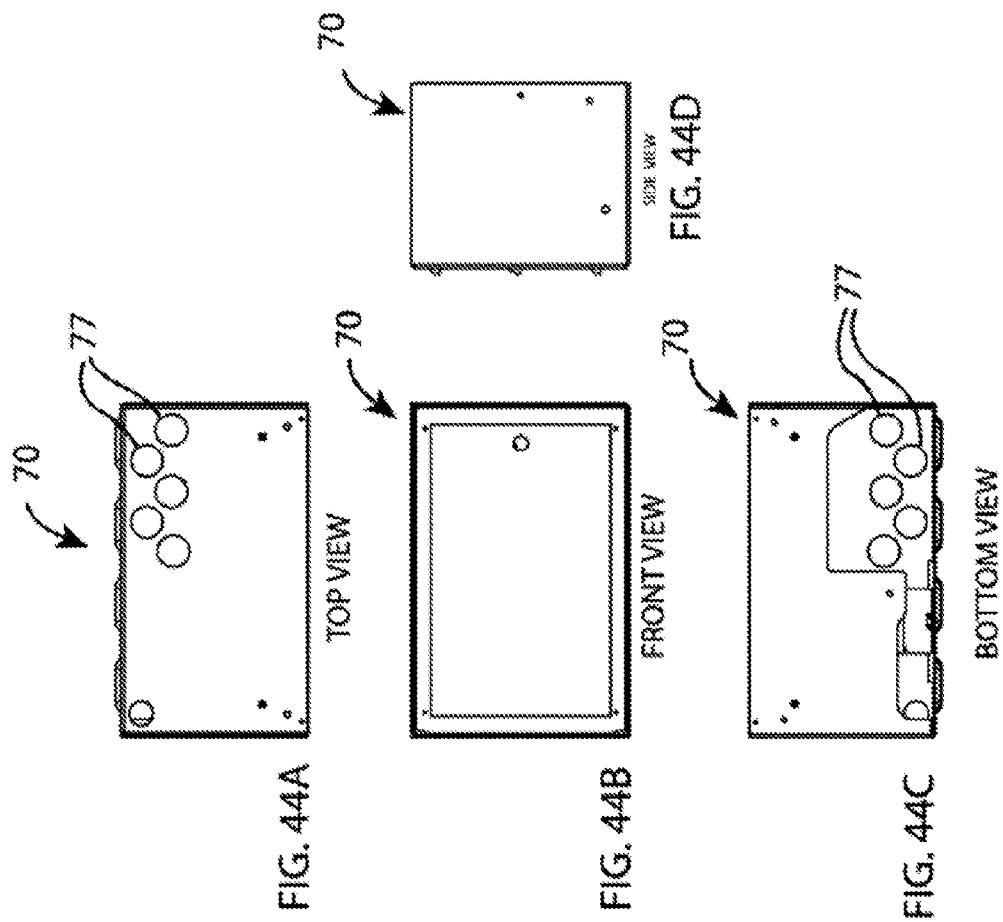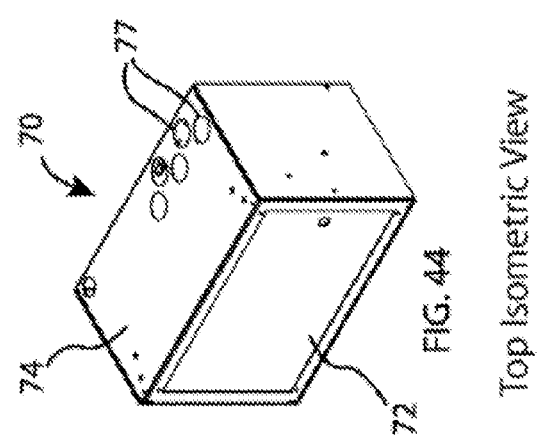

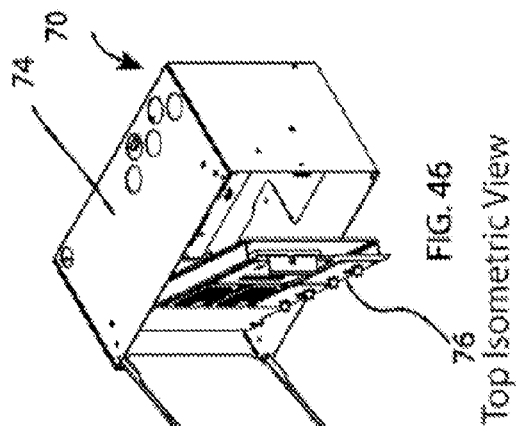
FIG. 45 Top Isometric View
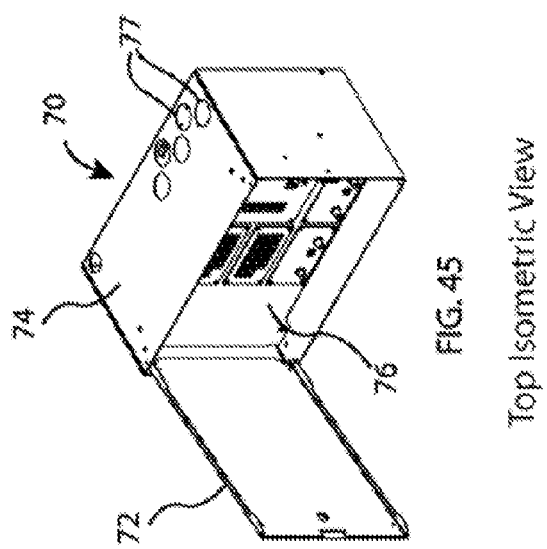
FIG. 46 Top Isometric View
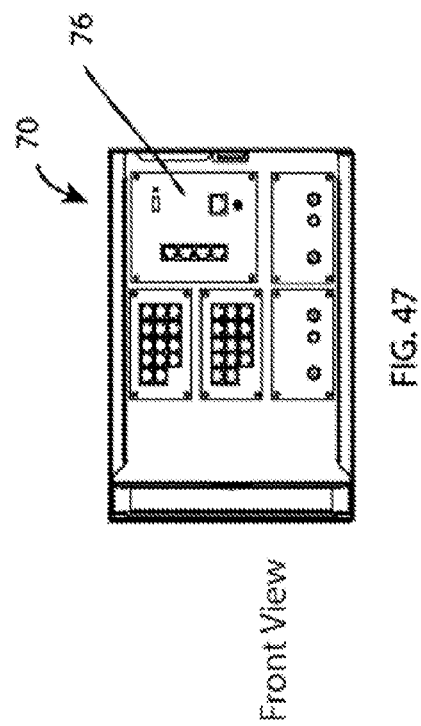
FIG. 47 Front View

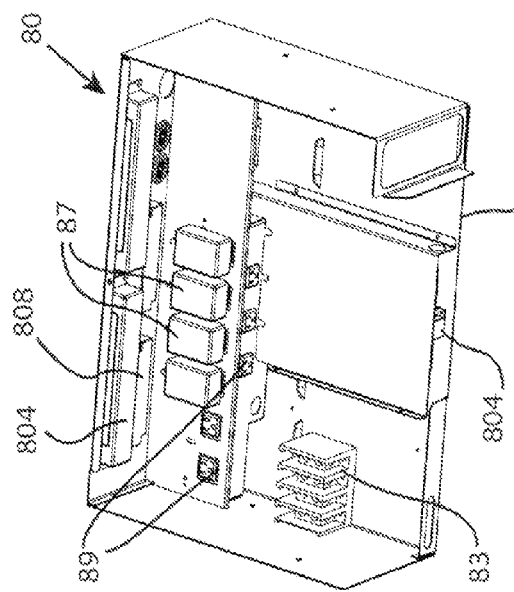
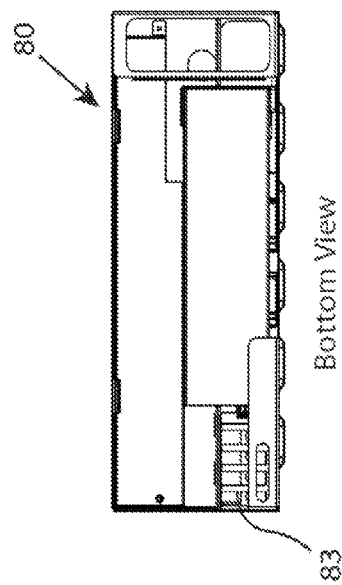
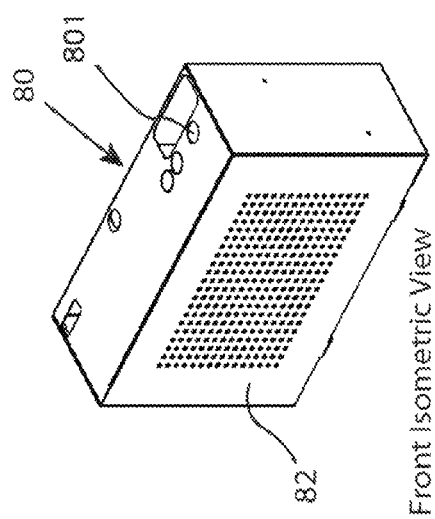
FIG. 48A Front View
FIG. 49 Bottom View
FIG. 48 Front Isometric View

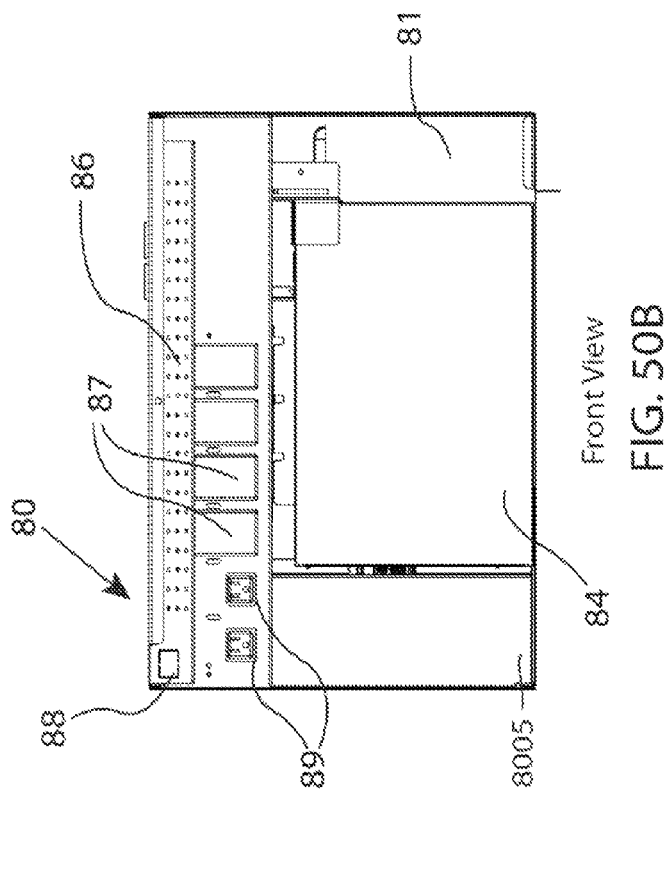
FIG. 50B Front View
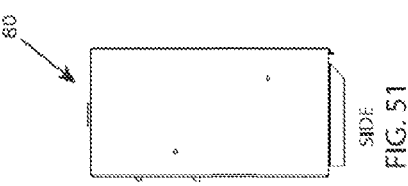
FIG. 51 Side
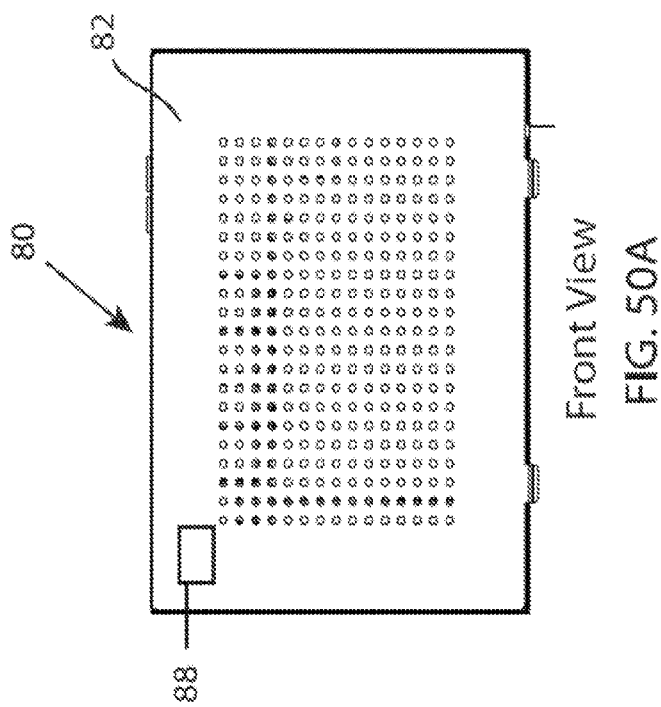
FIG. 50A Front View

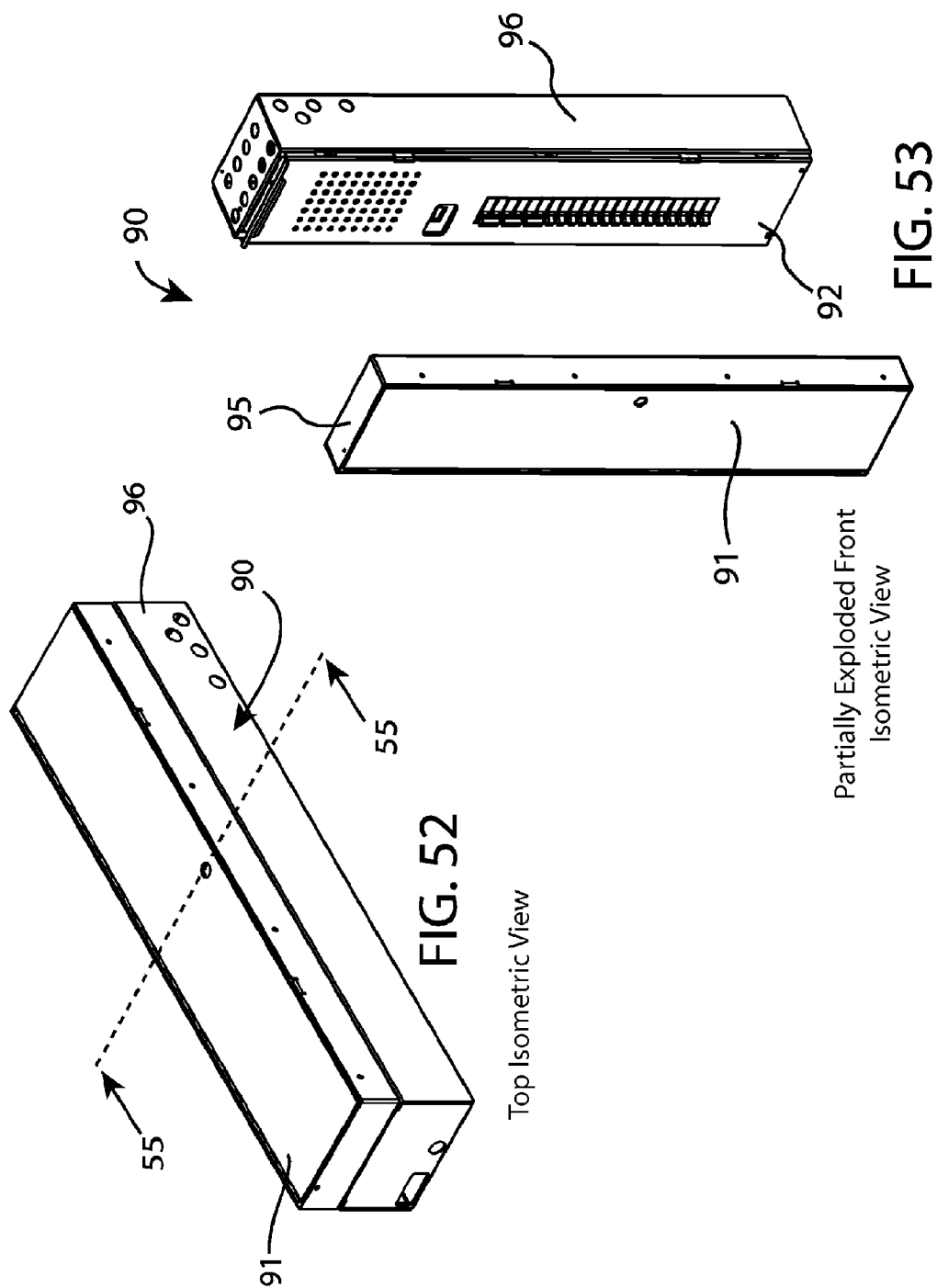

Exploded Isometric View

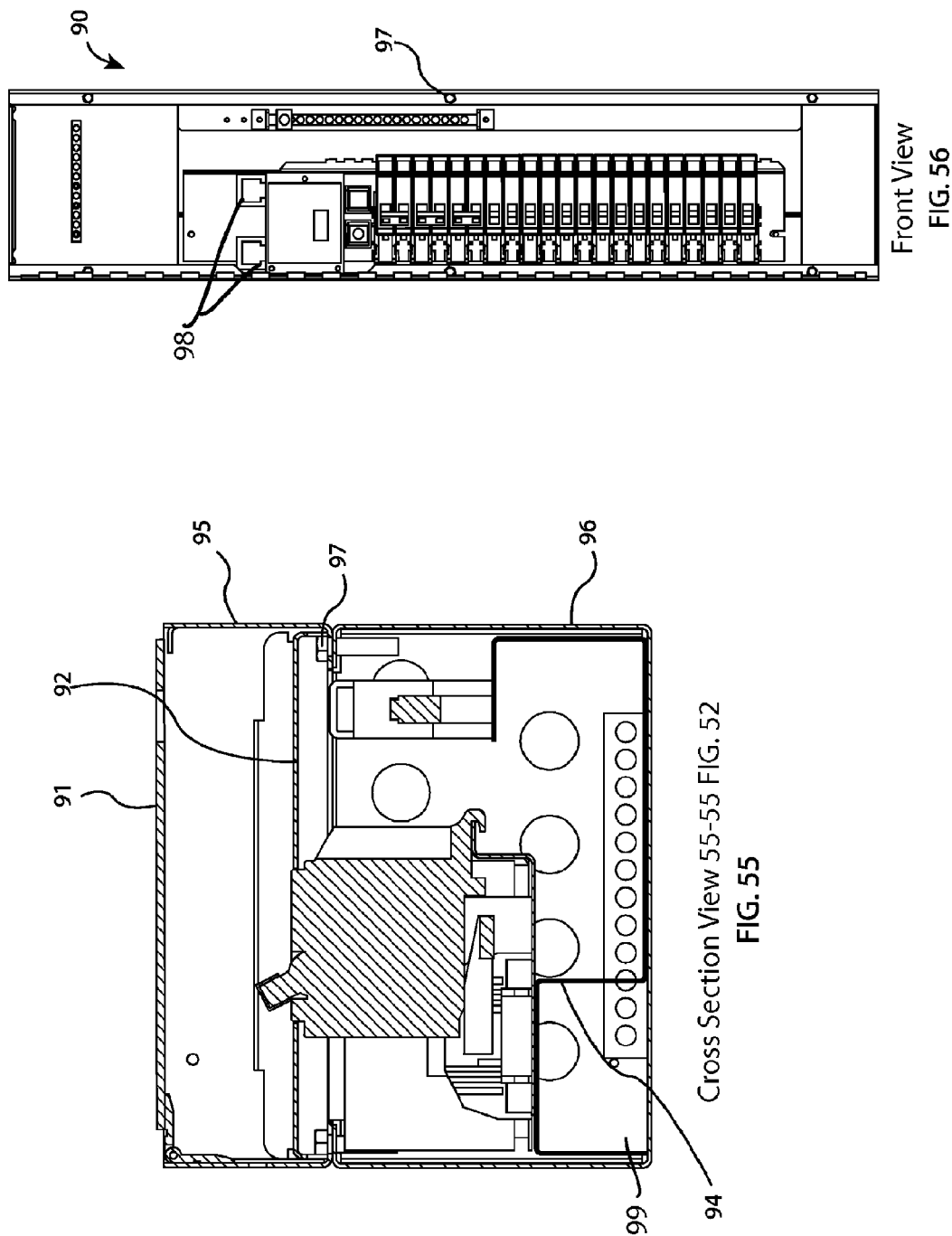

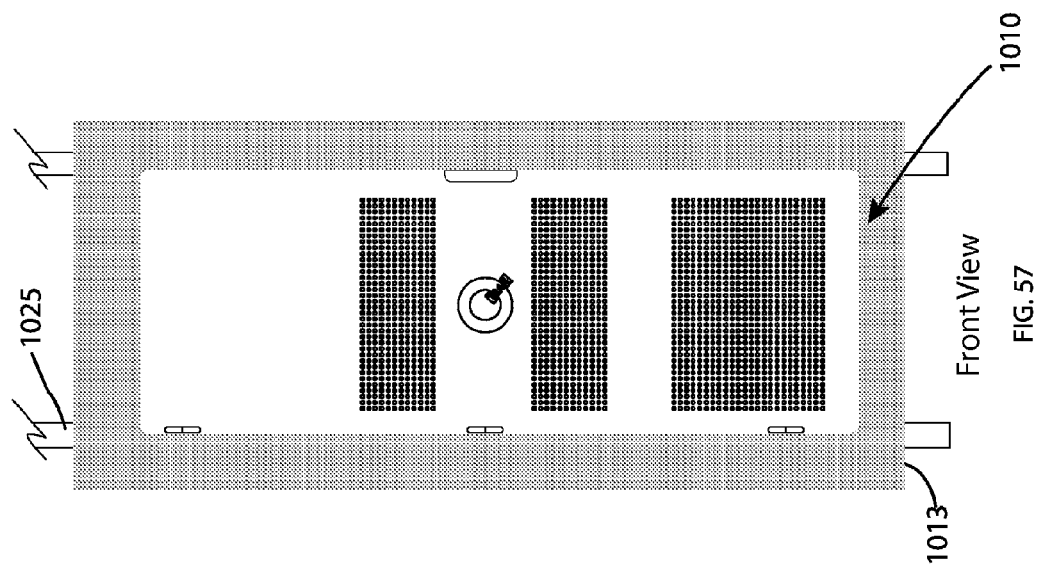

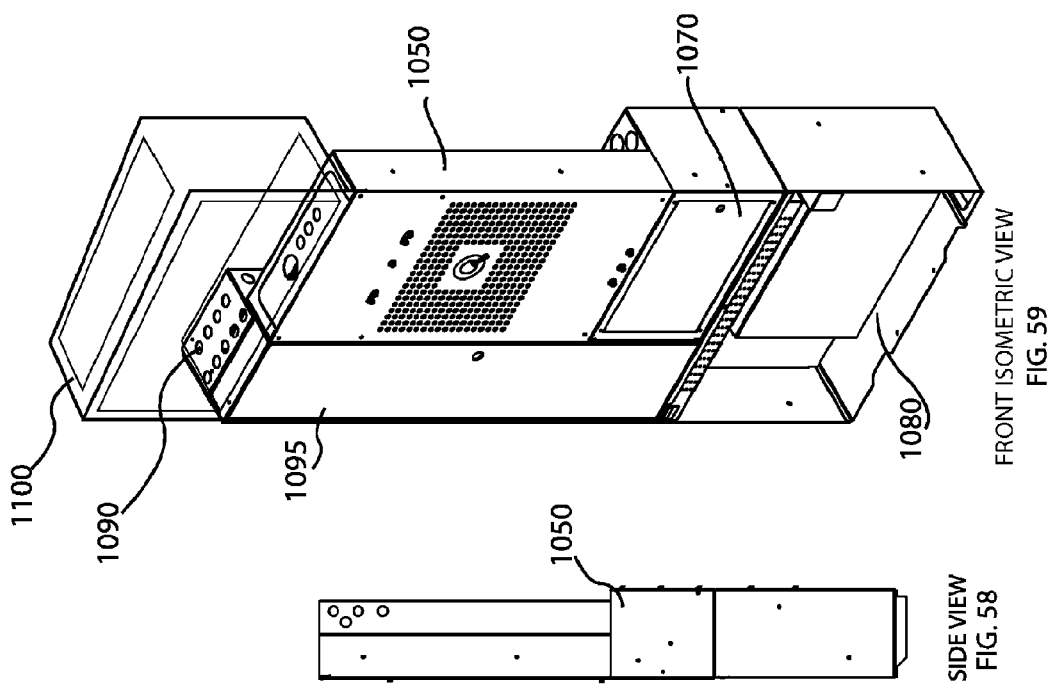

TOP VIEW

BOTTOM VIEW

FRONT VIEW

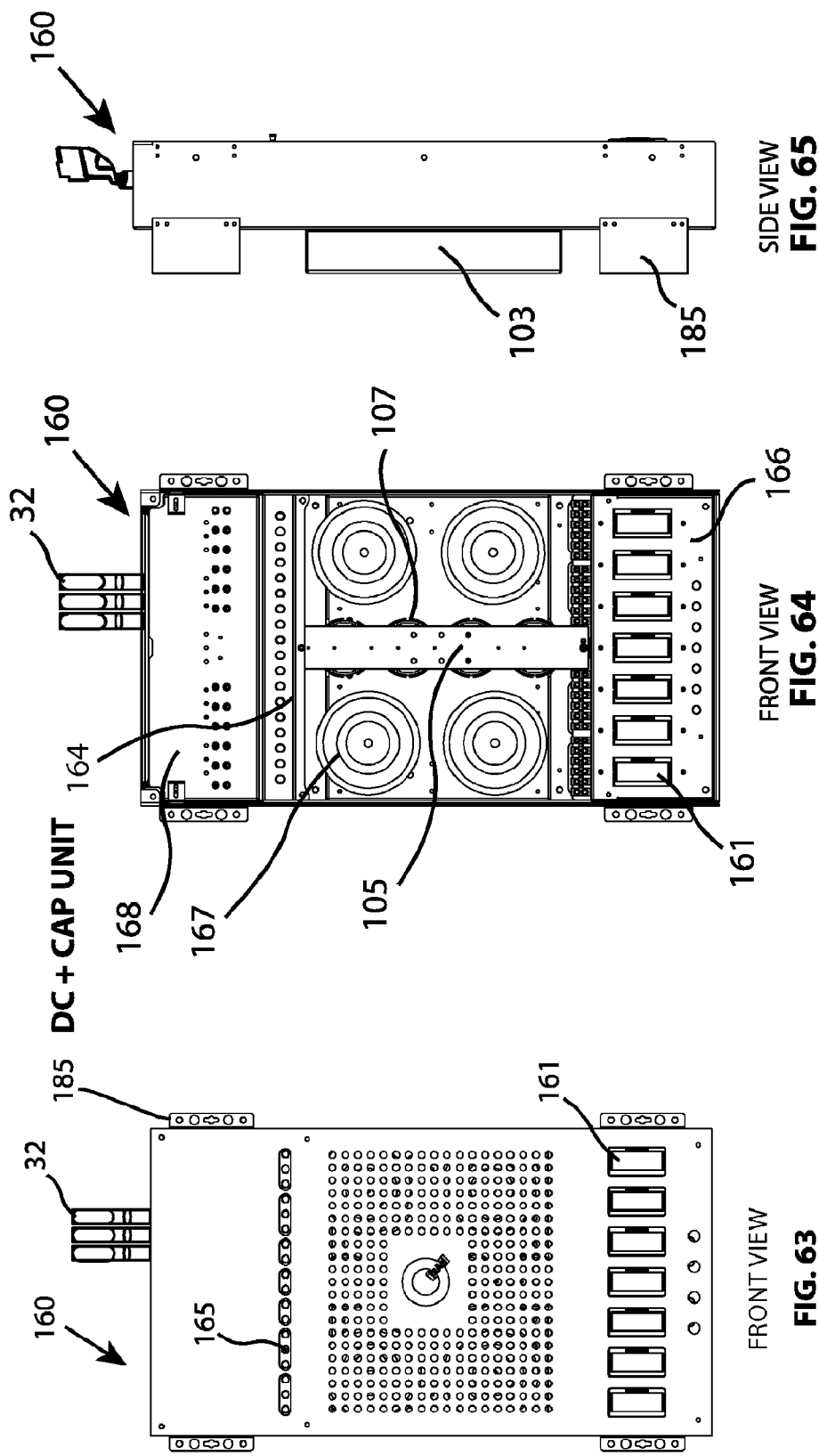

Back Isometric View

Front Isometric View

FRONT ISOMETRIC VIEW

SIDE VIEW

FRONT VIEW

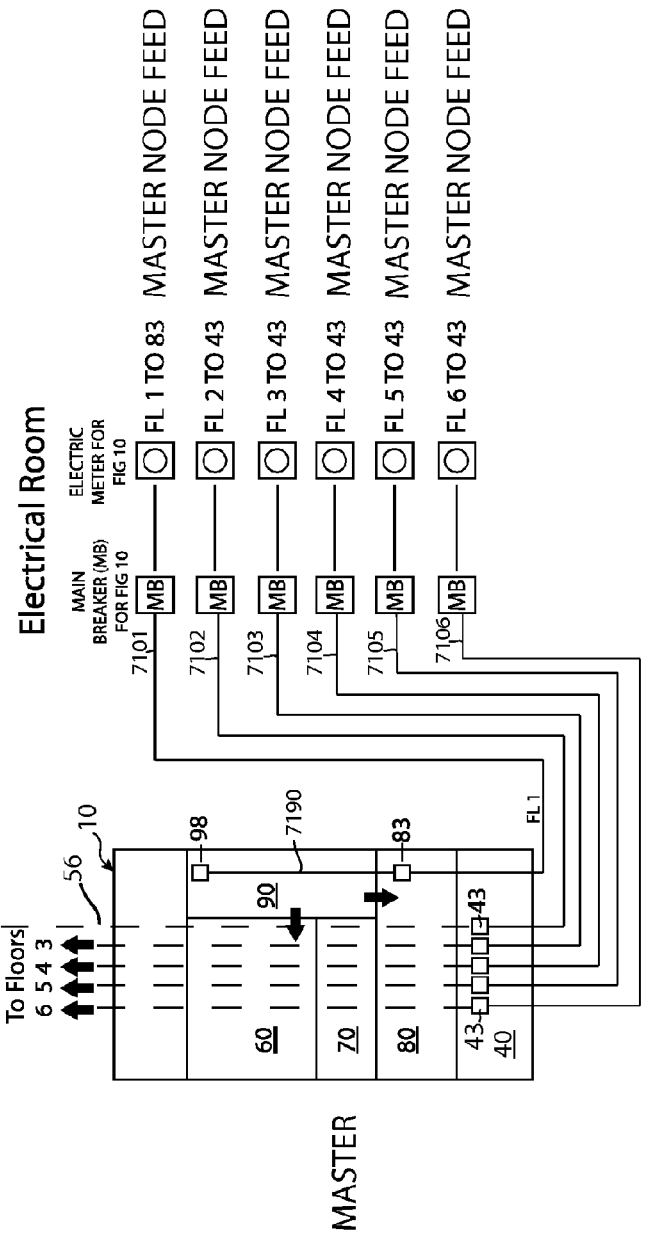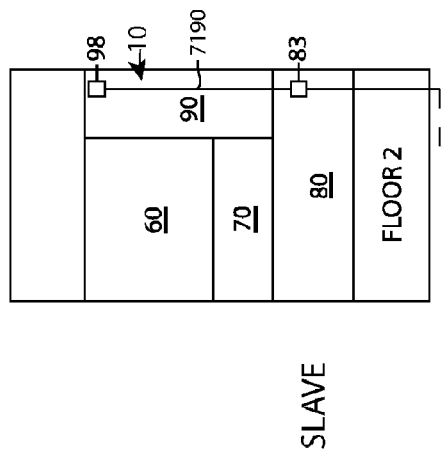
SCHEMATIC REAR VIEW
FIG. 71

Isometric View

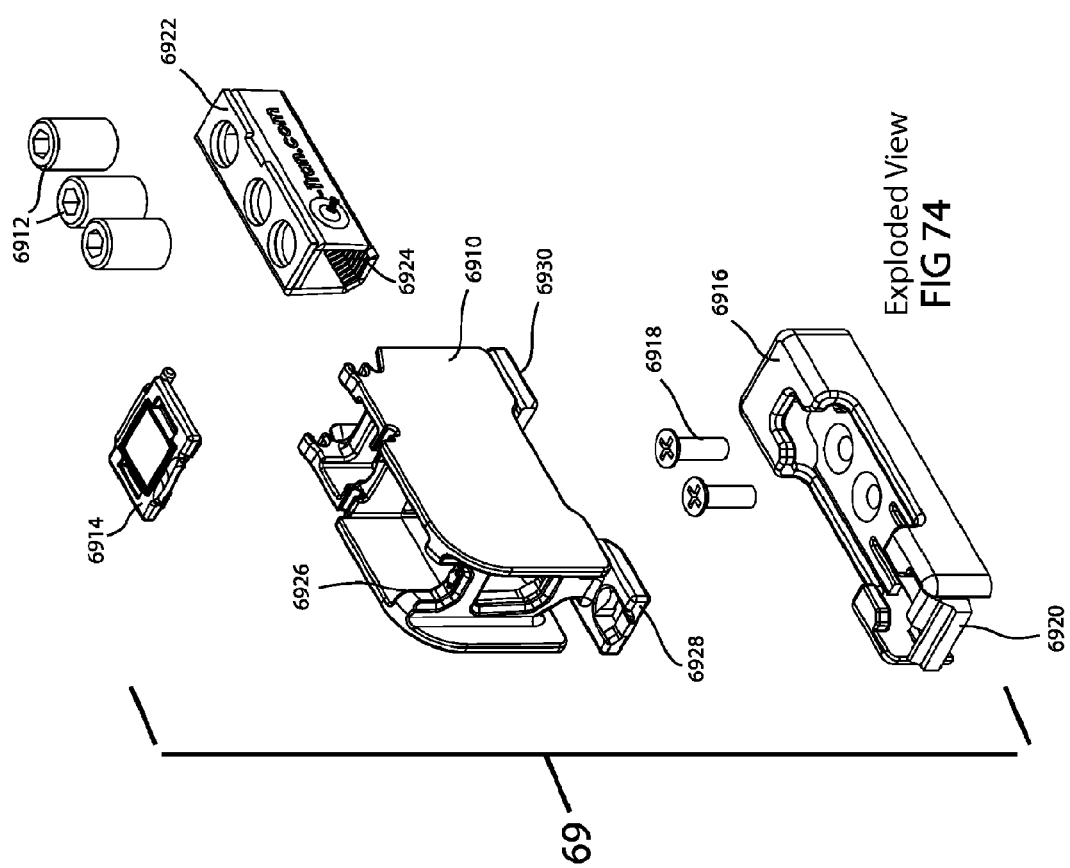

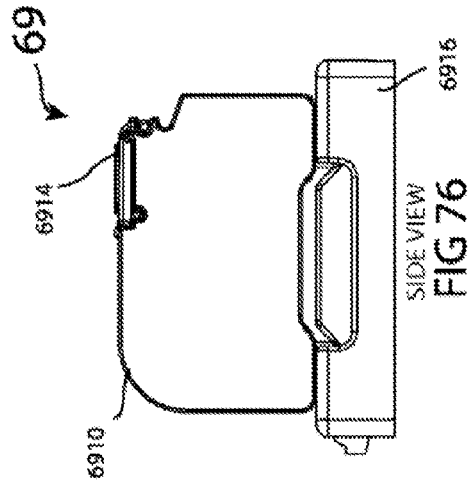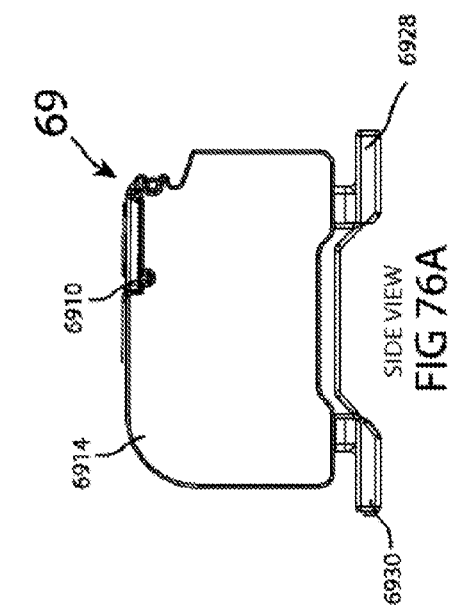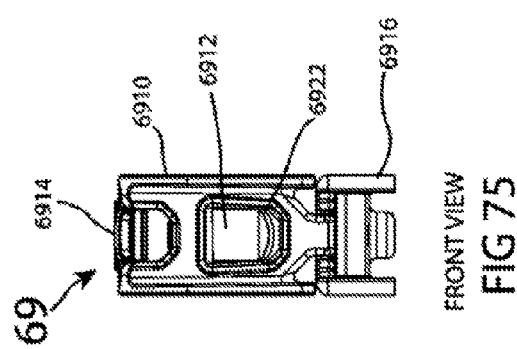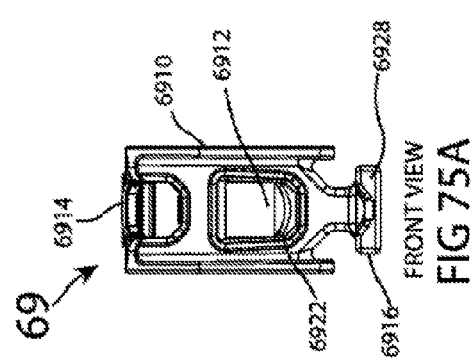

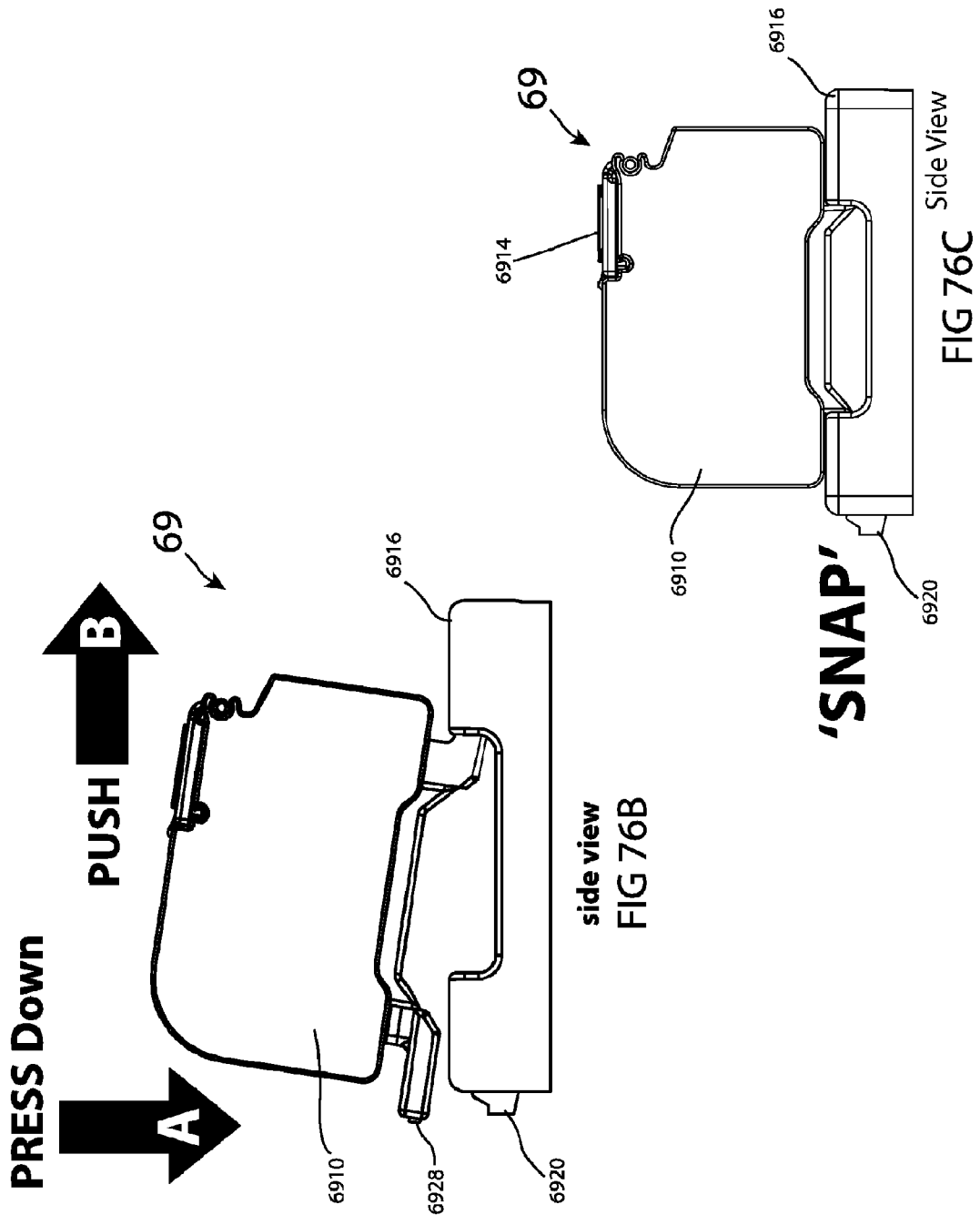

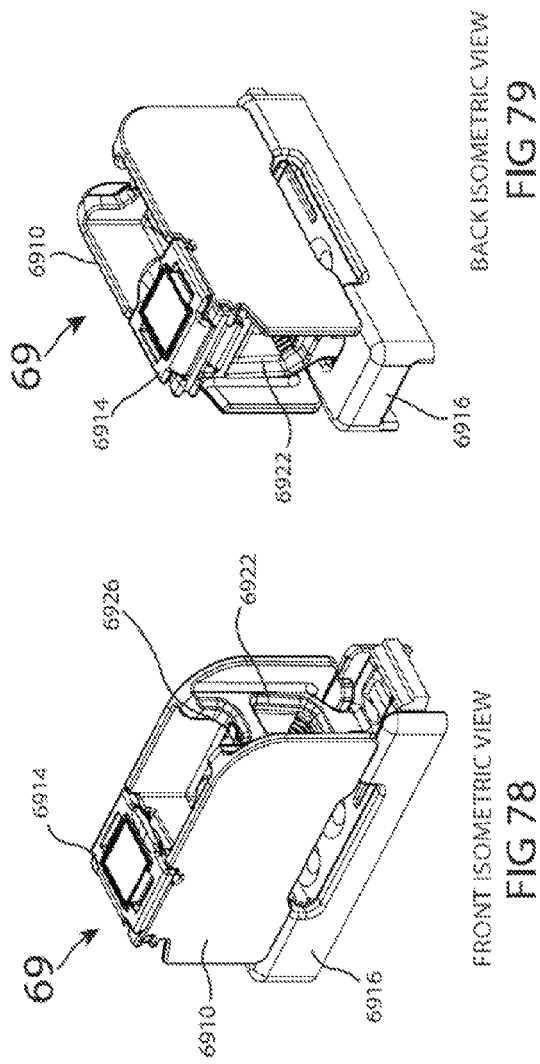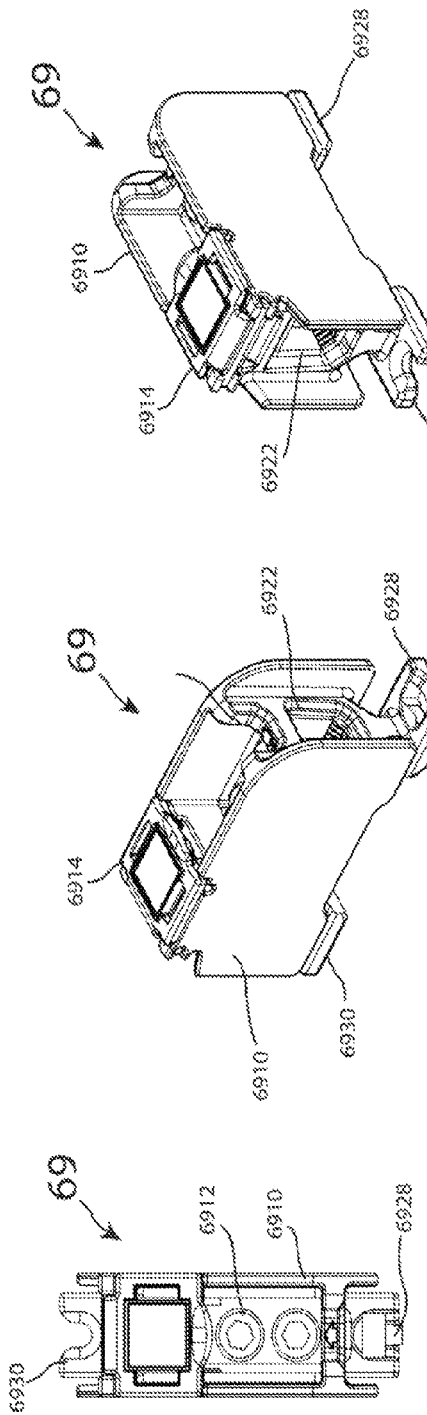

Front View

Side View

Front View

Side View

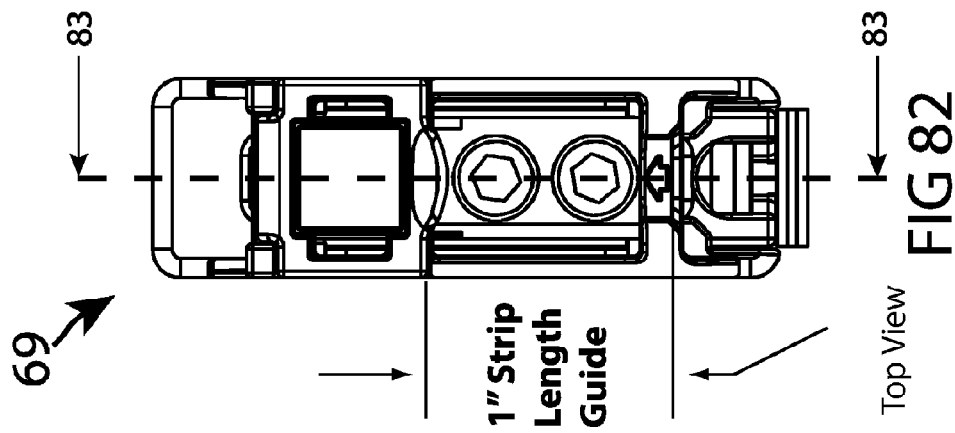
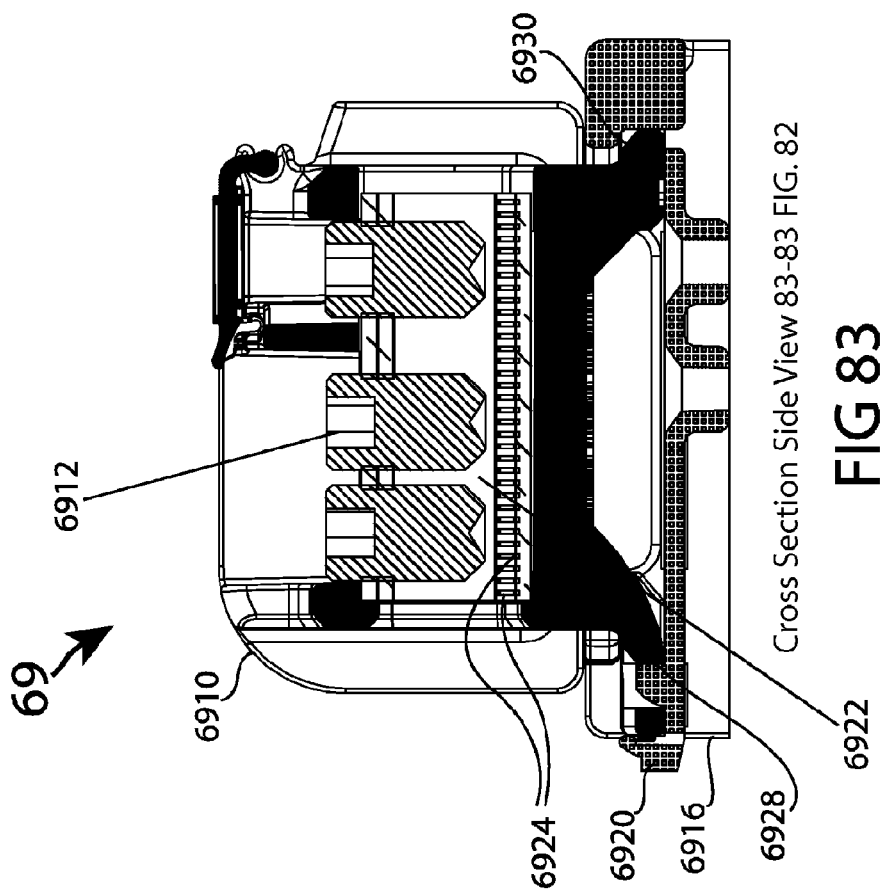

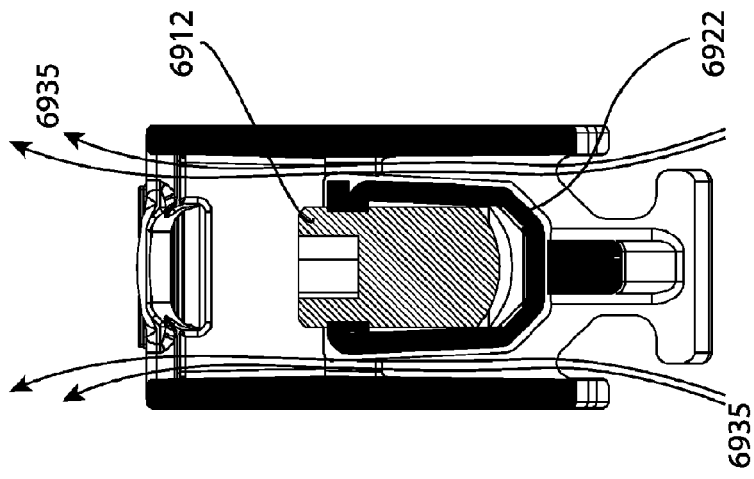
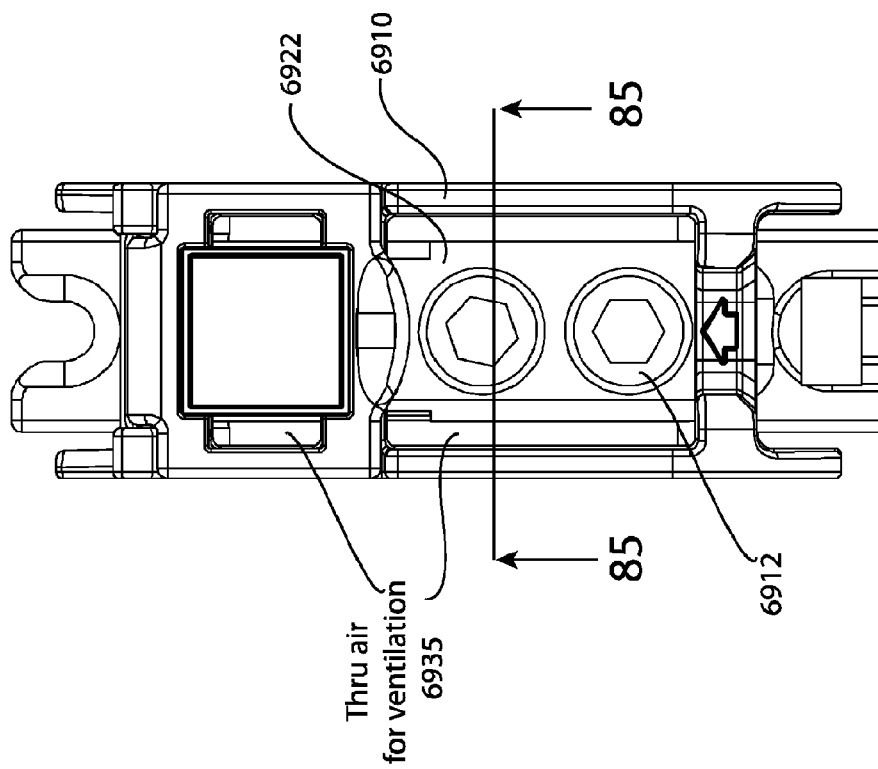

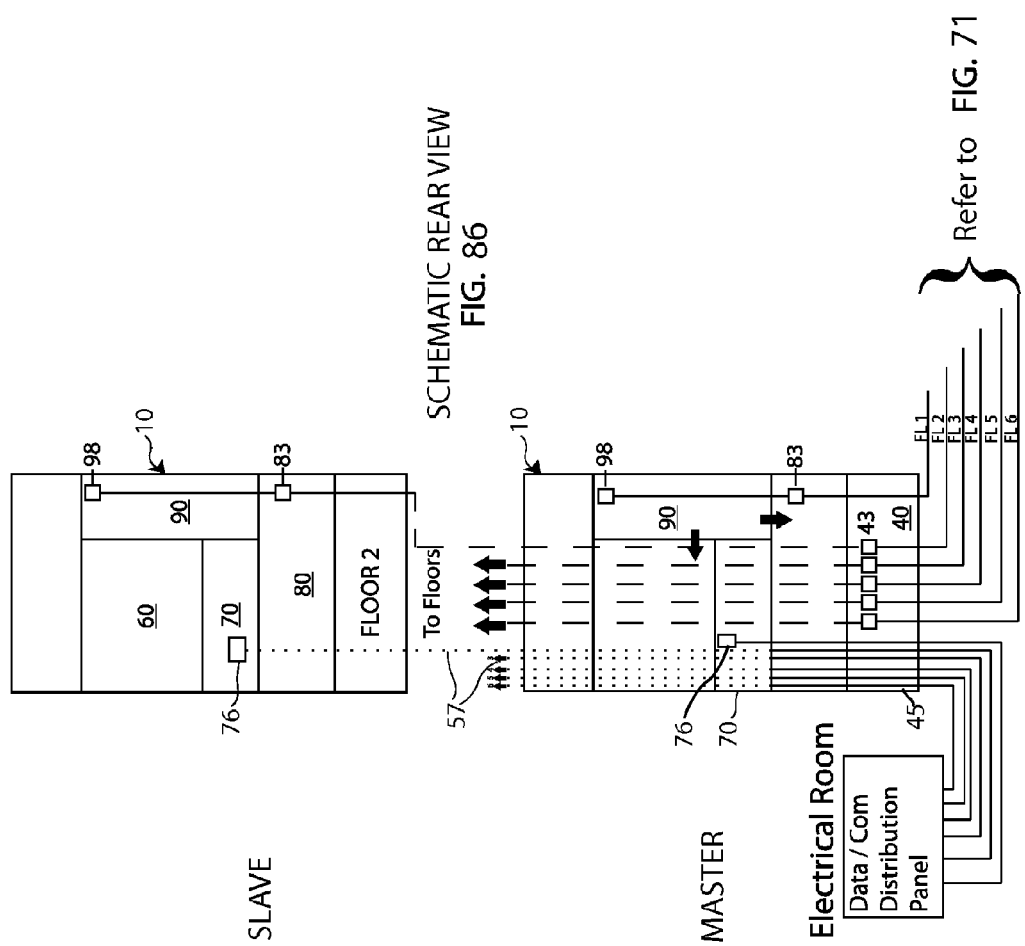

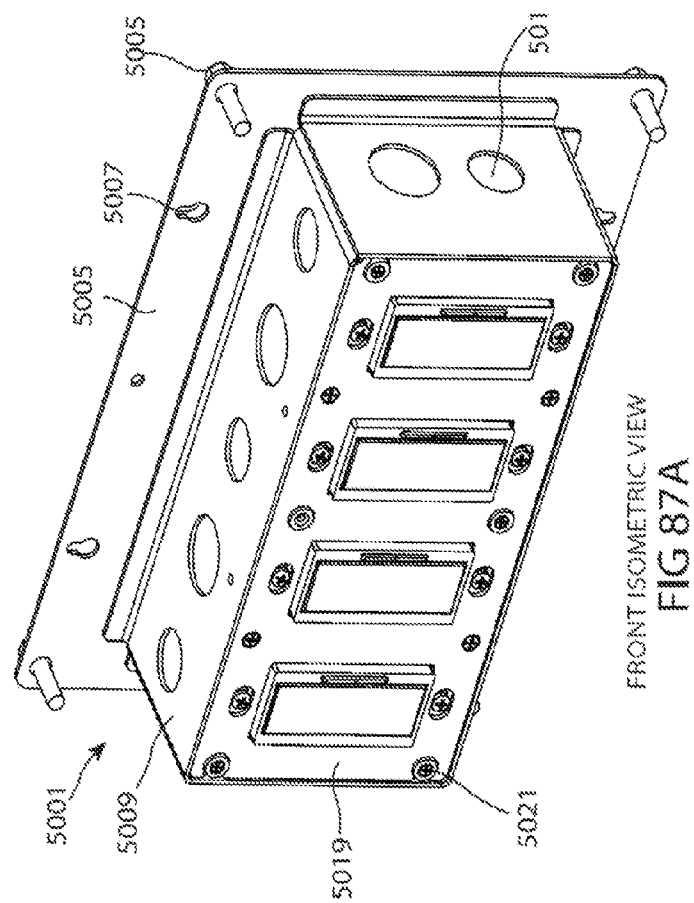
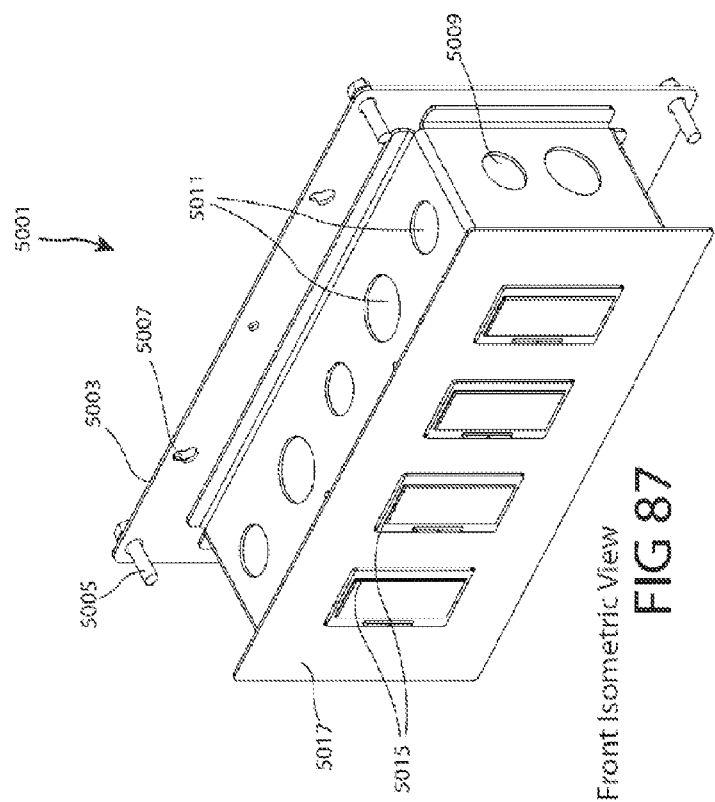

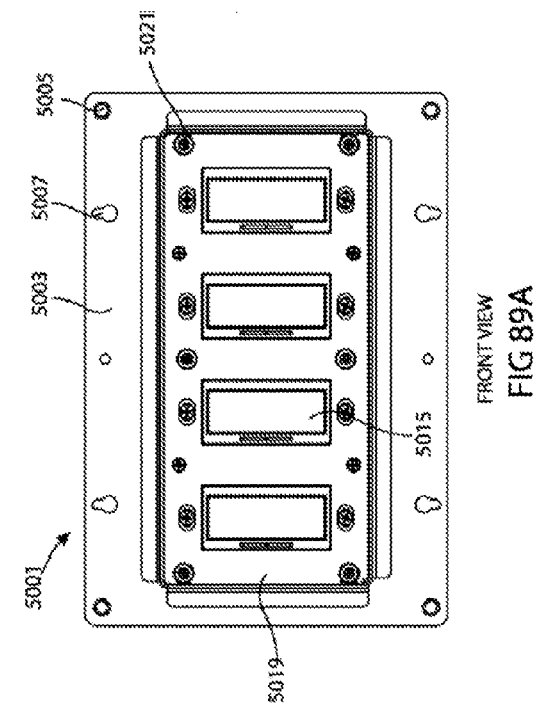
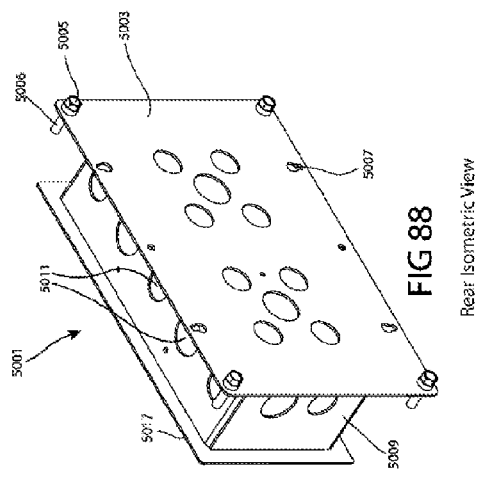
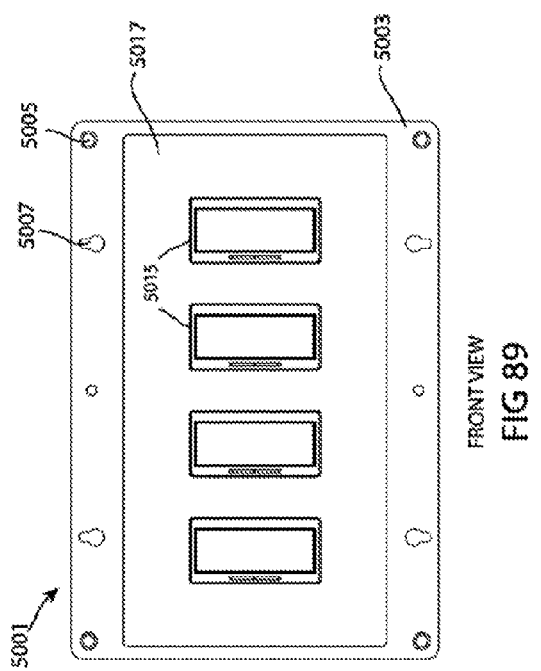

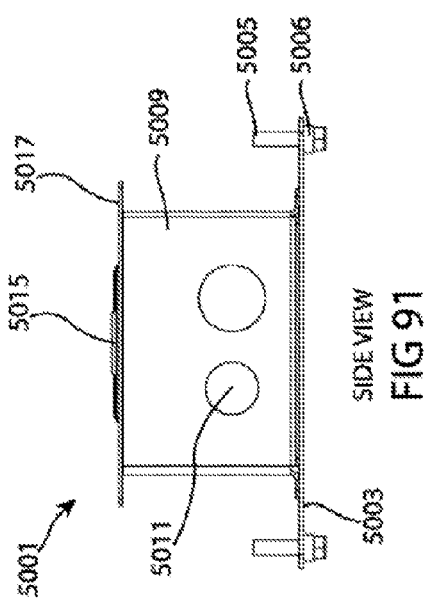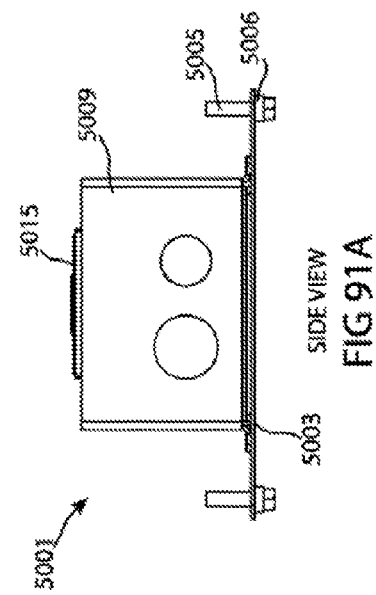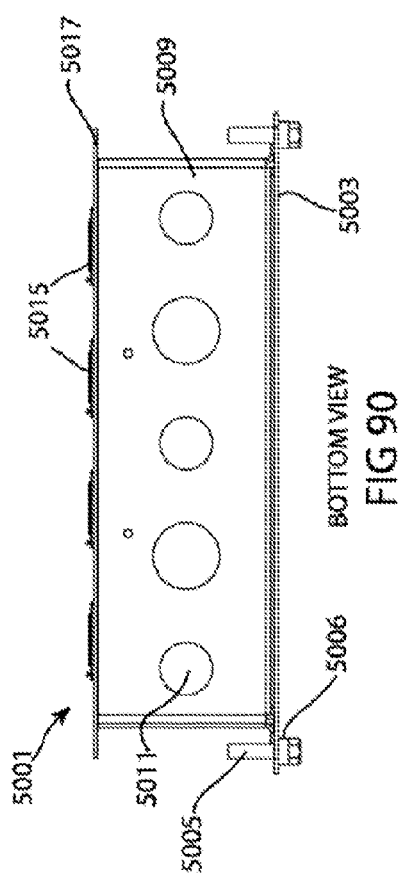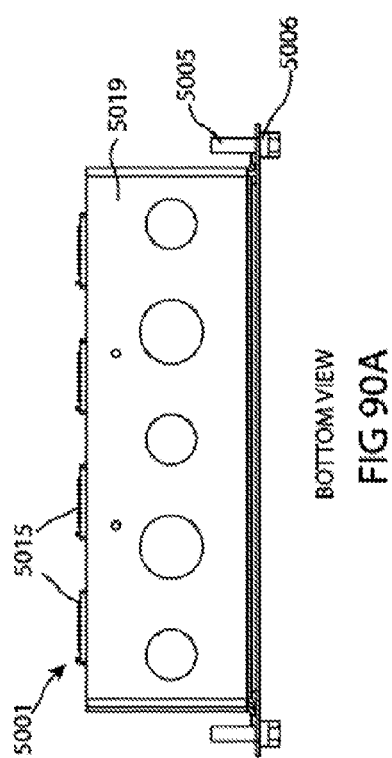

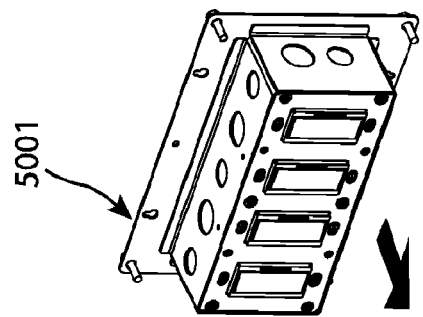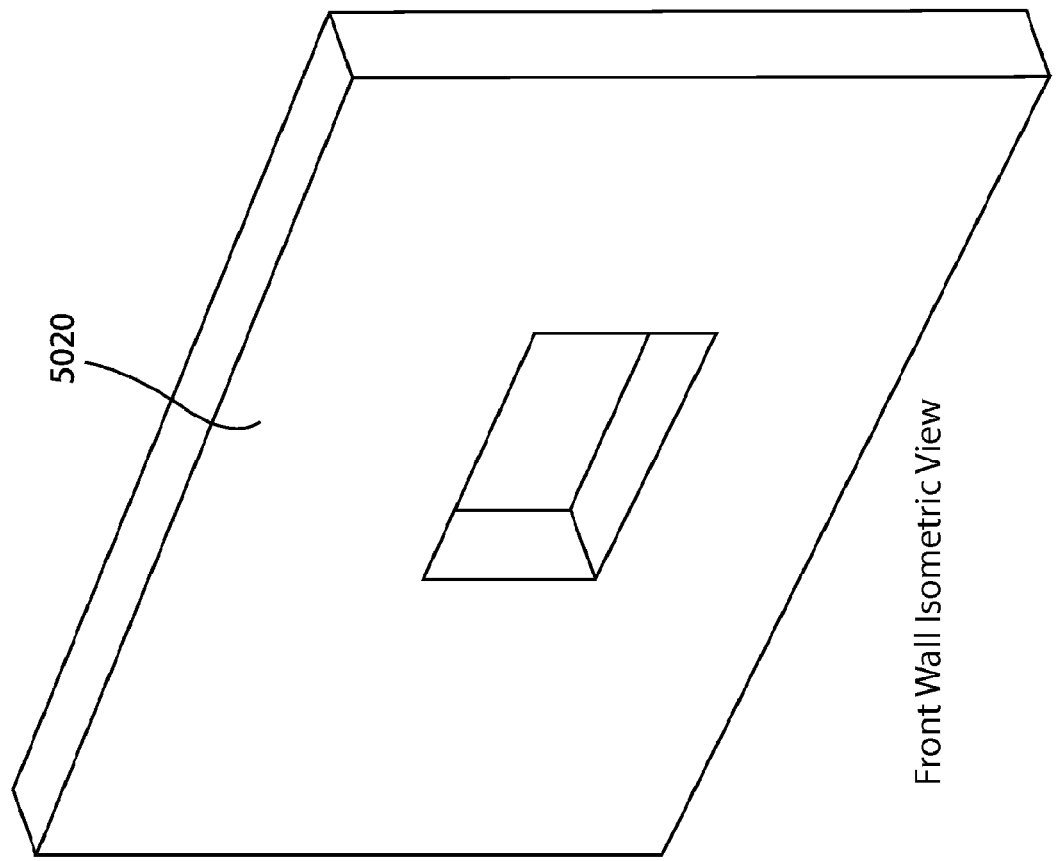
FIG 92
Front Isometric View
Front Wall Isometric View

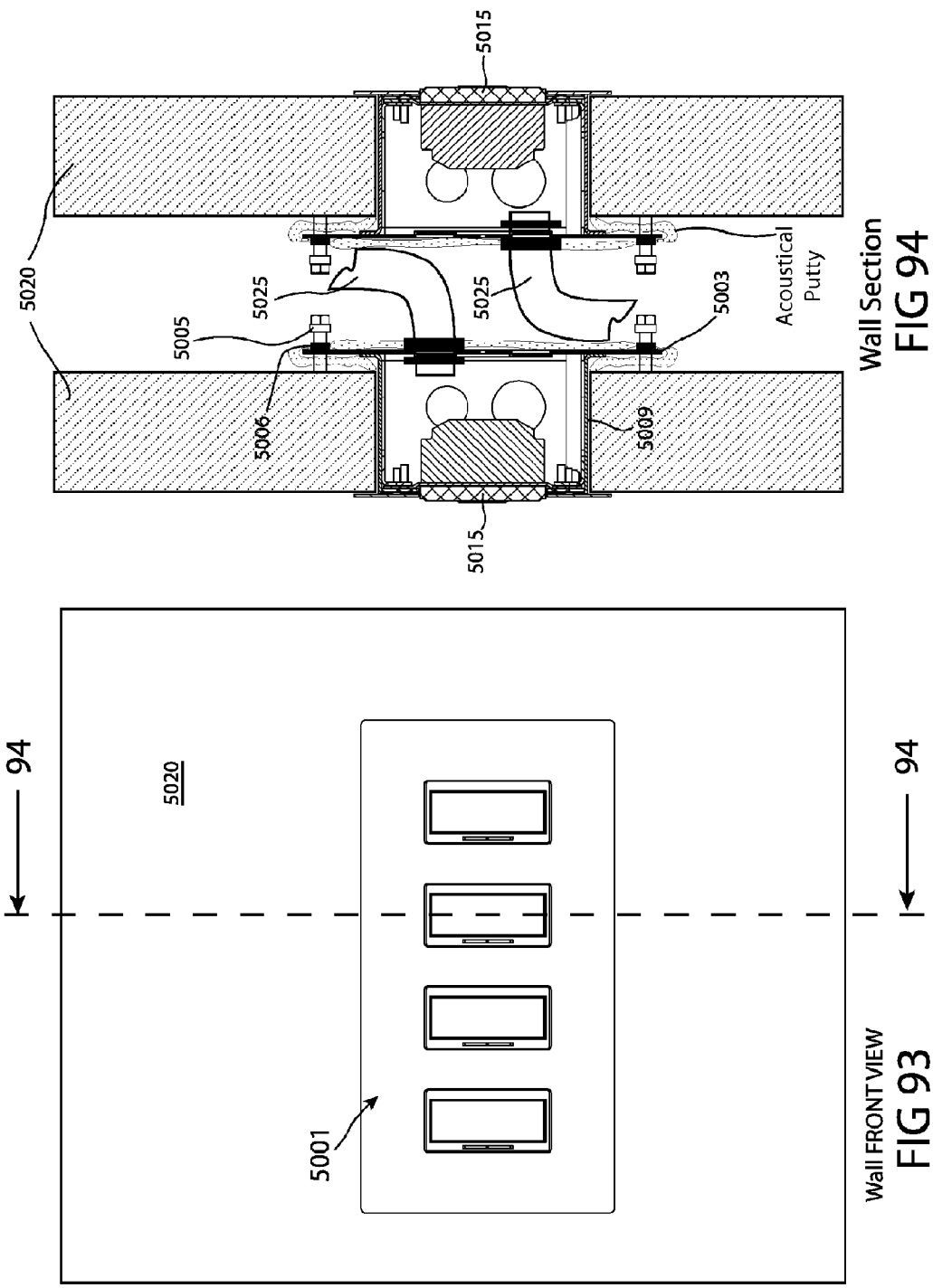

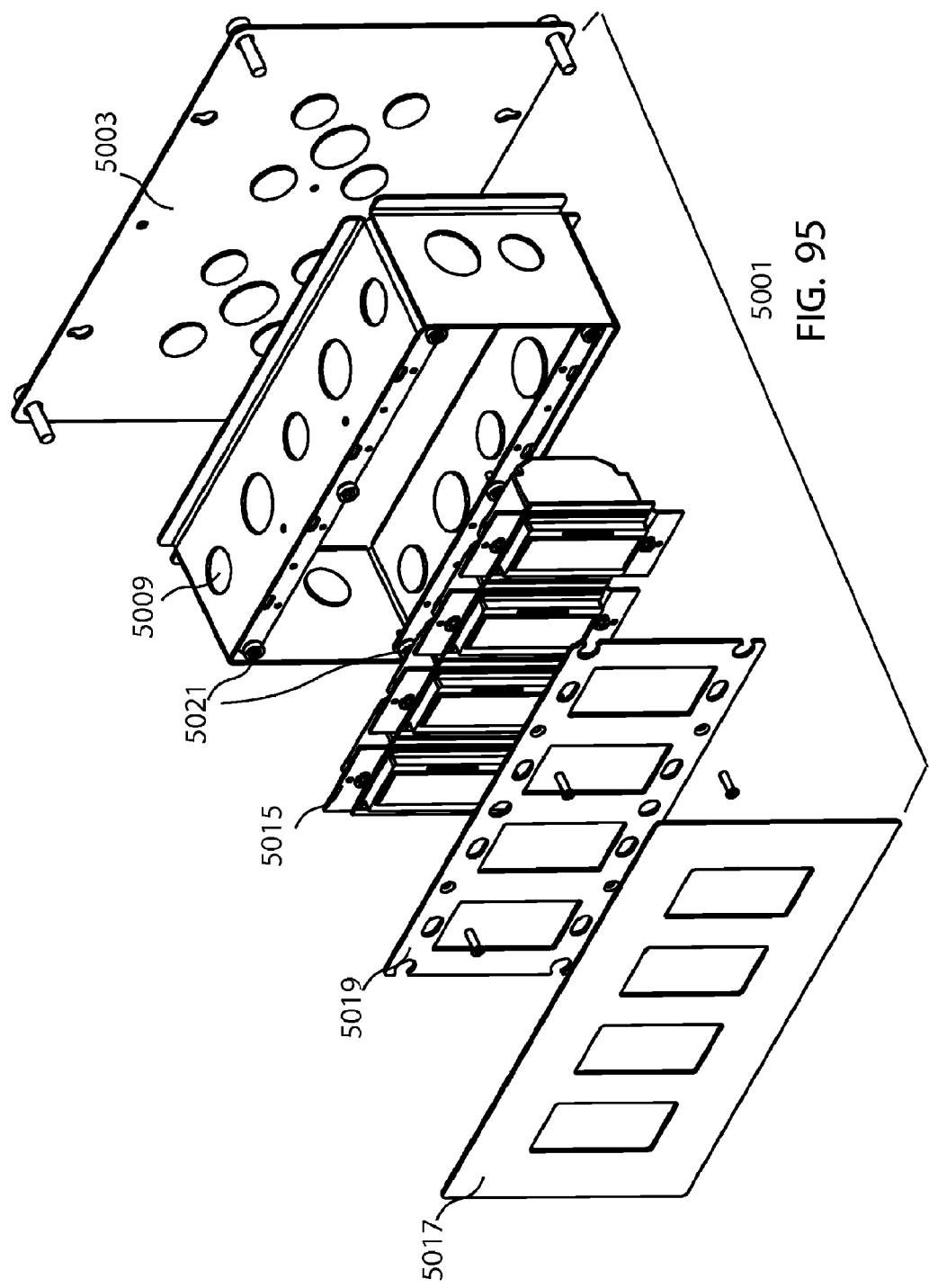

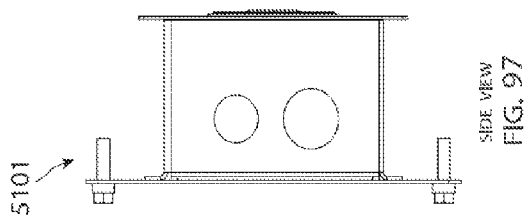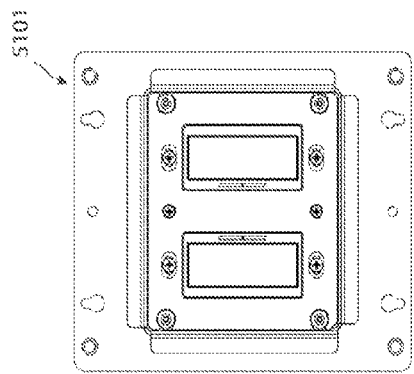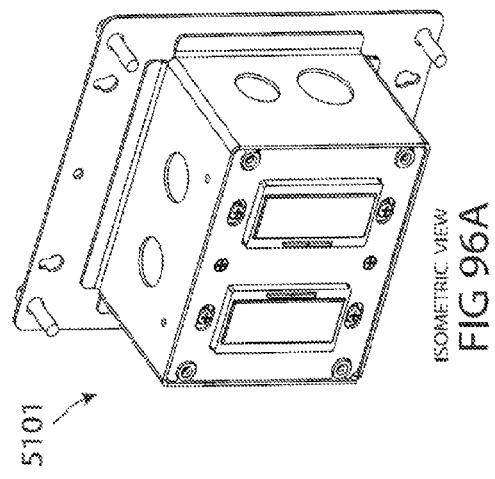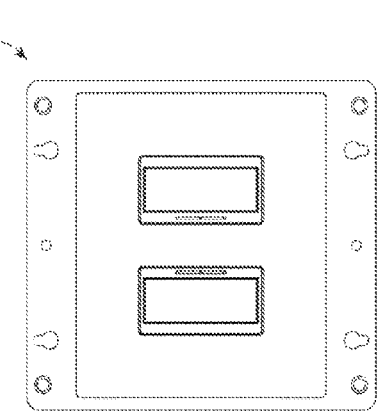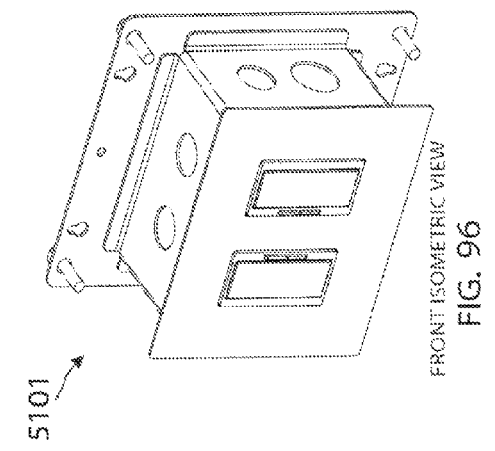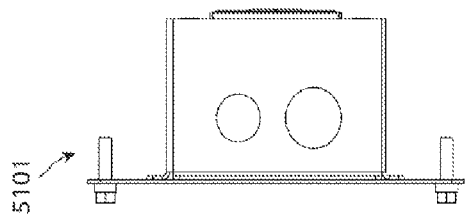

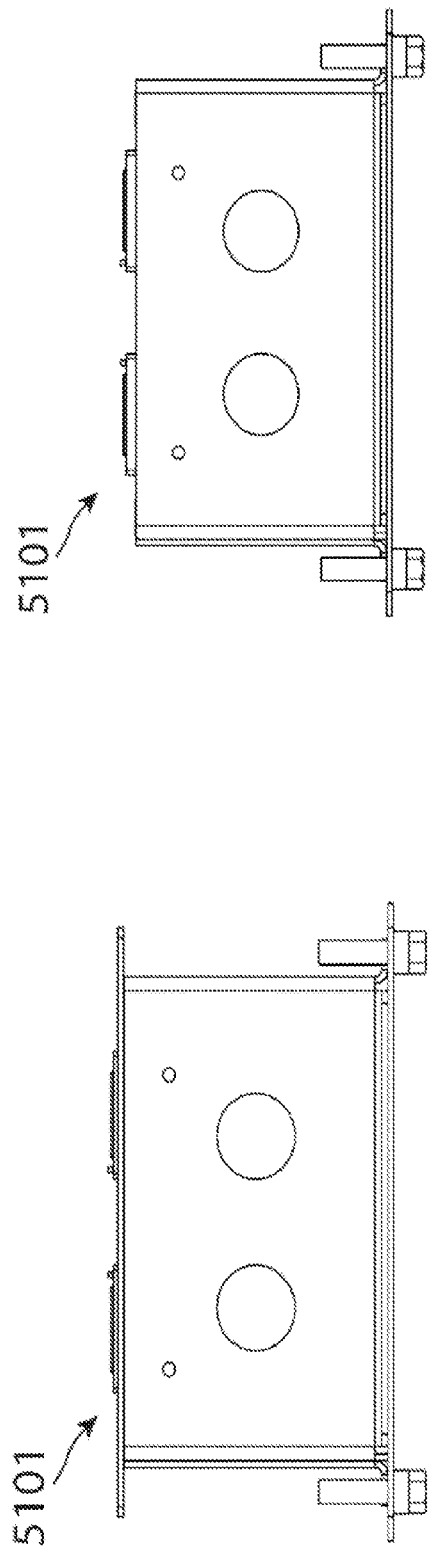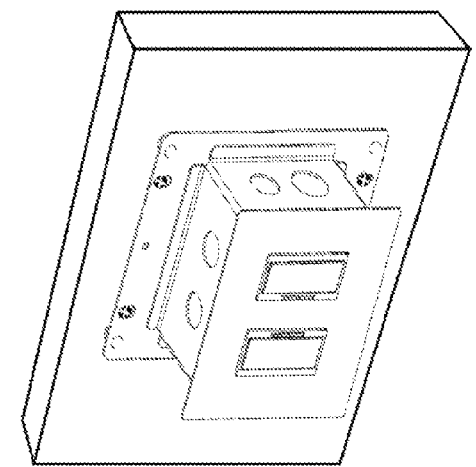

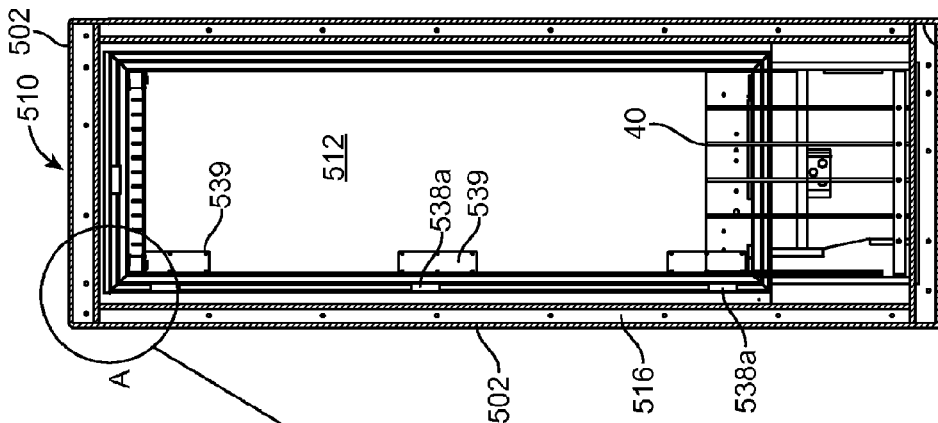
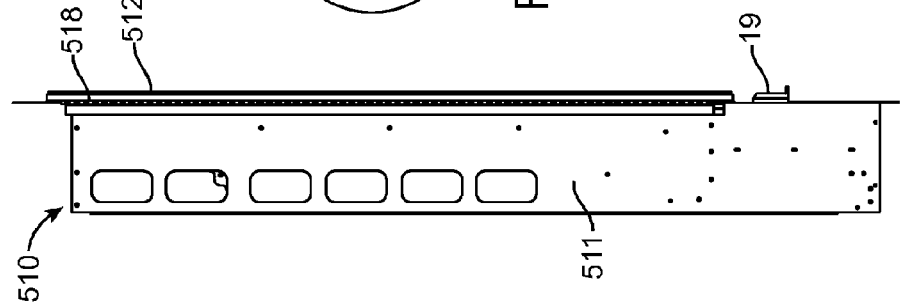
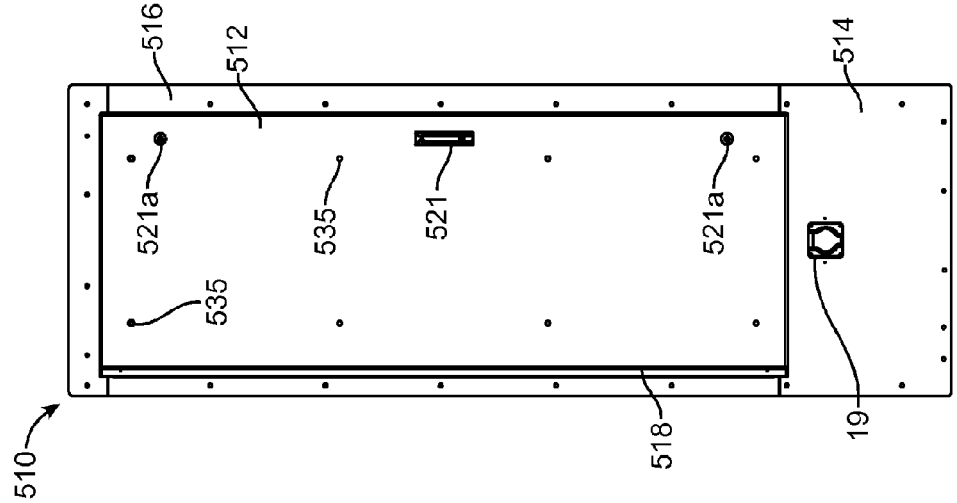

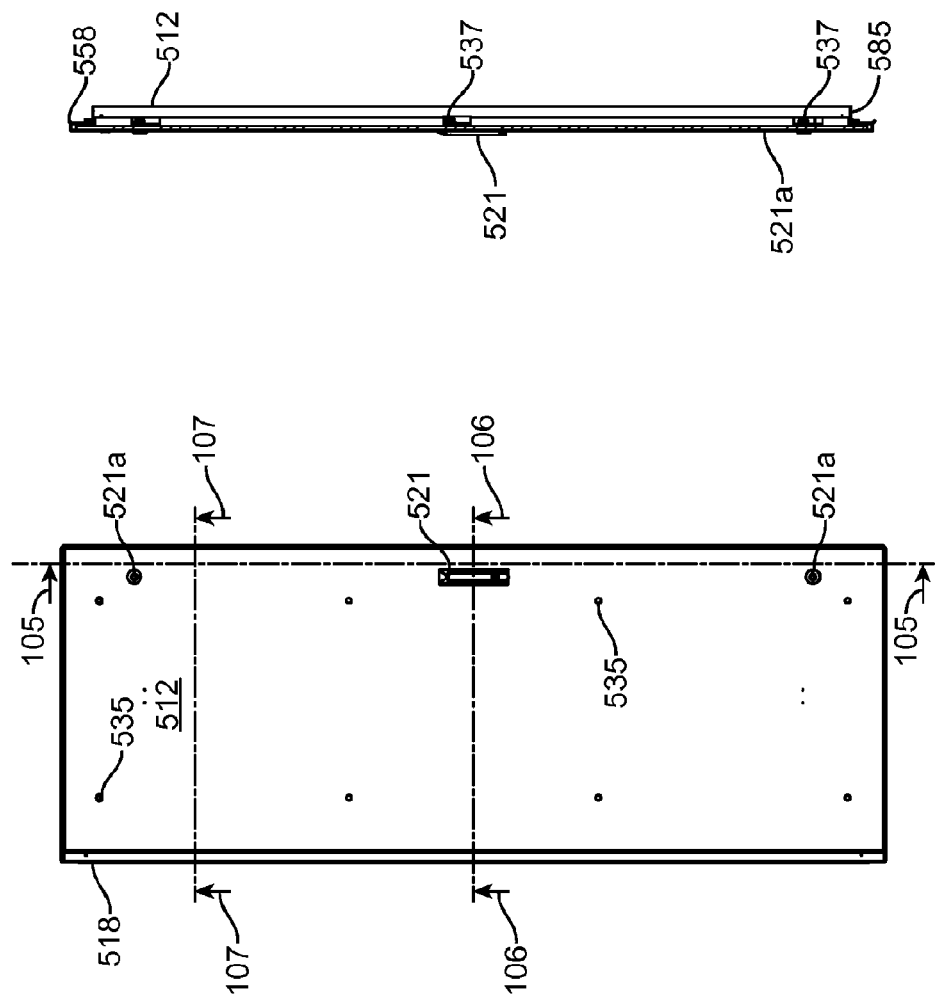

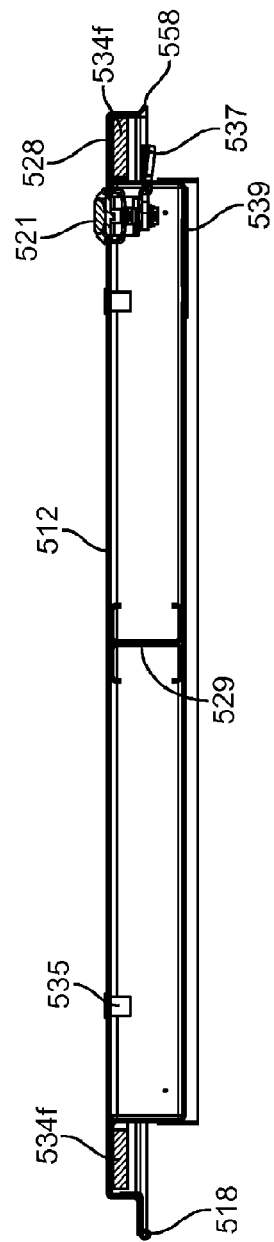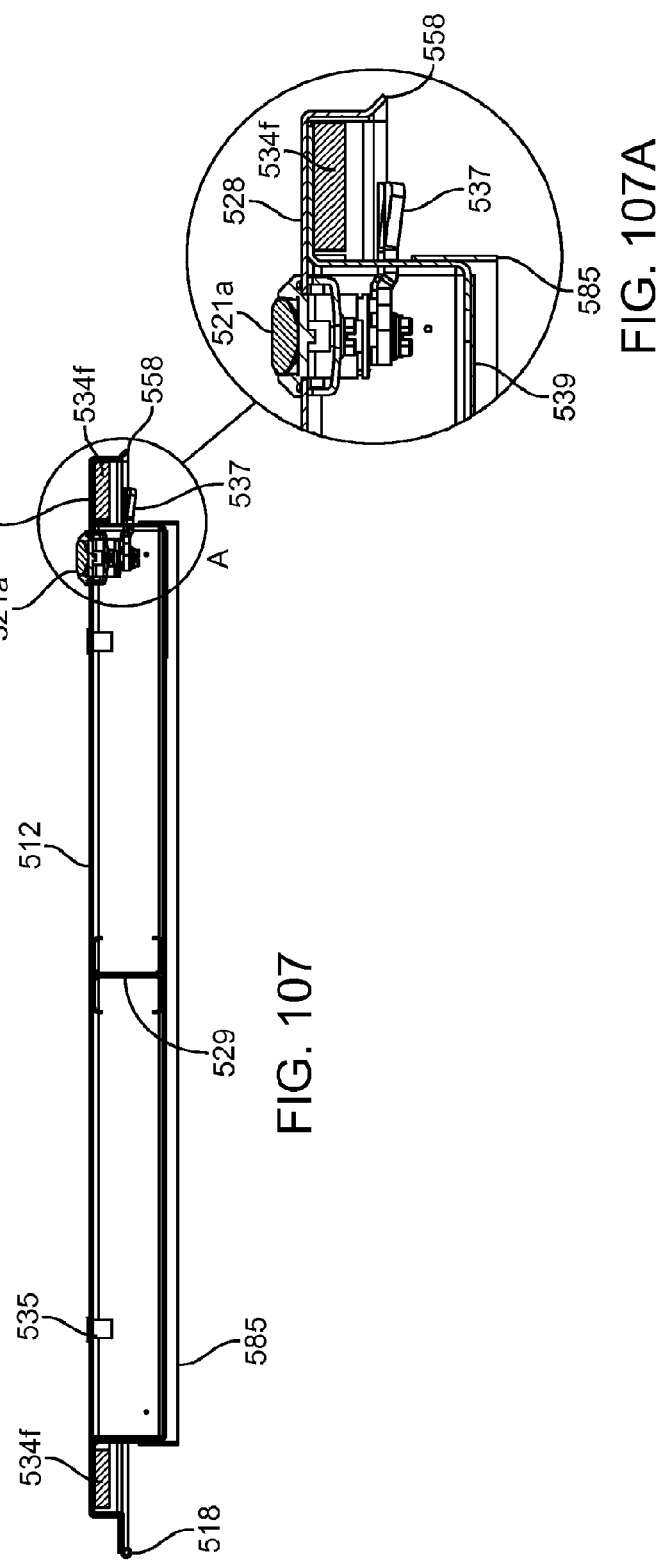

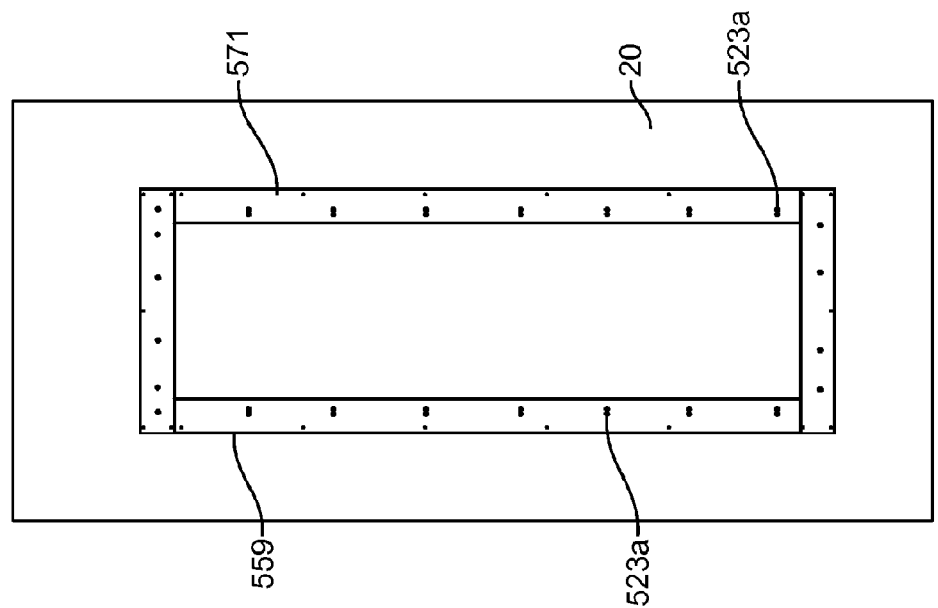
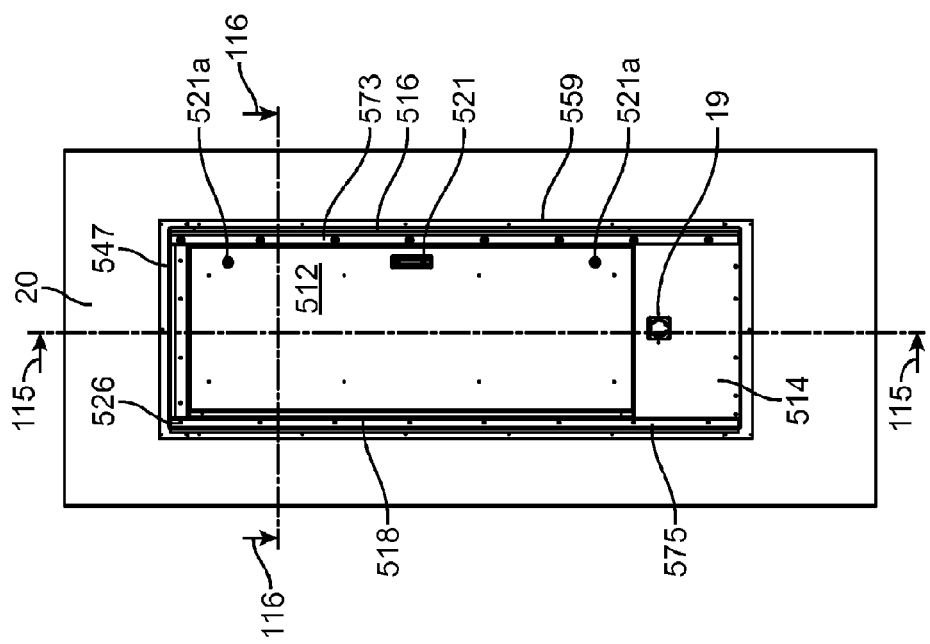
FIG. 114A
FIG. 114

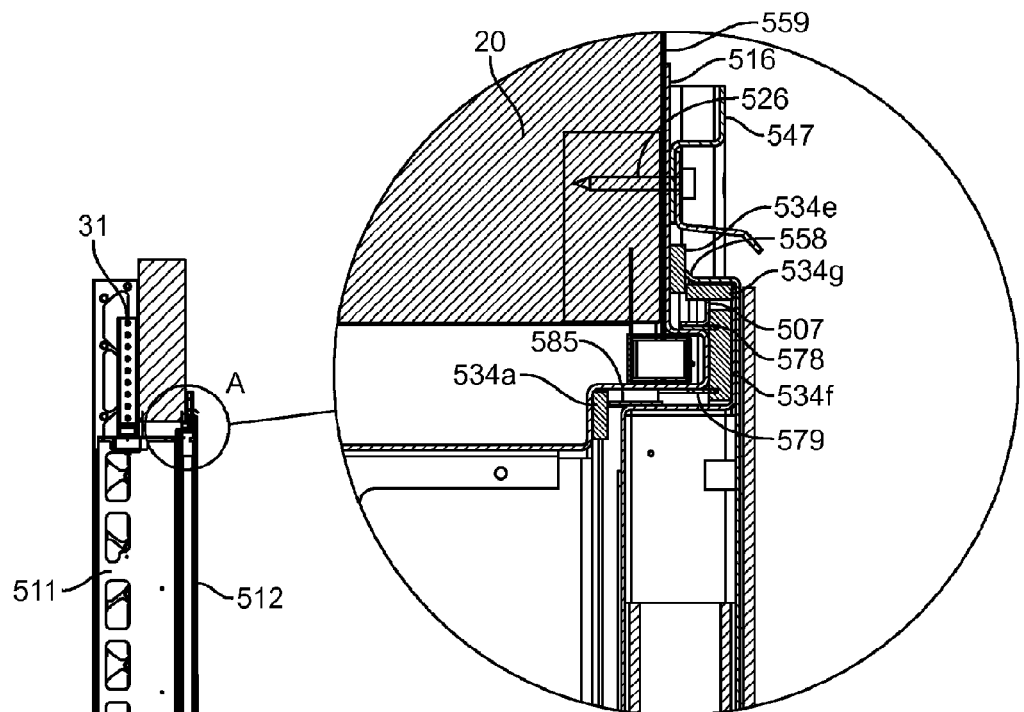
FIG. 115A
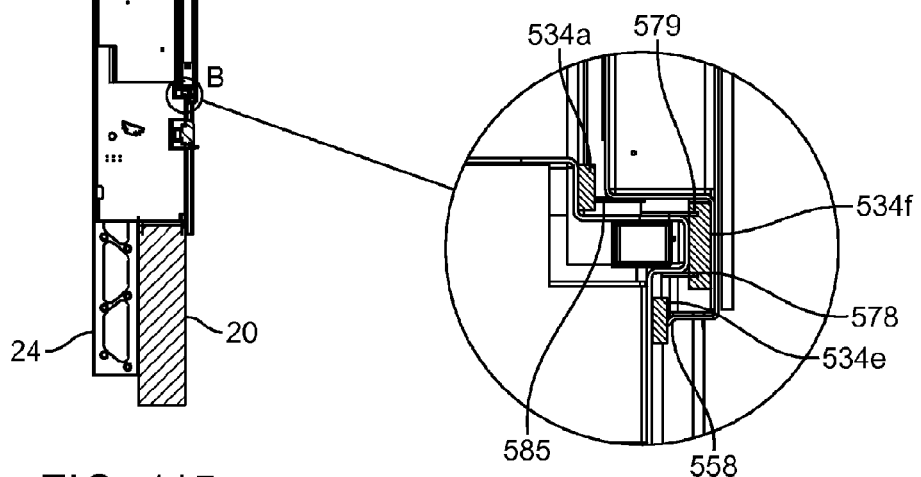
FIG. 115
FIG. 115B

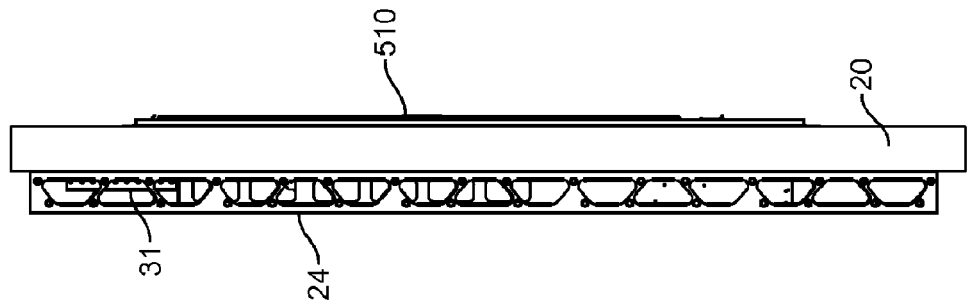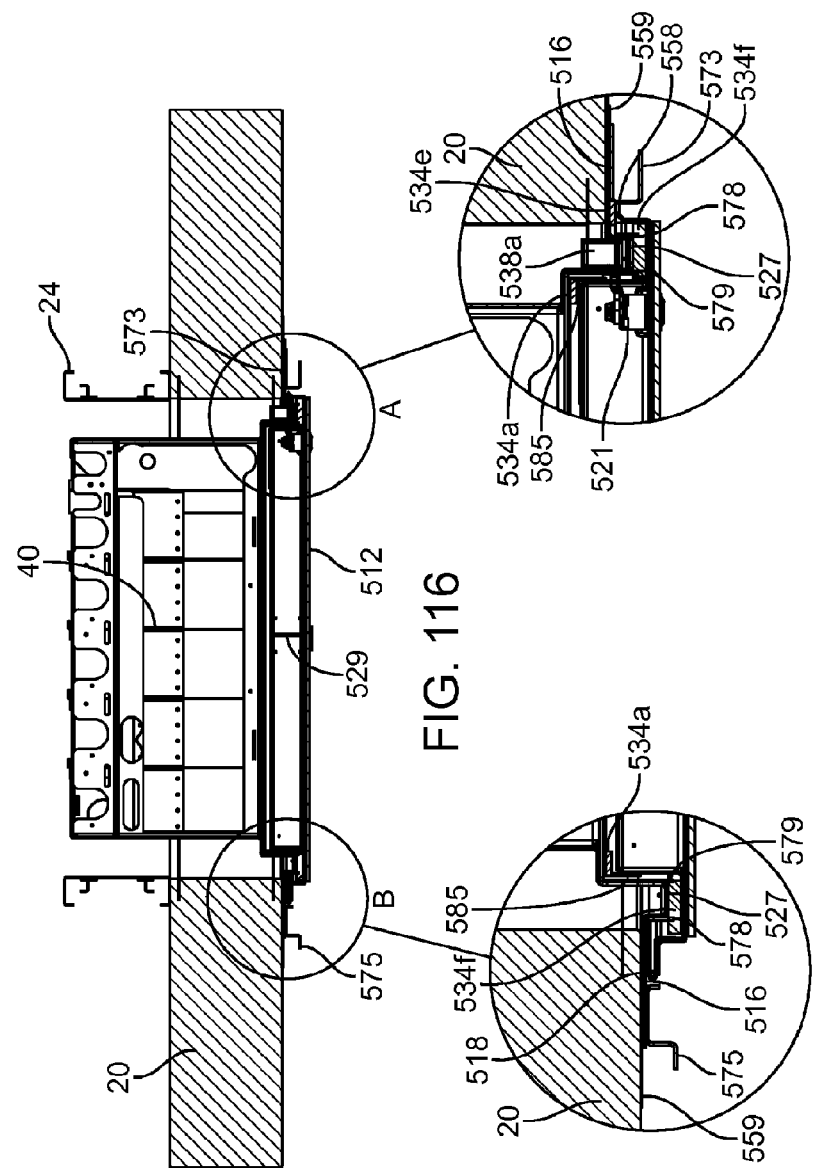

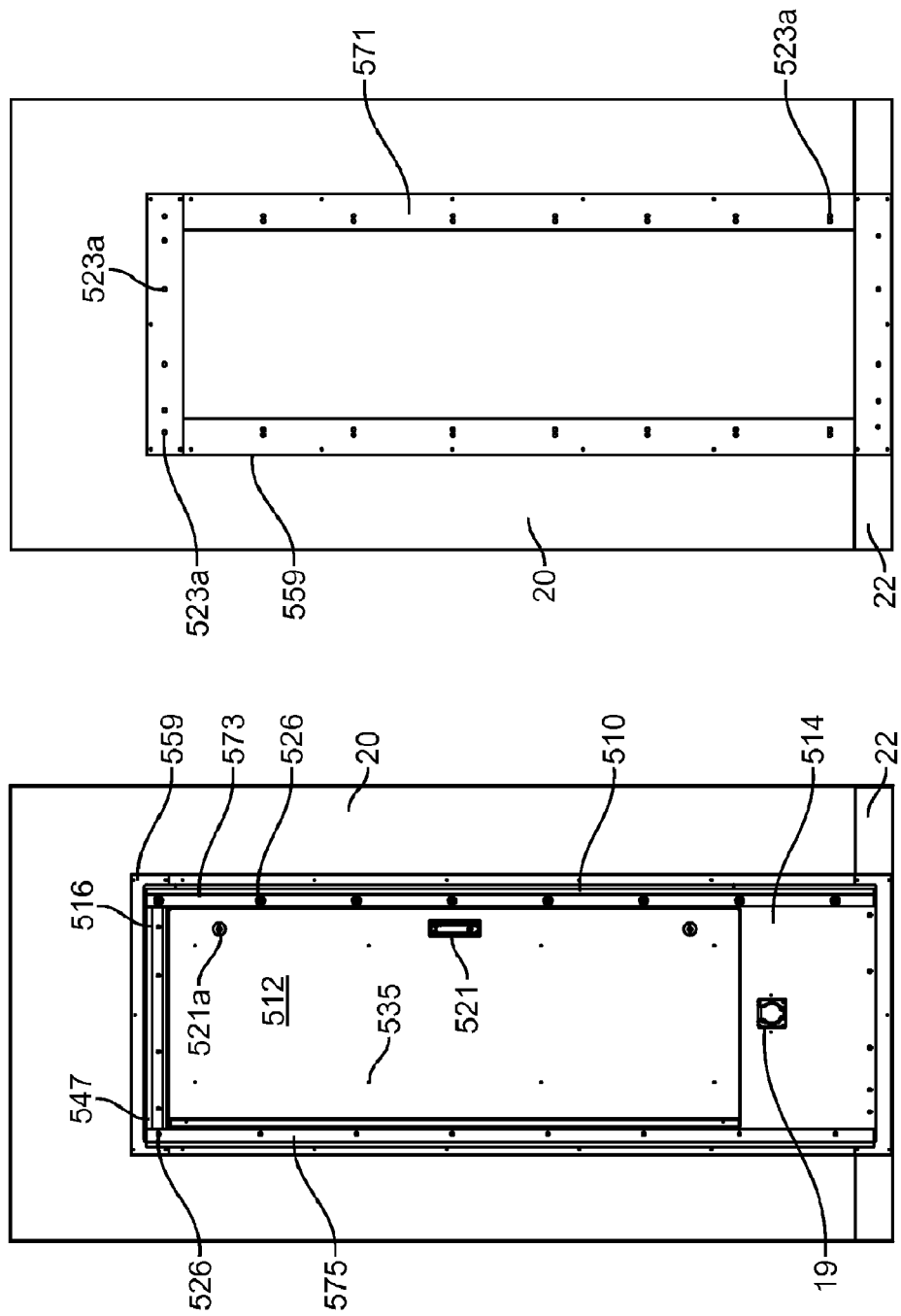

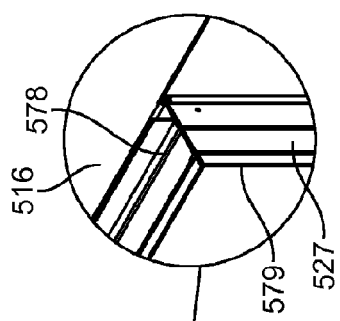
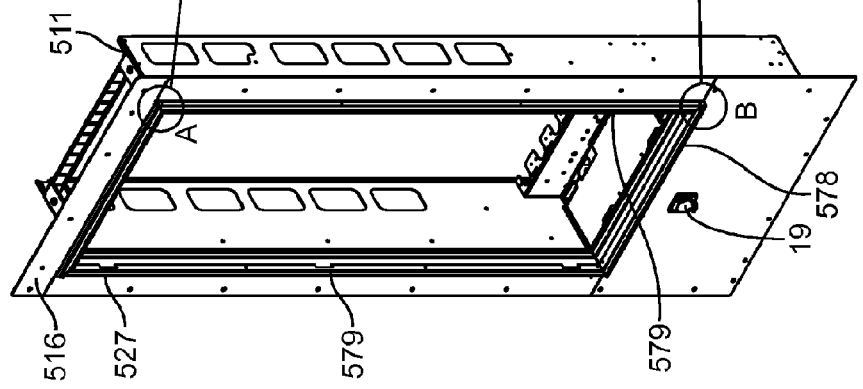
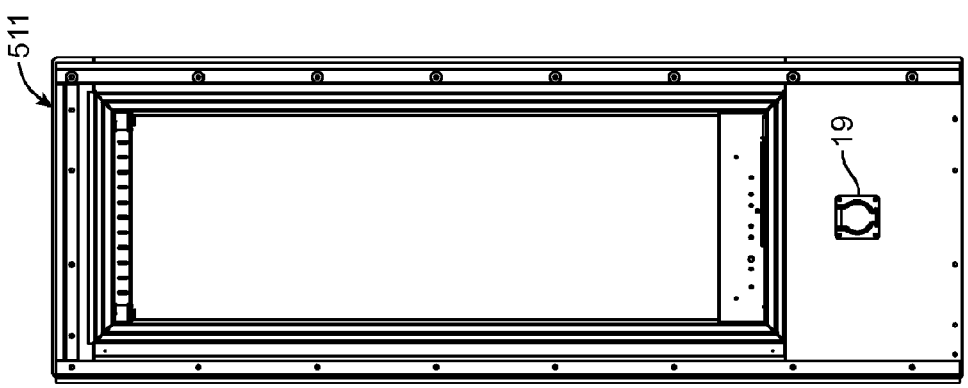

INTEGRATED ELECTRICAL ASSEMBLY FOR HOUSING MODULAR UNITS AND RELATED COMPONENTS THEREOF

CROSS-REFERENCE TO RELATED APPLICATIONS

This application is based on and/or relates to U.S. Provisional Appl. No. 61/893,664 filed Oct. 21, 2013 and U.S. Provisional Appl. No. 62/003,456 filed May 27, 2014, which are both hereby incorporated by reference in their entireties.

BACKGROUND OF THE INVENTION

1. Field of the Invention

The present invention generally relates to enclosures configured to contain one or more building system related component, and more particularly to an integrated electrical assembly for containing building system related components in one location while providing suitable protection for such components.

Aspects of the present invention also relate to individual electrical components, such as multi-wire connectors and junction boxes.

2. Description of Related Art

Conventional building techniques are well known, and generally require a significant involvement of skilled tradesman, laborers and technicians at specific locations and specific times in order to bring a particular building structure to completion that requires complex coordination. Every variety of building structure includes various components in order to allow for the building structure to be functional and/or habitable. These various components, include but are not limited to, electrical, mechanical, plumbing and waste water management, heating and cooling, informational, emergency and security systems. In conventional building techniques, many of these components must be installed and assembled at each location in which the building structure is constructed, and final testing of the installed systems is costly and time consuming. Furthermore, many of these components may perform related functions, but require specialized personnel for the installation and assembly of such components. In addition, many of these components may require suitable protection from the environments in which the components may be installed. Therefore, it may be desirable to provide a housing structure that is configured to house and contain one or more of the various building structure components, provide for efficient integration and connection of the building structure components between one another and provide for sufficient protection from the environments in which the housing structure and/or building structure components may be installed. Furthermore, it may also be desirable to provide a housing structure that is configured to reduce construction and/or installation time and/or cost associated with the components that may be contained in the housing structure, and to provide a housing structure that can be assembled and have the components contained therein interconnected and/or preconfigured in a controlled environment in order to at least provide for predictability in time and/or cost for installation of such components into the housing and/or building structure, and the ability to test components in a controlled environment prior to installation.

SUMMARY OF THE INVENTION

The present invention is designed to overcome the above noted limitations that are attendant upon the use of conventional building techniques and materials and, toward this end, it contemplates the provision of a novel integrated electrical assembly in which one or more functional components of a building structure may be housed and/or interconnected to other functional components.

It is an object of the present invention to provide a integrated electrical assembly that provides for a substantially watertight and/or water resistant structure for housing at least one functional component of a building structure, for example an electrical component such as a load center.

It is another object of the present invention to provide an integrated electrical assembly that provides for integration of functional components of a building structure in an efficient manner within the integrated electrical assembly.

It is yet another object of the present invention to provide an integrated electrical assembly that promotes efficient connection between functional components of a building structure within the integrated electrical assembly and between other integrated electrical assemblies.

It is still another object of the present invention to provide a method of integrating functional components of a building structure within an integrated electrical assembly.

It is yet another object of the present invention to provide an integrated electrical assembly containing at least one functional component of a building structure that can efficiently be installed in the building structure.

It is still another object of the present invention to provide an integrated electrical assembly containing at least one function component of a building structure that allows for reduction in construction time and/or cost associated with the construction and/or maintenance of the building structure.

It is yet another object of the present invention to provide an integrated electrical assembly containing at least one functional component of a building structure that provides for at least one modular unit, such as a low voltage power tray, that may be efficiently removed and replaced for repair and/or upgrade as an entire unit, and for connections and/or conduits between the integrated electrical assembly to provide for efficient rewiring of conductors and/or cables running to and from the integrated electrical assembly for purposes of repair and/or upgrade.

It is still another object of the present invention to provide an integrated electrical assembly that contains one or more components that can be tested prior to installation in the integrated electrical assembly in a building structure.

It has now been found that the foregoing and related objects can be readily attained in a housing structure that includes a door and a frame configured to contain at least one functional component of a building structure. The housing structure may also include at least one gasket positioned between the door and the frame, such that a watertight seal is formed between the door and the frame when the door is in a closed position. The housing structure may also include at least one flange extending at least partially around the perimeter of the housing structure. The housing structure may also include a master tub that is configured to receive one or more modular functional components of the building structure. The modular functional components may, for example, be a low voltage power supply unit, a data-com component, an alternative/emergency power component and/or a load center component. The master tub may be configured so as to permit efficient installation of the modular functional components into the housing structure and connection to modular functional components installed in other housing structures within the building structure.

BRIEF DESCRIPTION OF THE SEVERAL VIEWS OF THE DRAWINGS

For a fuller understanding of the nature and object of the present invention, reference should be had to the following detailed description taken in connection with the accompanying drawings, in which:

FIG. 1 is an exploded view showing how an exemplary embodiment of an integrated electrical assembly according to the present invention may be installed;

FIG. 2 is an isometric view of the exemplary embodiment of the integrated electrical assembly installed on an exemplary wall;

FIG. 3 is a front view of the exemplary embodiment of the integrated electrical assembly installed on the exemplary wall;

FIG. 3A is a front view of the exemplary embodiment of the integrated electrical assembly with a door panel and wall panels installed on and around the integrated electrical assembly;

FIG. 4A expanded view of the Section from FIG. 4;

FIG. 5A is a right side view of the exemplary embodiment of the integrated electrical assembly with a door panel and wall panels installed on and around the integrated electrical assembly;

FIG. 6A is a left side view of the exemplary embodiment of the integrated electrical assembly with a door panel and wall panels installed on and around the integrated electrical assembly;

FIG. 6B is an expanded view of Section B from FIG. 6A;

FIG. 6C is an expanded view of Section C from FIG. 6A;

FIG. 9 is a front view of the exemplary embodiment of the integrated electrical assembly installed on the exemplary wall with a door of the integrated electrical assembly in an open position;

FIG. 10 is an isometric view of the exemplary embodiment of the integrated electrical assembly installed on the exemplary wall with the door of the integrated electrical assembly in an open position;

FIG. 11 is a right side view of the exemplary embodiment of the integrated electrical assembly installed on the exemplary wall with the door of the integrated electrical assembly in an open position;

FIG. 13 is a rear view of the exemplary embodiment of the integrated electrical assembly installed on the exemplary wall;

FIG. 13A is an expanded view of Section A from FIG. 13 of a component of the exemplary embodiment of the integrated electrical assembly installed on the exemplary wall;

FIG. 13B is an exploded view of an exemplary feed enclosure and template plate that may be used with exemplary embodiments of the integrated electrical assembly according to the present invention;

FIG. 14A is a reverse expanded view of Section A from FIG. 14 of a component of the exemplary embodiment of the integrated electrical assembly installed on the exemplary wall;

FIG. 14B is an expanded view of Section B from FIG. 14 of a component of the exemplary embodiment of the integrated electrical assembly installed on the exemplary wall;

FIG. 14C is a rear view of the exemplary embodiment of the integrated electrical assembly installed on the exemplary wall;

FIG. 14D is a reverse expanded view of FIG. 14C;

FIG. 14E is an isometric top view of the exemplary embodiment of the integrated electrical assembly installed on the exemplary wall;

FIG. 20 is a front view of the exemplary embodiment of the integrated electrical assembly configured for installation within a wall;

FIG. 21 is a left side view of the exemplary embodiment of the integrated electrical assembly configured for installation within a wall;

FIG. 22 is a back view of the exemplary embodiment of the integrated electrical assembly configured for installation within a wall;

FIG. 27 is a bottom view of the exemplary master tub that may be used with exemplary embodiments of the integrated electrical assembly according to aspects of the present invention;

FIG. 28 is a front view of the exemplary master tub that may be used with exemplary embodiments of the integrated electrical assembly according to aspects of the present invention;

FIG. 29 is a top view of the exemplary master tub that may be used with exemplary embodiments of the integrated electrical assembly according to aspects of the present invention;

FIG. 32 is a front view of the exemplary master tub with exemplary components installed therein;

FIG. 33 is a bottom view of the exemplary master tub with exemplary components installed therein;

FIG. 34 is a top plan view of the exemplary master tub with exemplary components installed therein;

FIG. 40 is a top plan view of the exemplary low voltage power supply unit that may be used with exemplary embodiments of the integrated electrical assembly according to aspects of the present invention;

FIG. 41 is an exploded isometric view of the exemplary low voltage power supply unit that may be used with exemplary embodiments of the integrated electrical assembly according to aspects of the present invention;

FIG. 42 is a front view of the exemplary low voltage power supply unit that may be used with exemplary embodiments of the integrated electrical assembly according to aspects of the present invention with a front panel removed;

FIG. 43 is a front isometric view of the exemplary low voltage power supply unit that may be used with exemplary embodiments of the integrated electrical assembly according to aspects of the present invention with the front panel removed;

FIG. 43A is a front isometric view of another exemplary low voltage power supply unit that may be used with exemplary embodiments of the integrated electrical assembly according to aspects of the present invention with its control compartment and connection compartment in open positions;

FIG. 44 is a front isometric view of an exemplary data-com component that may be used with exemplary embodiments of the integrated electrical assembly according to aspects of the present invention;

FIG. 44A is a top plan view of the exemplary data-com component that may be used with exemplary embodiments of the integrated electrical assembly according to aspects of the present invention;

FIG. 44B is a front view of the exemplary data-com component that may be used with exemplary embodiments of the integrated electrical assembly according to aspects of the present invention;

FIG. 44C is a bottom plan view of the exemplary data-com component that may be used with exemplary embodiments of the integrated electrical assembly according to aspects of the present invention;

FIG. 44D is a side view of the exemplary data-com component that may be used with exemplary embodiments of the integrated electrical assembly according to aspects of the present invention;

FIG. 45 a front isometric view of the exemplary data-com component that may be used with exemplary embodiments of the integrated electrical assembly according to aspects of the present invention with a door open;

FIG. 46 is a front isometric view of the exemplary data-com component that may be used with exemplary embodiments of the integrated electrical assembly according to aspects of the present invention with the door open and a panel partially removed;

FIG. 47 is a front view of the exemplary data-com component that may be used with exemplary embodiments of the integrated electrical assembly according to aspects of the present invention with the door open;

FIG. 48 is a front isometric view of an exemplary alternative power unit that may be used with exemplary embodiments of the integrated electrical assembly according to aspects of the present invention;

FIG. 48A is a front isometric view of an exemplary alternative power unit that may be used with exemplary embodiments of the integrated electrical assembly according to aspects of the present invention with the cover removed;

FIG. 49 is a bottom plan view of the exemplary alternative power unit that may be used with exemplary embodiments of the integrated electrical assembly according to aspects of the present invention;

FIG. 50A is a front view of the exemplary alternative power unit that may be used with exemplary embodiments of the integrated electrical assembly according to aspects of the present invention;

FIG. 50B is a front view of the exemplary alternative power unit that may be used with exemplary embodiments of the integrated electrical assembly according to aspects of the present invention with an exemplary cover removed;

FIG. 51 is a side view of the exemplary alternative power unit that may be used with exemplary embodiments of the integrated electrical assembly according to aspects of the present invention;

FIG. 52 is a top isometric view of an exemplary load center that may be used with exemplary embodiments of the integrated electrical assembly according to aspects of the present invention;

FIG. 53 is a partially exploded front isometric view of the exemplary load center that may be used with exemplary embodiments of the integrated electrical assembly according to aspects of the present invention;

FIG. 55 is a cross-sectional view taken along line 55-55 in FIG. 52 of the exemplary load center that may be used with exemplary embodiments of the integrated electrical assembly according to aspects of the present invention;

FIG. 56 is a front view of the exemplary load center that may be used with exemplary embodiments of the integrated electrical assembly according to aspects of the present invention with a door in an open position;

FIG. 57 a front view of another exemplary integrated electrical assembly according to the present invention;

FIG. 58 is a side view of an exemplary master tub that may be used with the other exemplary integrated electrical assembly according to the present invention;

FIG. 59 is a front isometric view of the exemplary master tub with exemplary components that may be used with the other exemplary integrated electrical assembly according to the present invention;

FIG. 63 is a front view of another exemplary low voltage power supply unit that may be used with exemplary embodiments of the integrated electrical assembly according to aspects of the present invention or may be provided as a standalone unit;

FIG. 64 is a front view of the other exemplary low voltage power supply unit that may be used with exemplary embodiments of the integrated electrical assembly according to aspects of the present invention with a front panel removed;

FIG. 65 is a side view of the other exemplary low voltage power supply unit that may be used with exemplary embodiments of the integrated electrical assembly according to aspects of the present invention or may be provided as a standalone unit;

FIG. 71 is a generalized schematic view of exemplary electrical connections between an electrical service line and one or more integrated electrical assemblies;

FIG. 74 is an exploded view of the exemplary multi-wire connector that may be used with the integrated electrical assembly according to the present invention;

FIG. 75 is a front view of the exemplary multi-wire connector that may be used with the integrated electrical assembly according to the present invention;

FIG. 75A is a front view of the exemplary multi-wire connector without a base mount that may be used with the integrated electrical assembly according to the present invention;

FIG. 76 is a side view of the exemplary multi-wire connector that may be used with the integrated electrical assembly according to the present invention;

FIG. 76A is a side view of the exemplary multi-wire connector without a base mount that may be used with the integrated electrical assembly according to the present invention;

FIGS. 76B and 76C are a side view of the exemplary multi-wire connector showing how the multi-wire connector may be installed on the base mount;

FIG. 77 is a top plan view of the exemplary multi-wire connector that may be used with the integrated electrical assembly according to the present invention;

FIG. 77A is a top plan view of the exemplary multi-wire connector without a base mount that may be used with the integrated electrical assembly according to the present invention;

FIG. 78 is an isometric front view of the exemplary multi-wire connector that may be used with the integrated electrical assembly according to the present invention;

FIG. 78A is an isometric front view of the exemplary multi-wire connector without a base mount that may be used with the integrated electrical assembly according to the present invention;

FIG. 79 is an isometric back view of the exemplary multi-wire connector without a base mount that may be used with the integrated electrical assembly according to the present invention;

FIG. 79A is an isometric back view of the exemplary multi-wire connector without a base mount that may be used with the integrated electrical assembly according to the present invention;

FIG. 82 is a top plan view of the exemplary multi-wire connector that may be used with the integrated electrical assembly according to the present invention;

FIG. 83 is a cross-sectional view taken along line 83-83 in FIG. 82 of the exemplary multi-wire connector that may be used with the integrated electrical assembly according to the present invention;

FIG. 84 is a top view of the exemplary multi-wire connector that may be used with the integrated electrical assembly according to the present invention;

FIG. 85 is a cross-sectional view taken along line 85-85 in FIG. 84 of the exemplary multi-wire connector that may be used with the integrated electrical assembly according to the present invention;

FIG. 86 generalized schematic view of data-com connections between a data-com distribution panel and one or more integrated electrical assemblies;

FIG. 87 is a front isometric view of an exemplary junction box that may be configured for connection to the integrated electrical assembly according to the present invention;

FIG. 87A is a front isometric view of the exemplary junction box without a decorative panel that may be configured for connection to the integrated electrical assembly according to the present invention;

FIG. 88 is an isometric back view of the exemplary junction box that may be configured for connection to the integrated electrical assembly according to the present invention;

FIG. 89 is a front view of the exemplary junction box that may be configured for connection to the integrated electrical assembly according to the present invention;

FIG. 89A is a front view of the exemplary junction box without a decorative panel that may be configured for connection to the integrated electrical assembly according to the present invention;

FIG. 90 is a bottom plan view of the exemplary junction box that may be configured for connection to the integrated electrical assembly according to the present invention;

FIG. 90A is a bottom plan view of the exemplary junction box without a decorative panel that may be configured for connection to the integrated electrical assembly according to the present invention;

FIG. 91 is a side view of the exemplary junction box that may be configured for connection to the integrated electrical assembly according to the present invention;

FIG. 91A is a side view of the exemplary junction box without a decorative panel that may be configured for connection to the integrated electrical assembly according to the present invention;

FIG. 92 is an isometric view of the exemplary junction box for installation in an exemplary wall;

FIG. 93 is a front view of the exemplary junction box installed in the exemplary wall;

FIG. 94 is a cross-sectional view taken along line 94-94 in FIG. 93 of the exemplary junction box installed in the exemplary wall;

FIG. 95 is an exploded view of the exemplary junction box that may be configured for connection to the integrated electrical assembly according to the present invention;

Figure 110:
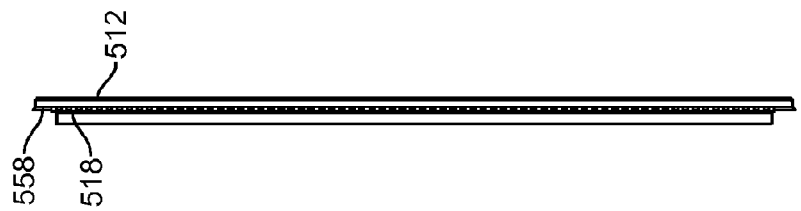
Figure 109:
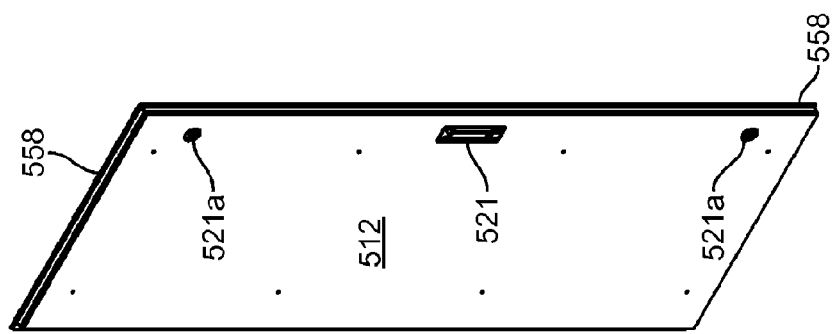
Figure 108:
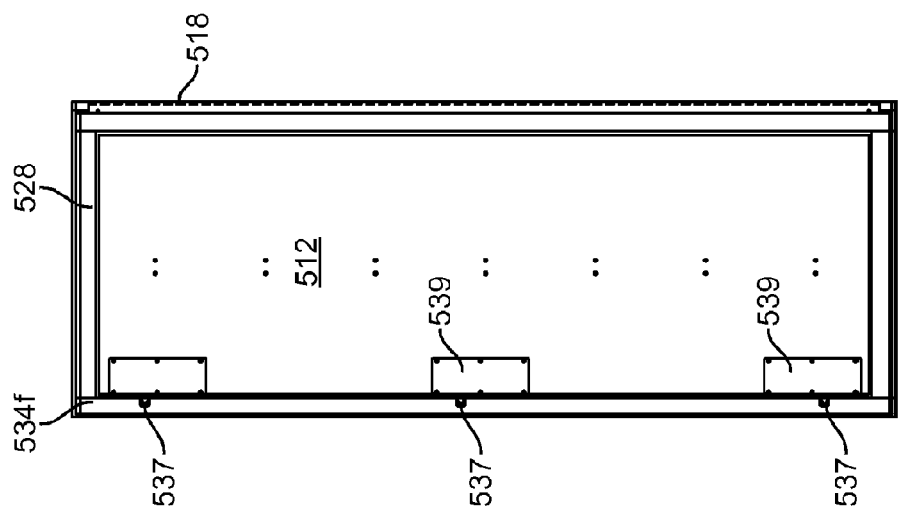
Figure 113:
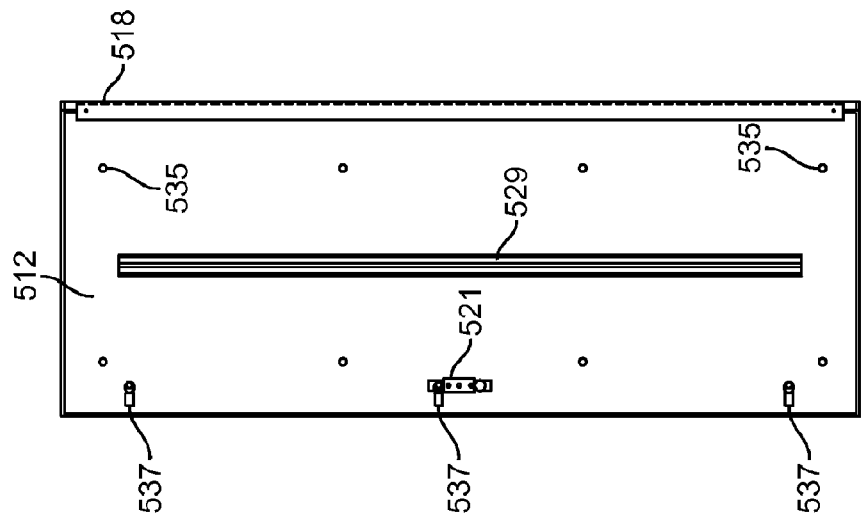
Figure 112:
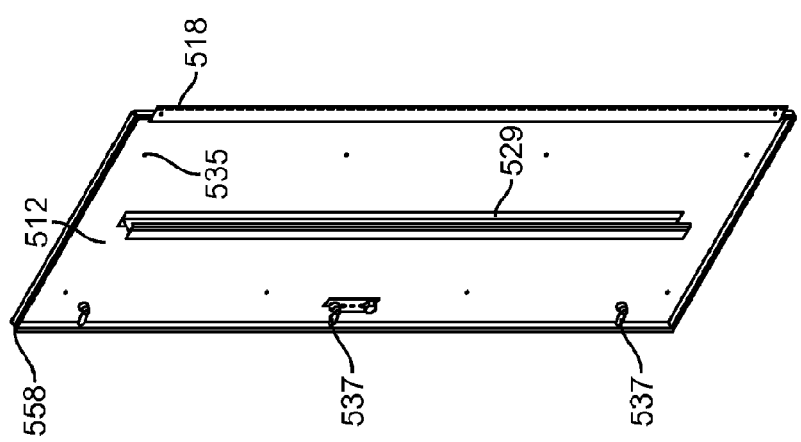
Figure 111:
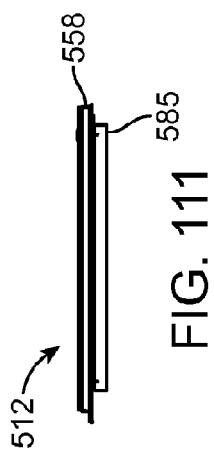
Figure 119A:
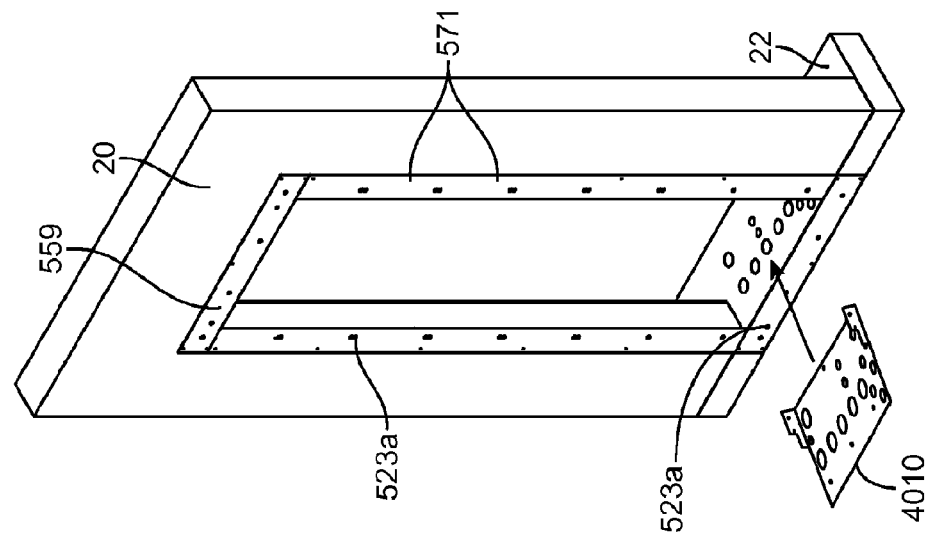
Figure 119:
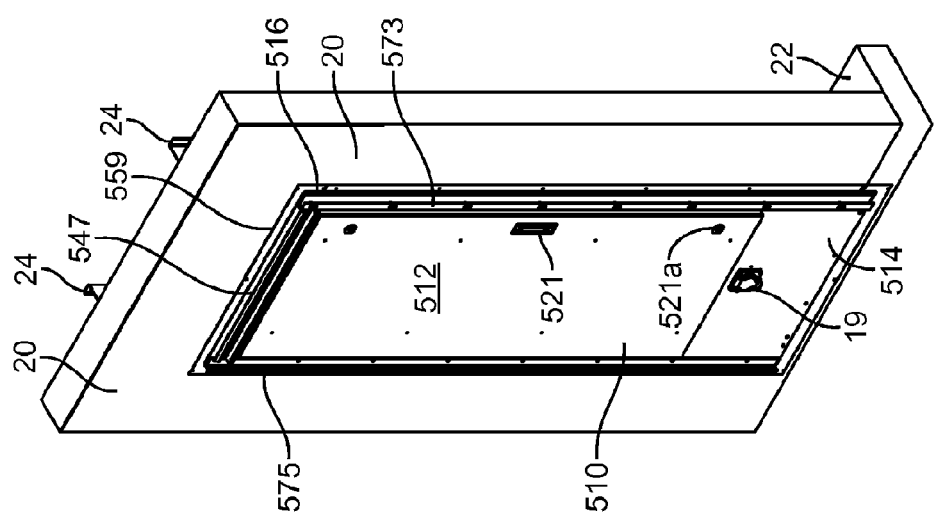
Figure 120A:
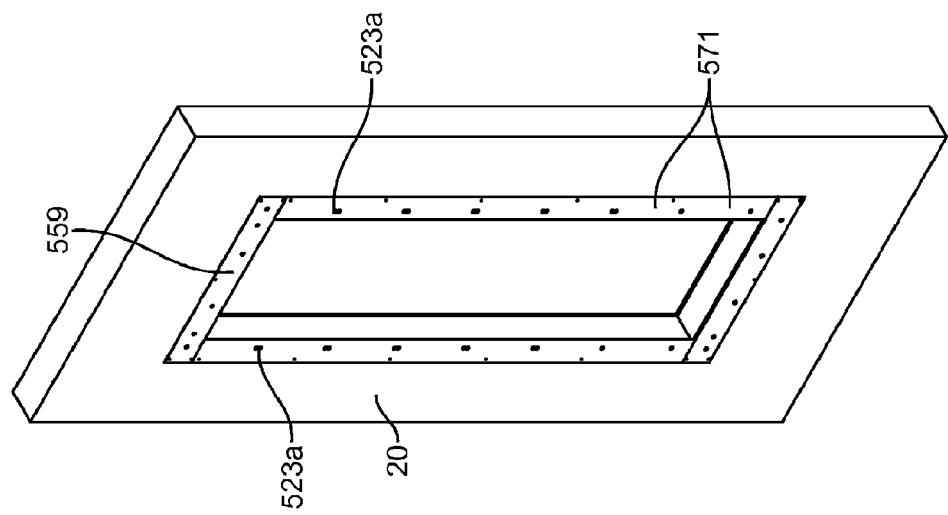
Figure 120:
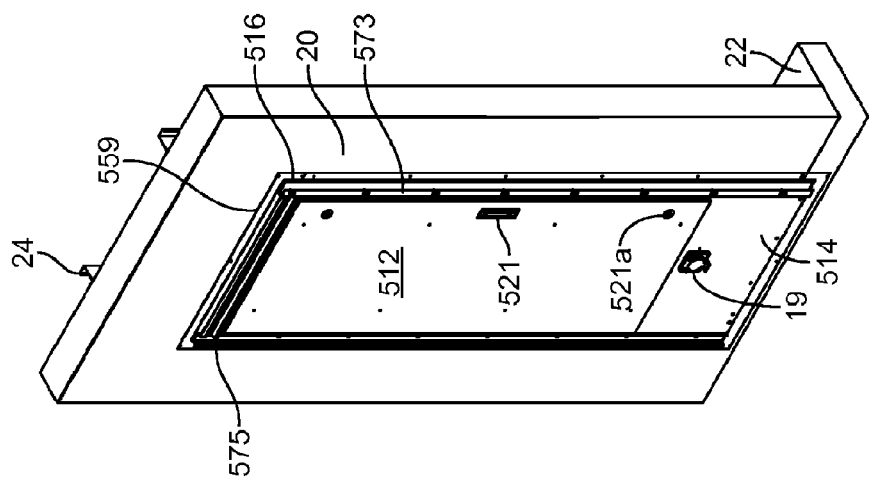

FIG. 96 is an isometric front view of another exemplary junction box that may be configured for connection to the integrated electrical assembly according to the present invention;

FIG. 96A is an isometric view of the other exemplary junction box without a decorative panel that may be configured for connection to the integrated electrical assembly according to the present invention;

FIG. 97 is a side view of the other exemplary junction box that may be configured for connection to the integrated electrical assembly according to the present invention;

FIG. 97A is a side view of the other exemplary junction box without a decorative panel that may be configured for connection to the integrated electrical assembly according to the present invention;

FIG. 98 is a front view of the other exemplary junction box that may be configured for connection to the integrated electrical assembly according to the present invention;

FIG. 98A is a front plan view of the other exemplary junction box without a decorative panel that may be configured for connection to the integrated electrical assembly according to the present invention;

FIG. 99 is a top plan view of the other exemplary junction box that may be configured for connection to the integrated electrical assembly according to the present invention;

FIG. 99A is a top plan view of the other exemplary junction box without a decorative panel that may be configured for connection to the integrated electrical assembly according to the present invention;

FIG. 100 is an isometric view of the other exemplary junction box showing surface mounted installation of the exemplary junction box;

FIG. 101 is a front view of another exemplary embodiment of an integrated electrical assembly according to the present invention;

FIG. 102 is a side view of the other exemplary embodiment of an integrated electrical assembly according to the present invention;

FIG. 103 is a back view of the other exemplary embodiment of an integrated electrical assembly according to the present invention;

FIG. 103A an expanded view from Section A of FIG. 103;

FIG. 104 is a front view of an exemplary swing door from the other exemplary embodiment of an integrated electrical assembly according to the present invention;

FIG. 105 is a cross-sectional view of the exemplary swing door from the other exemplary embodiment of an integrated electrical assembly according to the present invention taken along line 105-105 in FIG. 104;

FIG. 106 is a cross-sectional view of the exemplary swing door from the other exemplary embodiment of an integrated electrical assembly according to the present invention taken along line 106-106 in FIG. 104;

FIG. 107 is a cross-sectional view of the exemplary swing door from the other exemplary embodiment of an integrated electrical assembly according to the present invention taken along line 107-107 in FIG. 104;

FIG. 107A is an expanded view from Section A of FIG. 107;

FIG. 108 is a back view of the exemplary swing door from the other exemplary embodiment of an integrated electrical assembly according to the present invention;

FIG. 109 is an isometric view of the exemplary swing door from the other exemplary embodiment of an integrated electrical assembly according to the present invention;

FIG. 110 is a side view of the exemplary swing door from the other exemplary embodiment of an integrated electrical assembly according to the present invention;

FIG. 111 is a top plan view of the exemplary swing door from the other exemplary embodiment of an integrated electrical assembly according to the present invention;

FIG. 112 is a rear isometric view of the exemplary swing door with a back panel removed from the other exemplary embodiment of an integrated electrical assembly according to the present invention;

FIG. 113 is a rear view of the exemplary swing door with the back panel removed from the other exemplary embodiment of an integrated electrical assembly according to the present invention;

FIG. 114 is a front view of the other exemplary embodiment of an integrated electrical assembly according to the present invention installed on an exemplary wall;

FIG. 114A is a front view of an exemplary metallic wall plate for use with the integrated electrical assembly according to the present invention installed on the exemplary wall;

FIG. 115 is a cross-sectional view of the other exemplary embodiment of an integrated electrical assembly according to the present invention taken along line 115-115 from FIG. 114;

FIG. 115A is an expanded view from Section A of FIG. 115;

FIG. 115B is an expanded view from Section B of FIG. 115;

FIG. 116 is a cross-sectional view of the other exemplary embodiment of an integrated electrical assembly according to the present invention taken along line 116-116 from FIG. 114;

FIG. 116A is an expanded view from Section A of FIG. 116;

FIG. 116B is an expanded view from Section B of FIG. 116;

FIG. 117 is a side view of the other exemplary embodiment of an integrated electrical assembly according to the present invention installed on the exemplary wall;

FIG. 118 is a front view of the other exemplary embodiment of an integrated electrical assembly according to the present invention installed on an exemplary wall and floor;

FIG. 118A is a front view of an exemplary metallic wall plate for use with the integrated electrical assembly according to the present invention installed on the exemplary wall and floor;

FIG. 119 is an isometric view of the other exemplary embodiment of an integrated electrical assembly according to the present invention installed on the exemplary wall and floor;

FIG. 119A is an isometric view of an exemplary metallic wall plate for use with the integrated electrical assembly according to the present invention installed on the exemplary wall and floor;

FIG. 120 is an isometric view of the other exemplary embodiment of an integrated electrical assembly according to the present invention installed on the exemplary wall;

FIG. 120A is an isometric view of an exemplary metallic wall plate for use with the integrated electrical assembly according to the present invention installed on the exemplary wall;

FIG. 121 is a front view of the other exemplary embodiment of an integrated electrical assembly according to the present invention with the swing door removed;

FIG. 122 is an isometric view of the other exemplary embodiment of an integrated electrical assembly according to the present invention;

FIG. 122A is an expanded view of Section A from FIG. 122; and

FIG. 122B is an expanded view of Section B from FIG. 122.

DETAILED DESCRIPTION OF THE INVENTION

The present invention now will be described more fully hereinafter with reference to the accompanying figures, in which exemplary embodiments of the invention are shown. The invention may, however, be embodied in many different forms and should not be construed as limited to the embodiments set forth herein. Like reference numerals refer to like elements throughout.

Figure 2B:
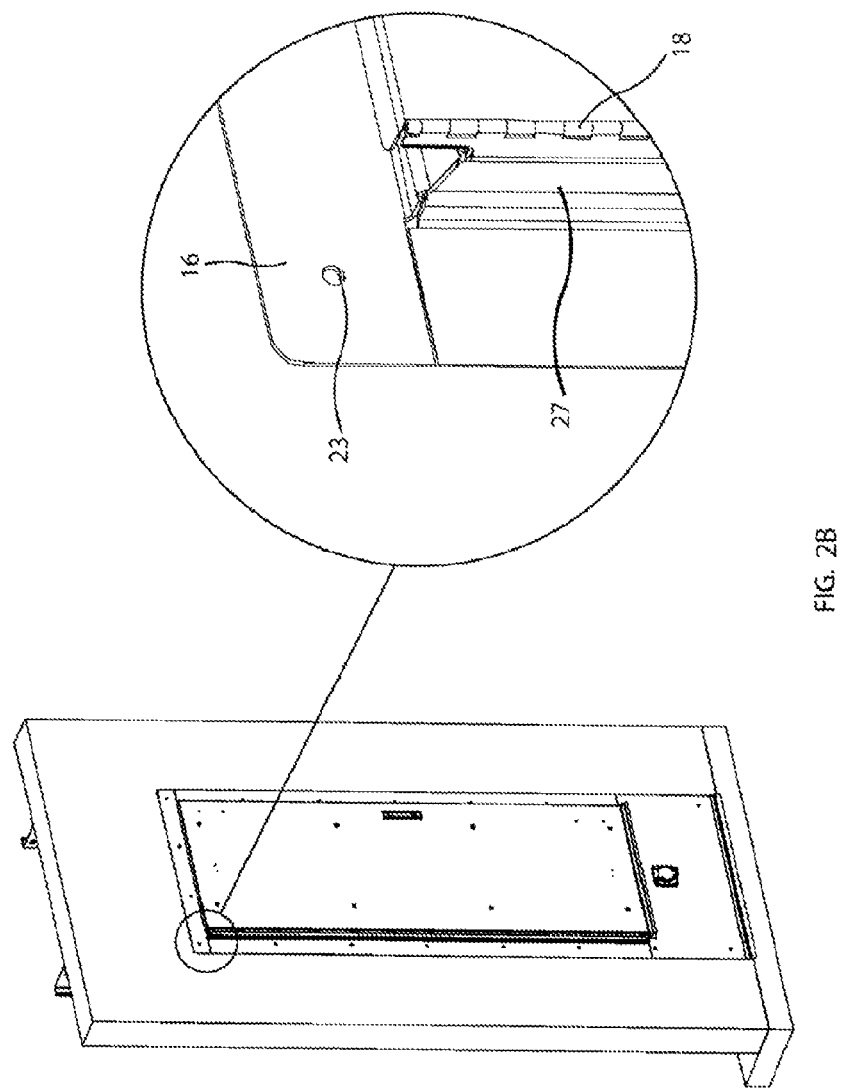
FIG. 2B is an expanded view of a hinge section of the exemplary embodiment of integrated electrical assembly from FIG. 2.
Figure 2A:
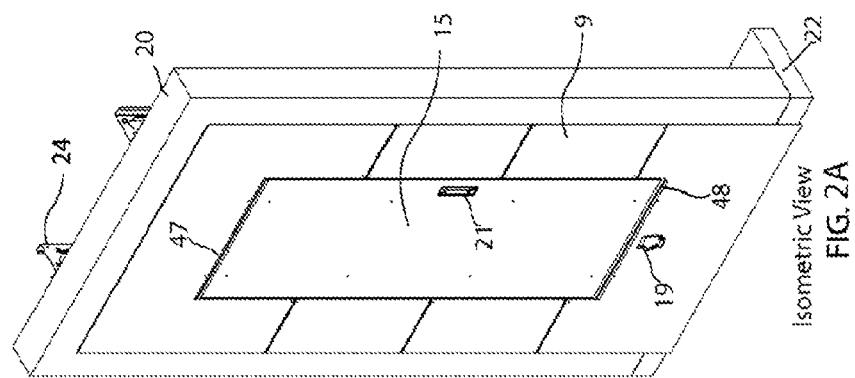
FIG. 2A is an isometric view of the exemplary embodiment of the integrated electrical assembly with a door panel and wall panels installed on and around the integrated electrical assembly.

Referring now to FIGS. 1-2, 2B, 3, 4, 5, 6-13, 13A, 14 and 14A-14E, therein illustrated is an exemplary embodiment of an integrated electrical assembly, generally indicated by reference numeral 10, according to the present invention. The integrated electrical assembly 10 may for example be master electrical distribution node for a building structure and/or a subspace (individual unit) within the building structure, such as one or more living units, hospital rooms, retail spaces, flex warehousing and the like, that integrates one or more electrical, lighting and/or data-com systems together. The integrated electrical assembly 10 may also be configured as a slave integrated electrical assembly 10 that receives wiring from the master electrical distribution node. The integrated electrical assembly 10 may include a frame 11, a swing door 12 attached to the frame 11 by a hinge 18 and a mounting flange 16 extending around the periphery of the frame 11. The hinge 18 may be constructed so that it extends over a housing lip 27, as shown in greater detail in FIG. 2B. Furthermore, preferably the hinge 18 may be a continuous piano hinge that may be formed from a non-corrosive or corrosion resistive metal, such as stainless steel. Even more preferably, the hinge 18 may be configured so as to support a heavy durable door and provide for pressure relief and/or reduction from high pressure water sprays/jet, for example from power washings of the building structure, in order to allow the integrated electrical assembly 10 to obtain at least a NEMA 4 listing. The integrated electrical assembly 10 may also include a bottom panel 14 that may contain an outlet 19 with a watertight/water proof cover. For example, the outlet may be a watertight twist lock receptacle, and may preferably be a NEMA 4 rated watertight twist lock receptacle. The swing door 12 of the integrated electrical assembly 10 may contain a door handle 21 for permitting access to and closing of the swing door 12, and the door handle 21 may contain a locking mechanism, such as a keyed tumbler, in order to allow for restricting access to the integrated electrical assembly 10.

The integrated electrical assembly 10 may be configured for installation in an exemplary wall 20, which may be for example an exterior wall. The integrated electrical assembly 10 may be positioned in an opening formed in the wall 20 that may be flanked by one or more wall supports 24 and a floor surface 22 on the bottom of the opening. A template plate 4010 may be placed on the floor surface 22 on the bottom of the opening in order to provide a guide for cables and/or conduits running into the integrated electrical assembly. The wall support 24 may be an industry standard steel stud or a formed metal stud, for example a roll formed and stamped steel stud such as a DELTASTUD available from Steelform Building Products Inc. The floor surface 22 may be any suitable building flooring surface and/or structure, and may be for example concrete. The opening preferably may be slightly larger than the size of the frame 11 of the integrated electrical assembly 10, but smaller than the size of the mounting flange 16 extending around the integrated electrical assembly 10. A bead of a sealant (not shown), such as silicon, polyurethane, acrylic, adhesive, epoxy, may be placed between the mounting flange 16 and the wall 20 so as to provide for a water tight seal between the integrated electrical assembly 10 and the wall 20. In the alternative, a gasket (not shown) may be provided on the mounting flange 16 in order to seal the integrated electrical assembly 10 to the wall 20. The mounting flange 16 of the integrated electrical assembly 10 may include one or more mounting holes 23 to allow one or more fasteners 26, such as nails, screws, bolts, lag screws, lag bolts to secure the integrated electrical assembly 10 to the wall 20. Another sealant (not shown) may be placed over the mounting flange 16 and the fasteners 26, and extend at least partially onto the wall 20 in order to further seal the integrated electrical assembly 10 to the wall 20 in order to prevent water or moisture penetrating between the integrated electrical assembly 10 and the wall 20.

Figure 4:
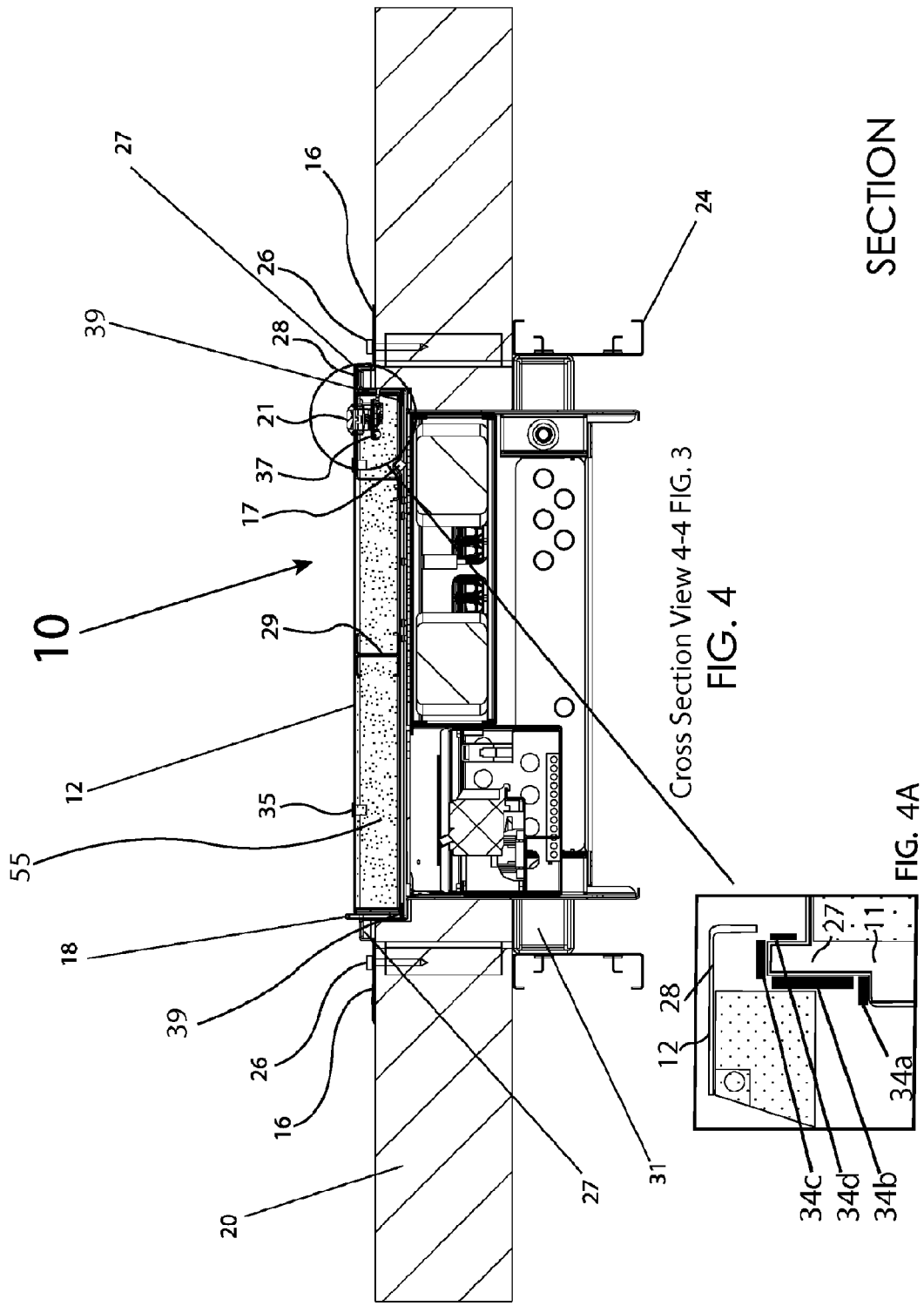
FIG. 4 is a cross-sectional view taken along line 4-4 in FIG. 3 of the exemplary embodiment of the integrated electrical assembly installed on the exemplary wall.
Figure 5:
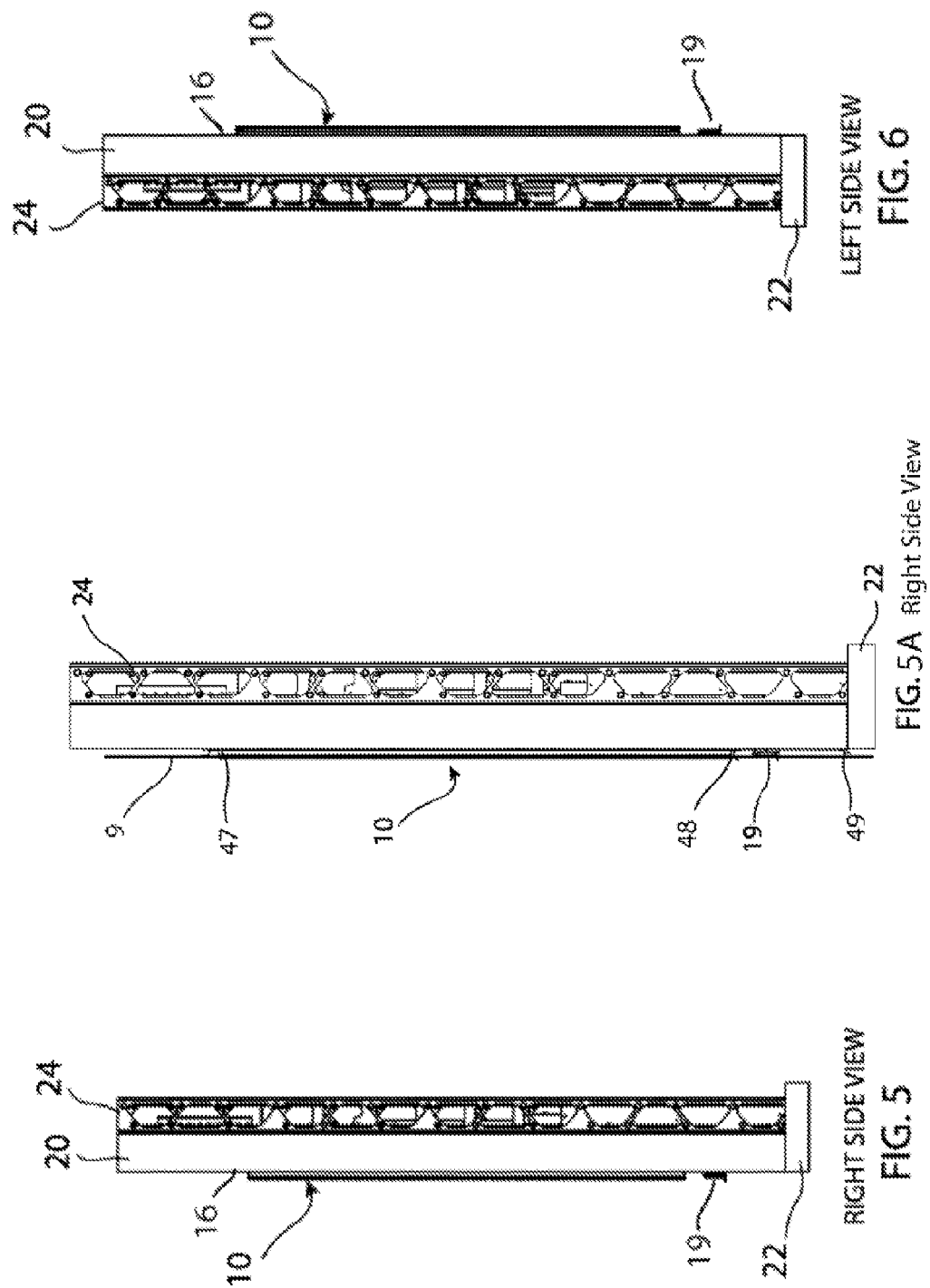
FIG. 5 is a right side view of the exemplary embodiment of the integrated electrical assembly installed on the exemplary wall.
Figure 6:
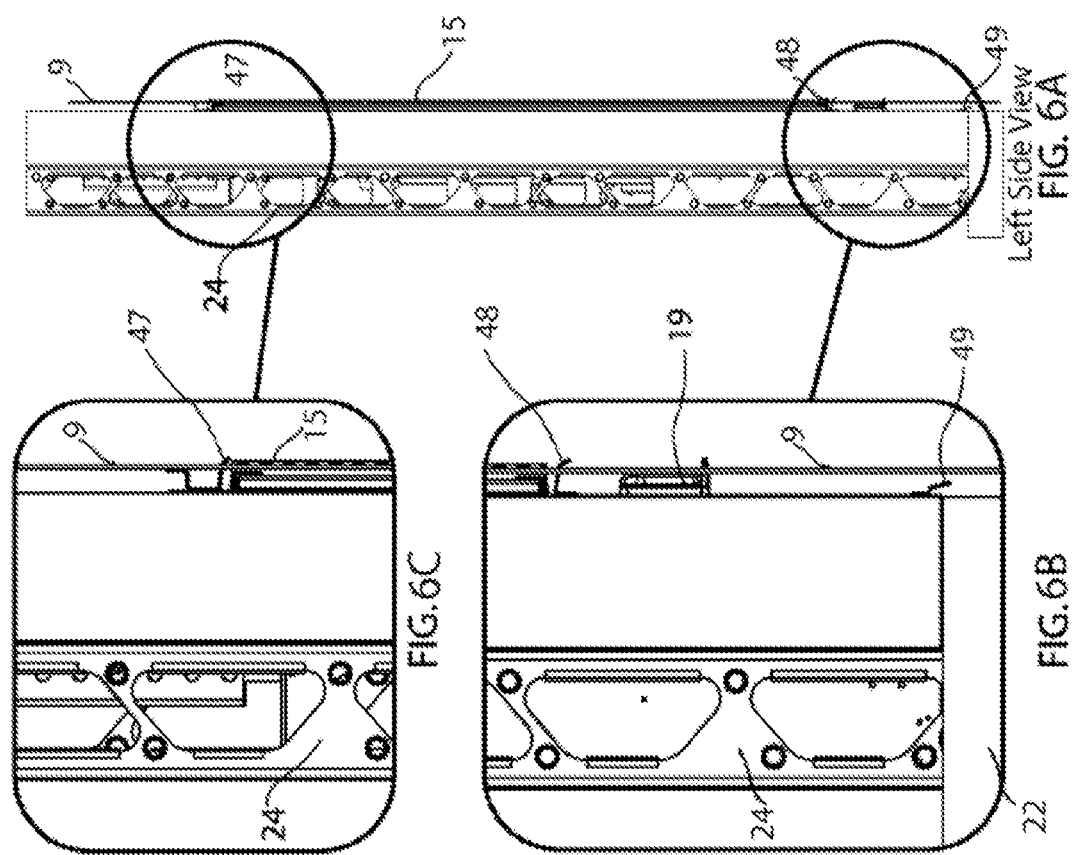
FIG. 6 is a left side view of the exemplary embodiment of the integrated electrical assembly installed on the exemplary wall.
Figure 7:
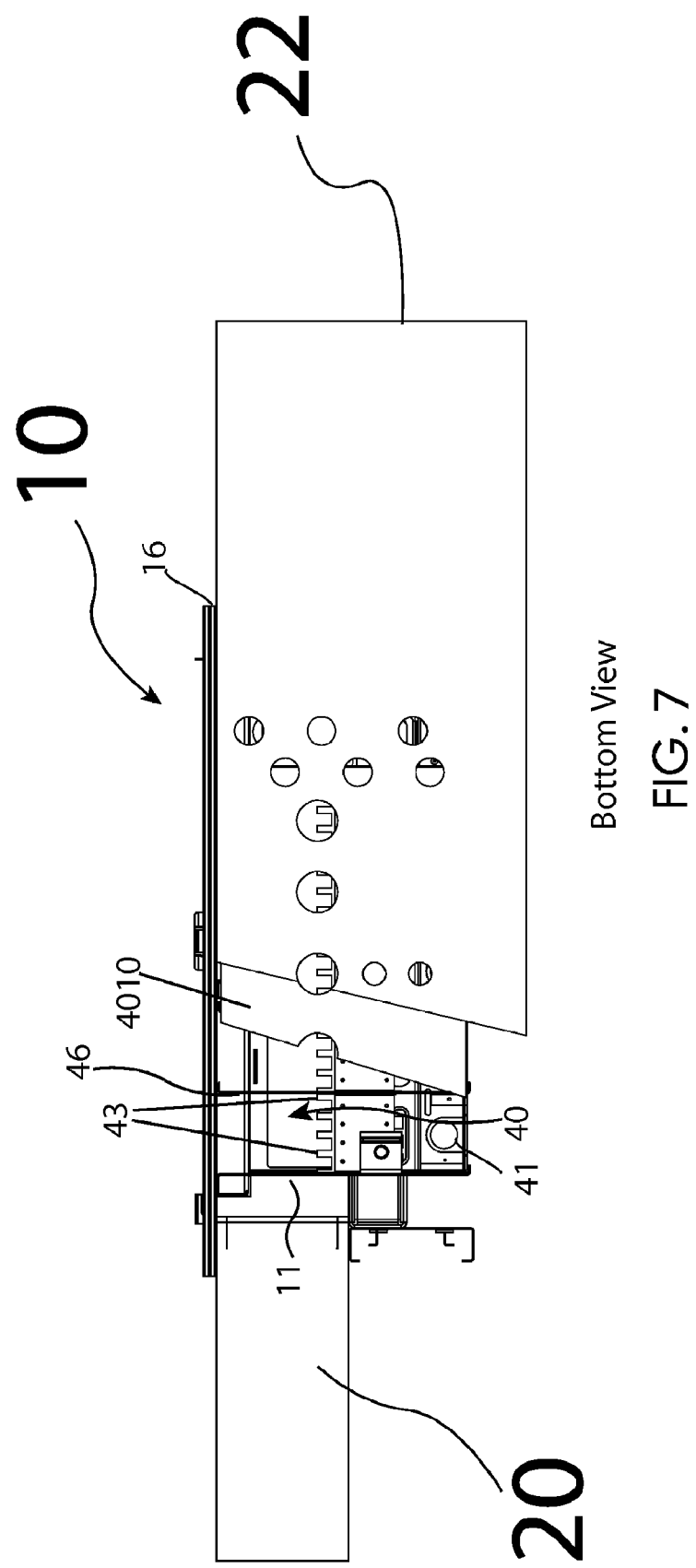
FIG. 7 is a bottom plan view of the exemplary embodiment of the integrated electrical assembly installed on the exemplary wall.
Figure 8:
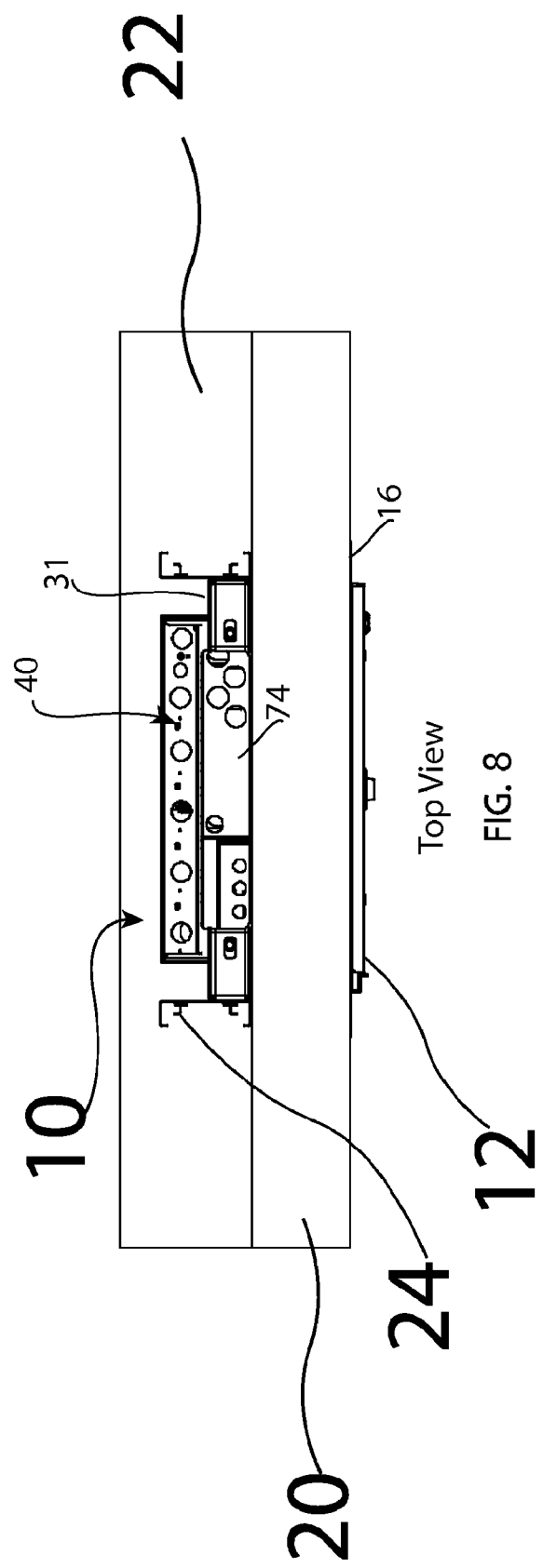
FIG. 8 is a top plan view of the exemplary embodiment of the integrated electrical assembly installed on the exemplary wall.
Figure 12:
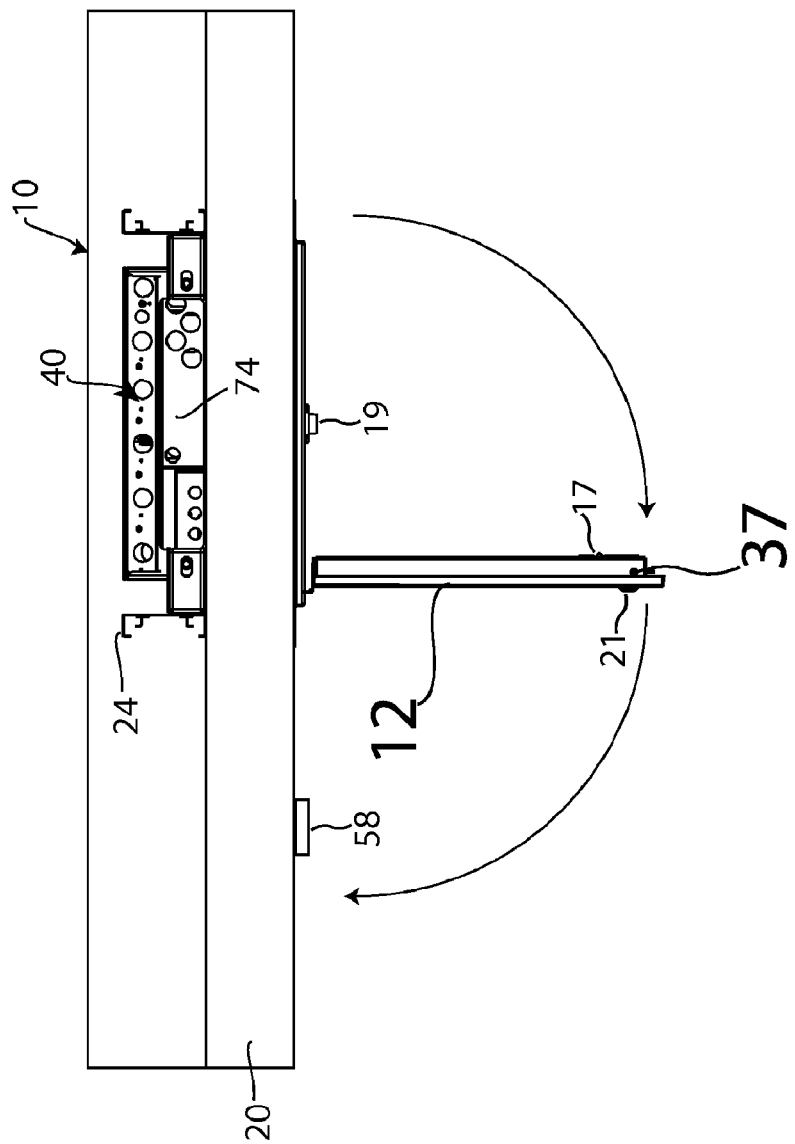
FIG. 12 is a top view of the exemplary embodiment of the integrated electrical assembly installed on the exemplary wall showing the range of motion of the door of the integrated electrical assembly.

Referring more specifically to FIGS. 4 and 9-12, the integrated electrical assembly 10 may also include the housing lip 27 extending around the inside perimeter of the mounting flange 16, and a corresponding door lip 28 formed in the swing door 12 that is configured to cover the housing lip 27 when the swing door 12 is in a closed position, for example as shown in FIG. 4. The door lip 28 extends around three sides of the swing door 12 so that when the swing door 12 is in a closed position, the door lip 28 extends over and around the housing lip 27 in order to provide for pressure relief and/or reduction from high pressure water sprays/jet in order to allow the integrated electrical assembly 10 to obtain at least a NEMA 4 listing. A door gasket 34a may be placed around the periphery of where the swing door 12 contacts the integrated electrical assembly 10 in order to provide for a watertight seal between the swing door 12 and the integrated electrical assembly 10. As shown for example in FIG. 4A, additional door gaskets 34b, 34c, 34d may also be placed on or around the housing lip 27 to provide additional seals with the door lip 28 when the swing door 12 in a closed position on three sides. Any combination of door gaskets 34a, 34b, 34c, 34d may be used with the present invention. It is understood that the configuration of the door lip 28, the housing lip 27 when the swing door 12 is in a closed position in combination with the hinge 18 on the side of the swing door 12 that does not include the door lip 28 and the one or more of the gaskets 34a, 34b, 34c, 34d are capable of producing a watertight seal for the integrated electrical assembly 10 to obtain at least a NEMA 4 listing. The swing door 12 may also include at least one I-beam 29, or other structural member formed or fabricated within the swing door 12 so as to provide structural rigidity to the swing door 12, and to prevent heat warping of the swing door 12. The space within the swing door 12 may be at least partially filled with insulation 55 so that the integrated electrical assembly 10 is resistive to heat and/or cold transfer from outside the integrated electrical assembly 10 to the components within the integrated electrical assembly. The swing door 12 of the integrated electrical assembly 10 may also include one or more threaded plugs 35 that are configured to threadenly engage with a threaded fastener (not shown) in order to allow items, such as rain and/or decorative door panels 15 (FIGS. 2A, 3A, 5A and 6A-6B), to be secured to the swing door 12 and/or the integrated electrical assembly 10. The threaded plugs 35 may be configured such that the threaded plugs 35 compressed when the threaded fastener is tightened onto the threaded plugs 35 so as to seal the threaded plugs 35 against the swing door 12. The swing door 12 of the integrated electrical assembly 10 may also include a low voltage lighting strip 17, for example an LED strip or similar, that provides illumination to the integrated electrical assembly 10 when the swing door 12 of the integrated electrical assembly 10 is in an open position. The swing door 12 of the integrated electrical assembly 10 may also include one or more latching mechanisms 37, for example a rod, connected to and actuated by the door handle 21, and configured to secure the swing door 12 to the frame 11 when the swing door 12 is in a closed position. Preferably the latching mechanisms 37 may be configured to provide for a three-point closure, in which there is at least one latching mechanism 37 on the top and bottom and at least one side of the swing door 12. The latching mechanisms 37 may engage with corresponding openings 38 in the frame 11 of the integrated electrical assembly 10. The swing door 12 may also include a removable panel 39 in order to permit access to the one or more latching mechanisms 37 and interior components of the door handle 21 for maintenance and/or repair when the swing door 12 is in an open position. It is understood that the swing door 12 may be configured to be opened to 180°, but that the swing door 12 may include mechanisms (not shown) in order to permit the swing door 12 to only open a certain amount so as to prevent accidental damage to nearby objects and/or persons, or may include fixed and/or adjustable stops (not shown) that are configured to hold the swing door 12 open at a particular open position, for example at 90°. A magnet 58 may also be positioned on the wall 20 so as to provide a mechanism for securing the swing door 12 in an approximately 180 degree open position.

Referring now to FIGS. 2A, 3A, 5A and 6A-6C, the swing door 12 of the integrated electrical assembly 10 may include a rain and/or decorative door panel 15 installed thereon as discussed above. The wall 20 on which the integrated electrical assembly 10 has been installed may also include one or more rain and/or decorative wall panels 9 installed thereon. Furthermore, a top rain shield drip edge 47 may be installed on the top edge of the integrated electrical assembly 10 in order to prevent and/or reduce moisture, such as rain, from running down the wall 20 and/or wall panel 9 directly onto the integrated electrical assembly 10. It is understood that the top rain shield drip edge 47 may be installed regardless of whether the door panel 15 and/or wall panels 9 have been installed. A middle rain shield drip edge 48 may also be installed between the swing door 12 and the outlet 19 in order to prevent and/or reduce moisture, such as rain, from running down the wall 20 and/or wall panel 9 directly onto the outlet 19. It is understood that the middle rain shield drip edge 48 may be installed regardless of whether the door panel 15 and/or wall panels 9 have been installed. Furthermore, a bottom rain shield drip edge 49 may be installed below the outlet 19 in order to remove any moisture that may be between the wall 20 and wall panels 9. However, it is understood that the bottom rain shield drip edge 49 may be installed regardless of whether the door panel 15 and/or wall panels 9 have been installed.

Referring now to FIGS. 13, 13A and 13B, the integrated electrical assembly 10 may also include a master feed enclosure 40 that may be positioned behind the bottom panel 14 and under the master tub 50 of the integrated electrical assembly 10. The master feed enclosure 40 may include one or more high-voltage junction compartments 41, which are each separated by a barrier plate 46. The high-voltage junction compartments 41 are configured to receive wiring (not shown) from an electric service from an electric meter in an electrical room of the building structure through one or more holes/knock-outs 42 positioned on the bottom of the master feed enclosure 40. In this manner, each high-voltage junction compartment 41 receive a separate multi-conductor feed from each electric meter, which can then be further distributed onto additional integrated electrical assemblies 10 as discussed further below. The wiring (not shown) from the electric service may be connected to high voltage distribution cables (not shown), which may be for example 208-240V or the like, such as four copper conductor cables, extending to one or more power distribution blocks 43 within each high-voltage junction compartment 41. The master feed enclosure 40 may also include a data-com junction compartment 45, in which the data-com conduit and/or wiring from a data-com source may be fed into and/or through the integrated electrical assembly 10.

Referring now to FIGS. 14C, 14D and 14E, the master feed enclosure 40 may include an access cover 4005 that is removably attached to the master feed enclosure 40 in order to allow access to the master feed enclosure 40 and the high-voltage junction compartments 41 and data-com junction compartment 45 contained therein. One or more high voltage risers 56 may extend from the master feed enclosure 40 and be configured to connect to another integrated electrical assembly 10 within the building structure. The high voltage risers 56 may be made from flexible, e.g. MC cable, and/or rigid electrical conduit.

As shown for example in FIG. 71, the integrated electrical assembly 10 may be pre-wired to allow for efficient connection between one or more main breakers (MB) for separate service feeds coming from the electrical room of the building structure. The integrated electrical assembly 10 that is acting as the master electrical distribution node for one or more slave integrated electrical assemblies 10 of the building structure may be connected for its power to an electrical feed line 7101 from a main breaker (MB) by an electrical assembly power distribution block 83 in a main electrical feed unit 80 of the integrated electrical assembly 10. Furthermore, electrical feed lines 7102, 7103, 7104, 7105, 7106 may be run from each main breaker (MB) and connected to separate power distribution blocks 43 within the master feed enclosure 40 of the integrated electrical assembly 10 acting as the electrical distribution node. Each power distribution block 43 has been pre-wired to appropriate wiring in a corresponding high voltage riser 56 so that all that is required for the connection to be made from the corresponding electrical feed line 7102, 7103, 7104, 7105, 7106 to the appropriate power distribution block 43. Since the integrated electrical assembly 10 may be prewired for high voltage electrical distribution by connection of wiring in the high voltage risers 56 to the power distribution blocks 43, the integrated electrical assembly 10 may act as a connection point between the electrical service and additional integrated electrical assemblies 10. For example, FIG. 71 shows the electrical service for floors 2-6 being connected to the integrated electrical assembly 10 and then onto the integrated electrical assemblies 10 for the corresponding floors. It is understood that this process can be repeated as many times a required to complete the wiring of the building structure, for example another integrated electrical assembly 10 can be used as another electrical distribution node for additional integrated electrical assemblies 10 on additional floors of the building structure. In this manner, the amount of time required for installation of wiring and/or runs could be reduced since the integrated electrical assembly 10 provides for a connection node for the high voltage electrical system within the building structure between individual units. This allows for the wiring to be installed in a controlled factory environment, tested and certified.

Figure 14:
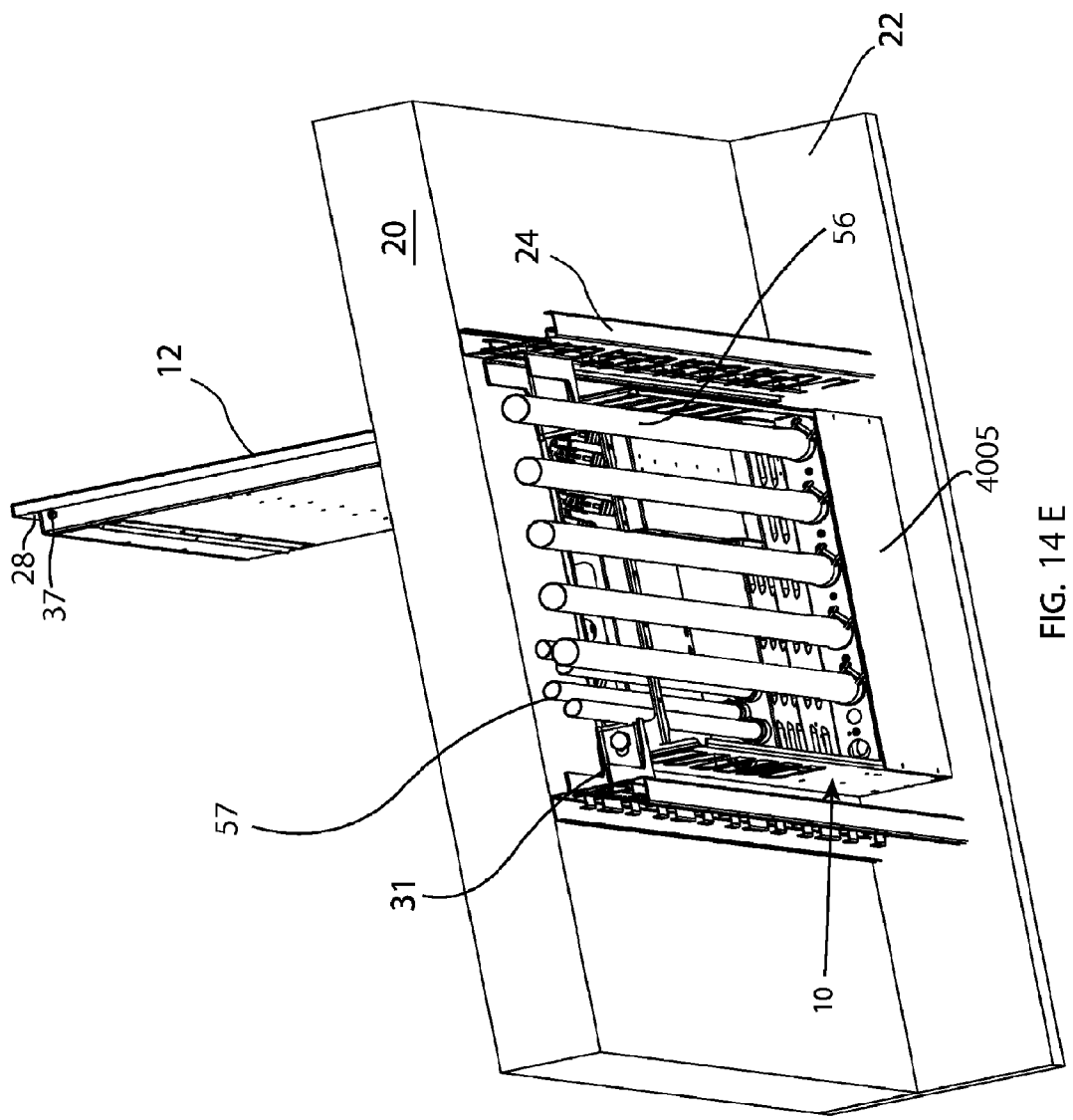
FIG. 14 is a rear view of the exemplary embodiment of the integrated electrical assembly installed on the exemplary wall with riser pipes removed for clarity.
Figure 16:
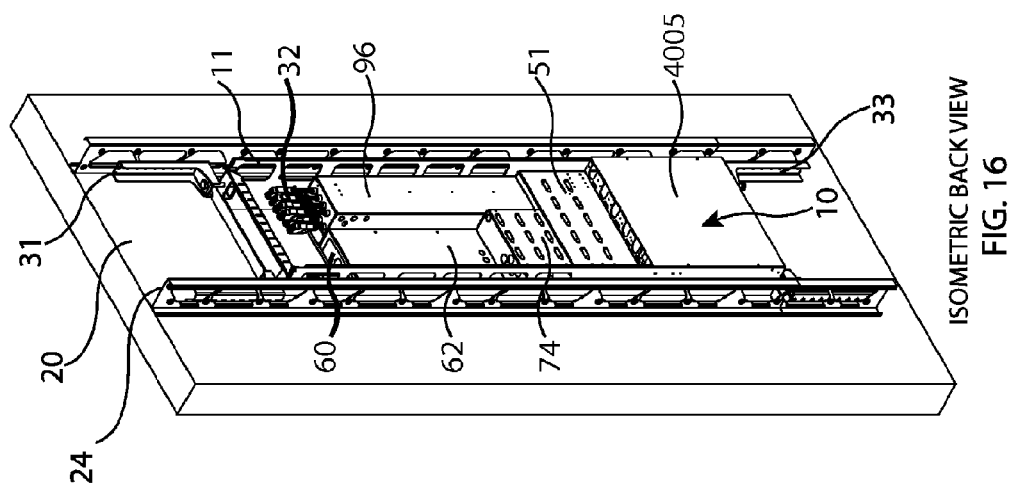
FIG. 16 is an isometric back view of the exemplary embodiment of the integrated electrical assembly installed on the exemplary wall.
Figure 15:
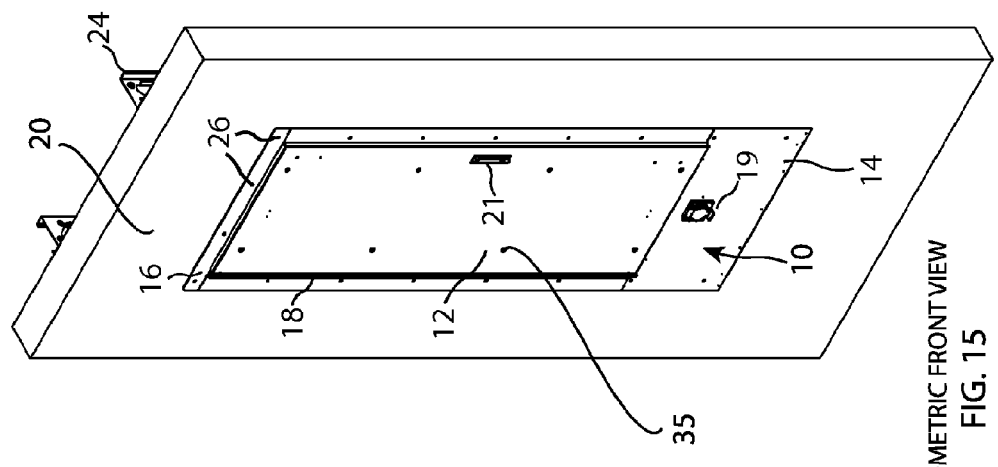
FIG. 15 is an isometric front view of the exemplary embodiment of the integrated electrical assembly installed on an exemplary wall.
Figure 19:
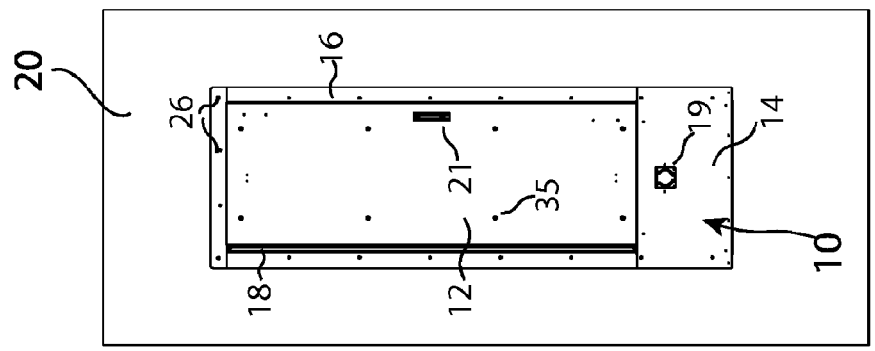
FIG. 19 is a front view of the exemplary embodiment of the integrated electrical assembly installed on the exemplary wall.
Figure 18:
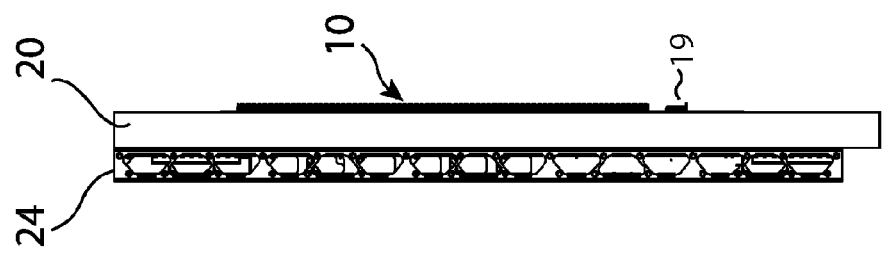
FIG. 18 is a left side view of the exemplary embodiment of the integrated electrical assembly installed on the exemplary wall.
Figure 17:
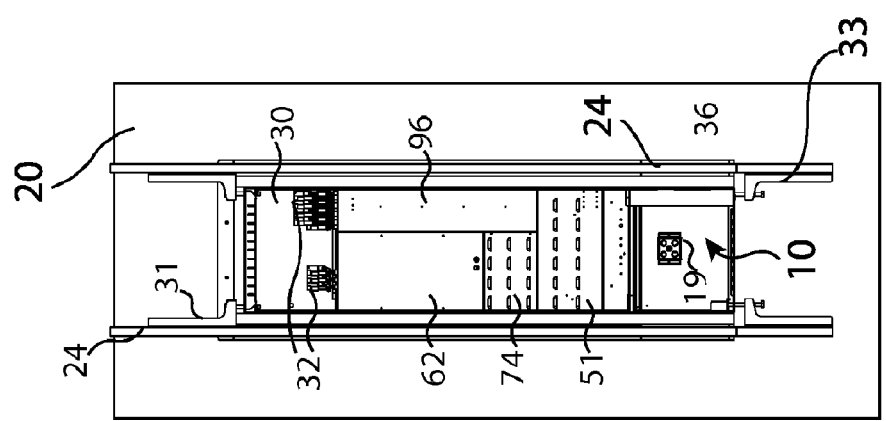
FIG. 17 is a back view of the exemplary embodiment of the integrated electrical assembly installed on the exemplary wall.
Figure 24:
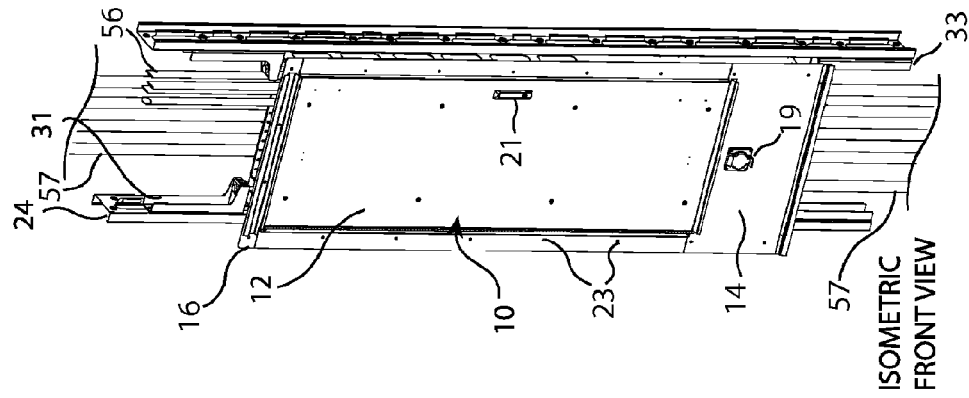
FIG. 24 is an isometric front view of the exemplary embodiment of the integrated electrical assembly configured for installation within a wall.
Figure 23A:
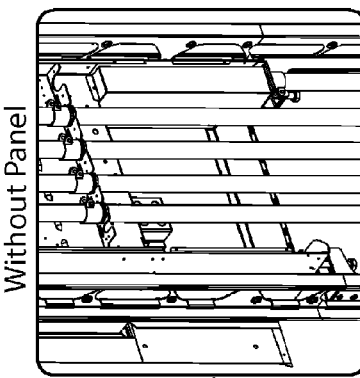
FIG. 23A is an expanded view of the exemplary embodiment of the integrated electrical assembly of FIG. 23 without a back panel.
Figure 23:
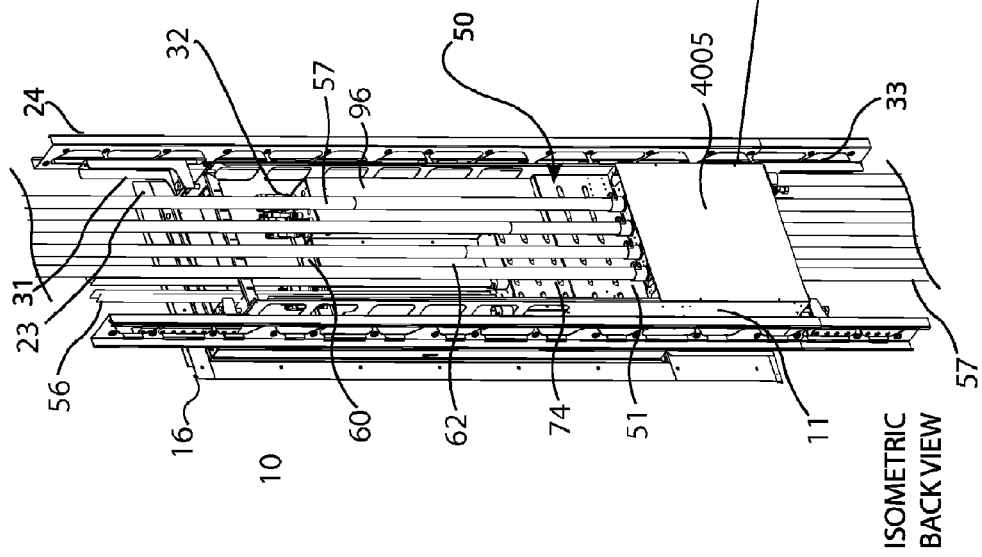
FIG. 23 is an isometric back view of the exemplary embodiment of the integrated electrical assembly configured for installation within a wall.
Figure 25:
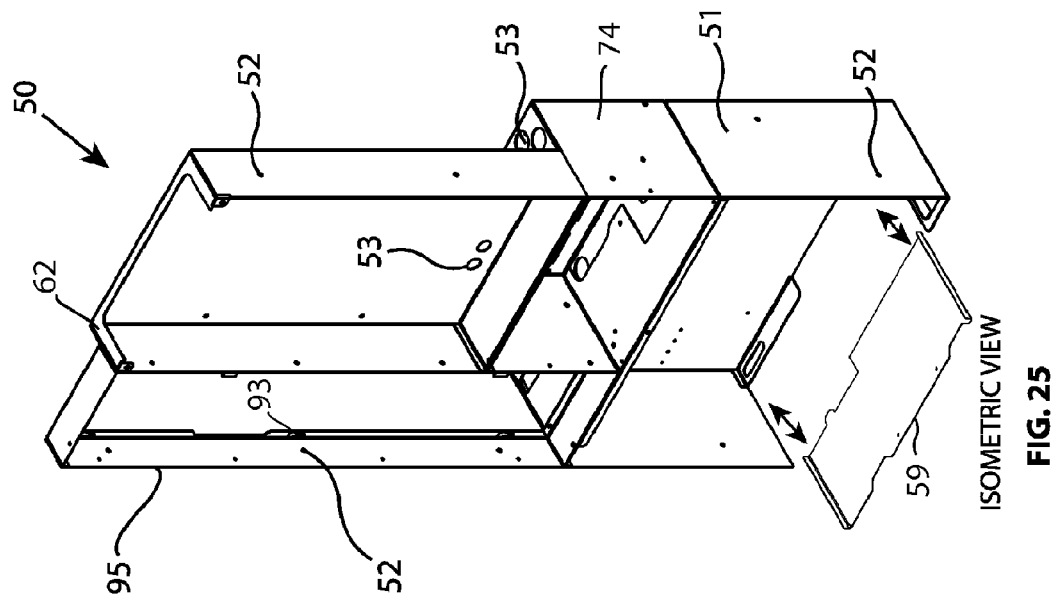
FIG. 25 is an isometric front view of an exemplary master tub that may be used with exemplary embodiments of the integrated electrical assembly according to aspects of the present invention.
Figure 26:
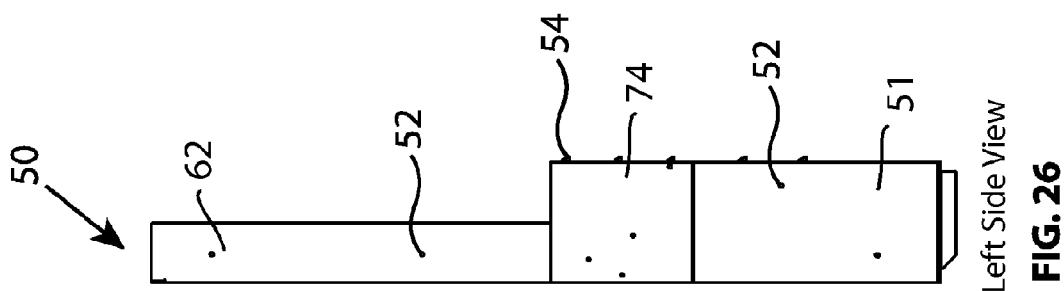
FIG. 26 is a left side view of the exemplary master tub that may be used with exemplary embodiments of the integrated electrical assembly according to aspects of the present invention.
Figure 30:
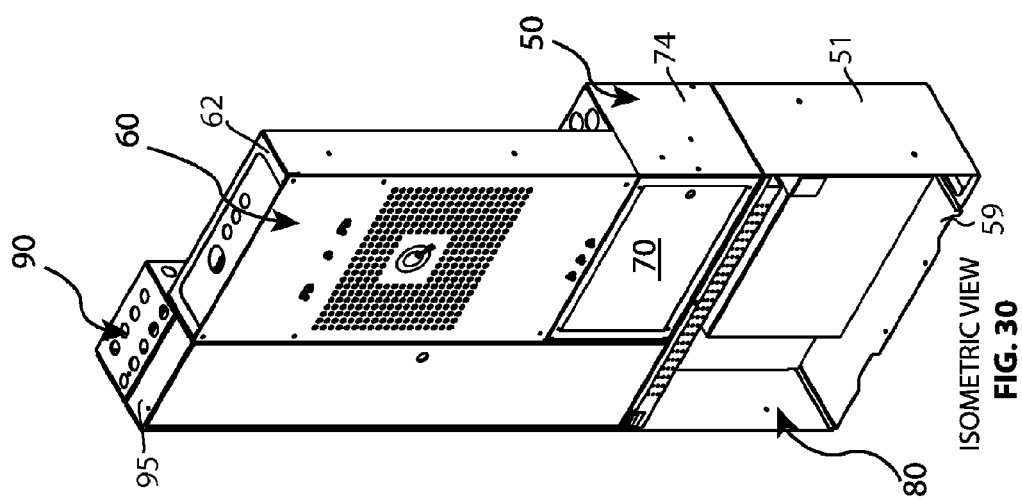
FIG. 30 is an isometric front view of the exemplary master tub with exemplary components installed therein.
Figure 31:
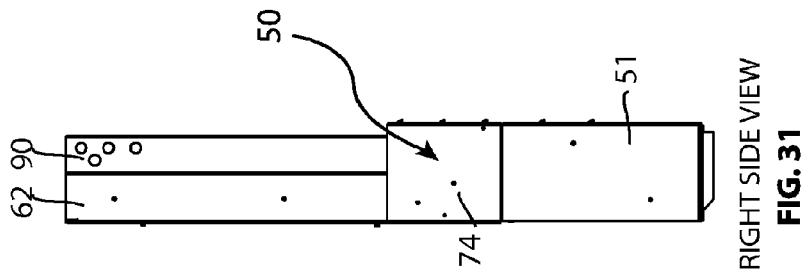
FIG. 31 is a right side view of the exemplary master tub with exemplary components installed therein.
Figure 35:
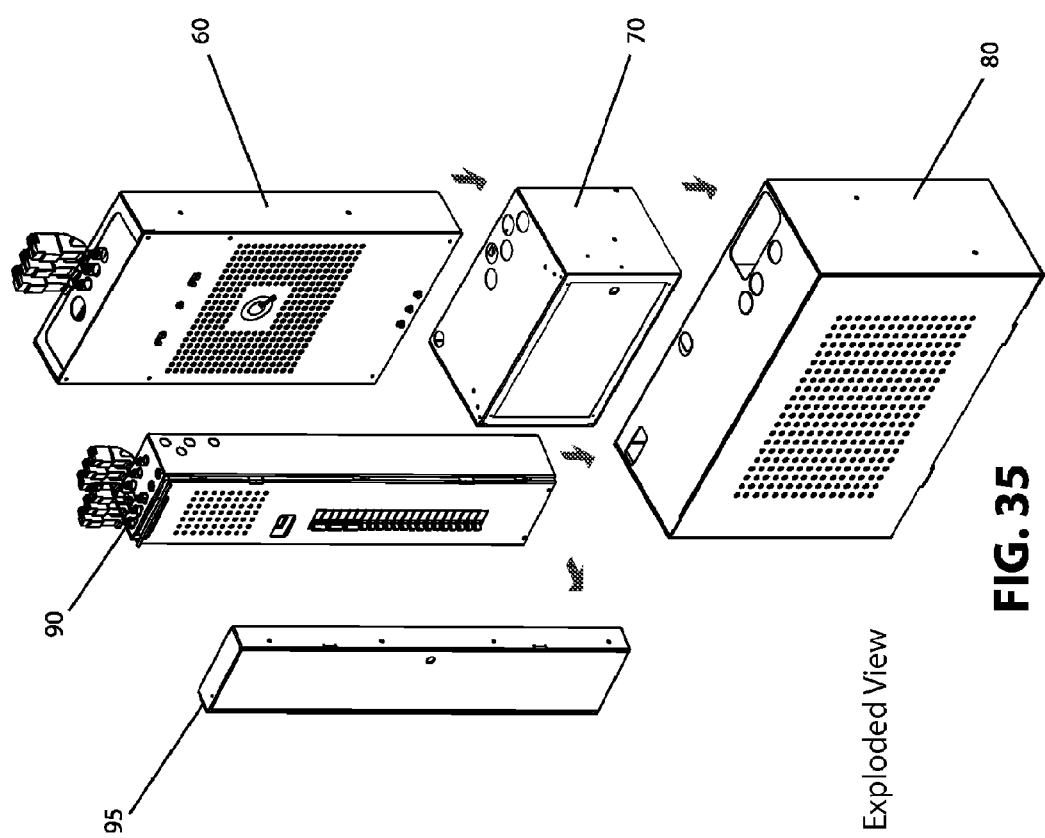
FIG. 35 is an exploded view isometric view of how the exemplary components may be arranged within the exemplary master tub according to aspects of the present invention.
Figure 39:
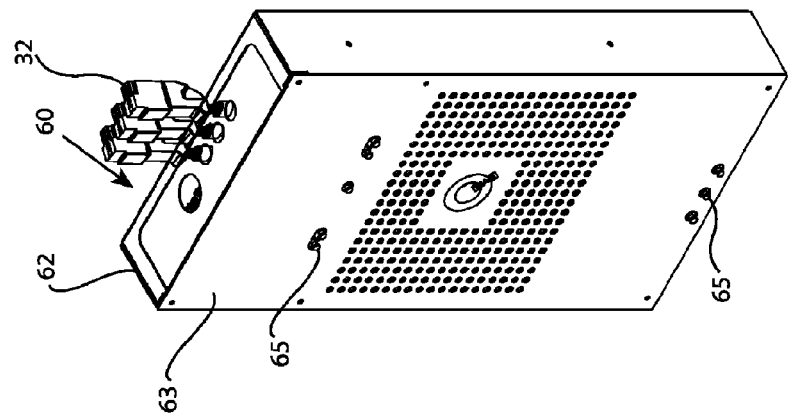
FIG. 39 is a front isometric view of the exemplary low voltage power supply unit that may be used with exemplary embodiments of the integrated electrical assembly according to aspects of the present invention.
Figure 37:
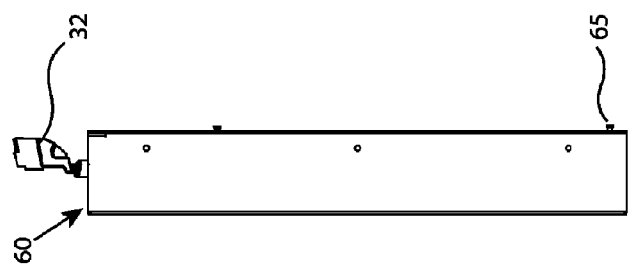
FIG. 37 is a side view of the exemplary low voltage power supply unit that may be used with exemplary embodiments of the integrated electrical assembly according to aspects of the present invention.
Figure 36:
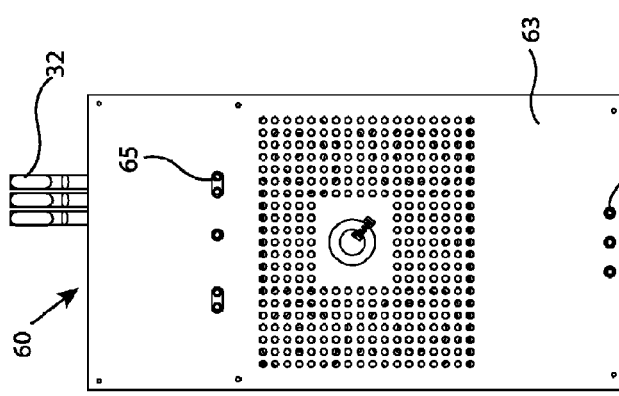
FIG. 36 is a front view of an exemplary low voltage power supply unit that may be used with exemplary embodiments of the integrated electrical assembly according to aspects of the present invention.
Figure 38:
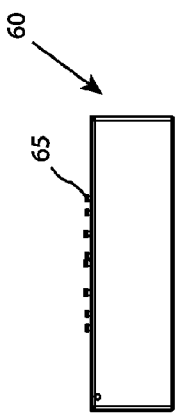
FIG. 38 is a bottom plan view of the exemplary low voltage power supply unit that may be used with exemplary embodiments of the integrated electrical assembly according to aspects of the present invention.
Figure 54:
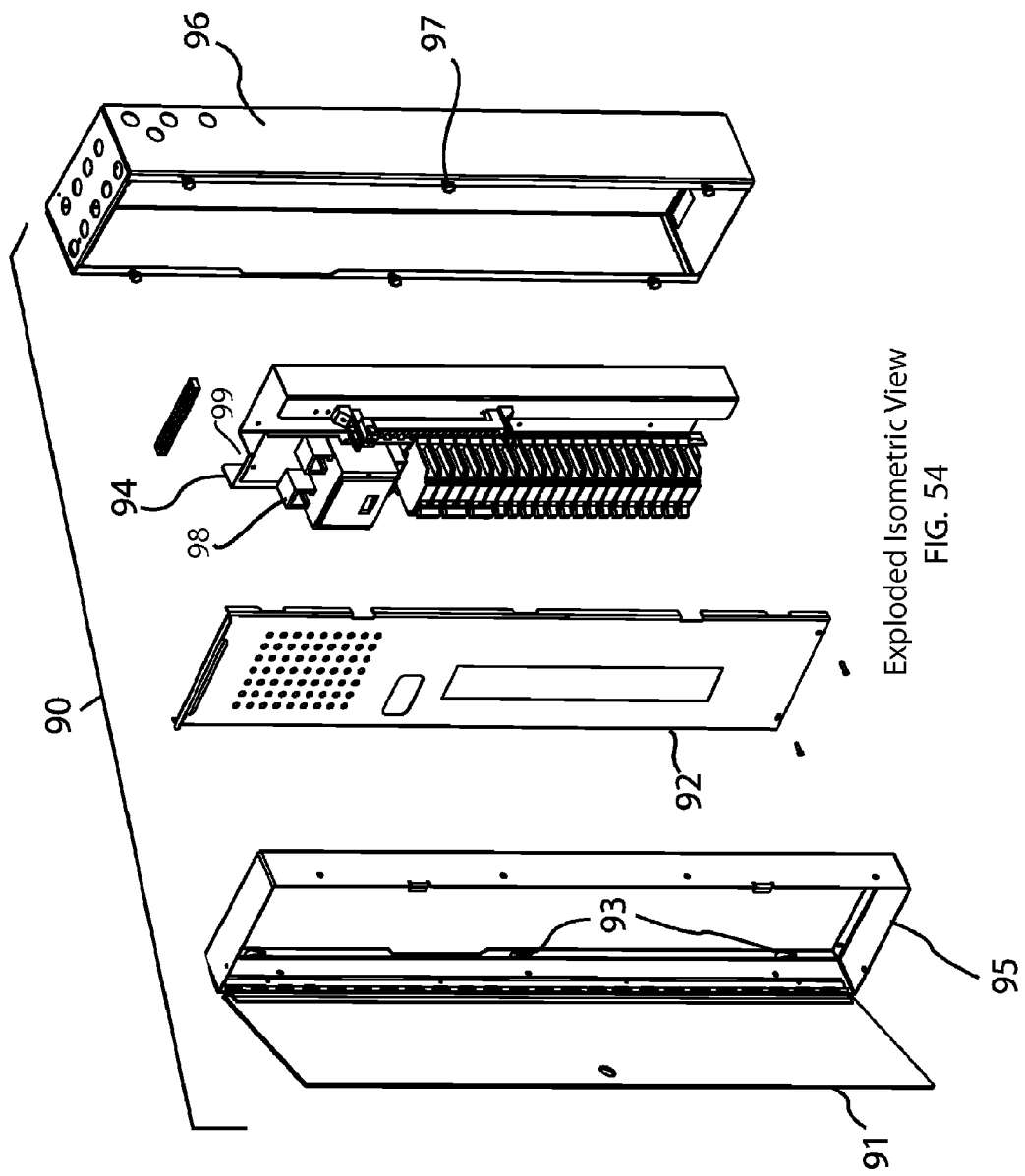
FIG. 54 is an exploded isometric front view of the exemplary load center that may be used with exemplary embodiments of the integrated electrical assembly according to aspects of the present invention.
Figure 62:
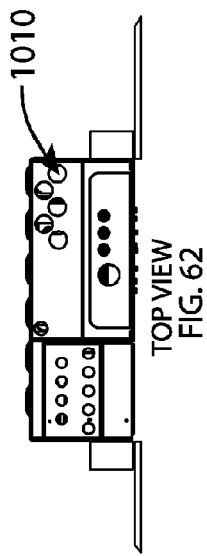
FIG. 62 is a top plan view of the other exemplary integrated electrical assembly according to the present invention.
Figure 60:
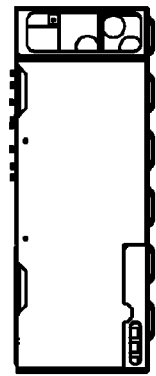
FIG. 60 is a bottom plan view of the other exemplary integrated electrical assembly according to the present invention.
Figure 61:
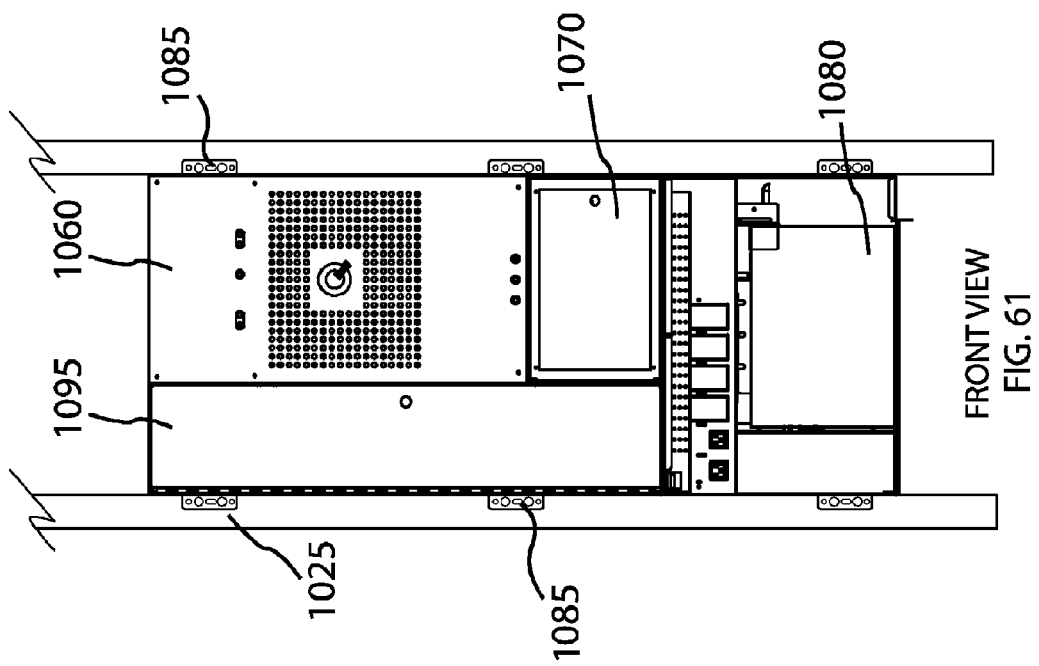
FIG. 61 is a front view of the other exemplary integrated electrical assembly according to the present invention with a front panel removed.
Figure 67:
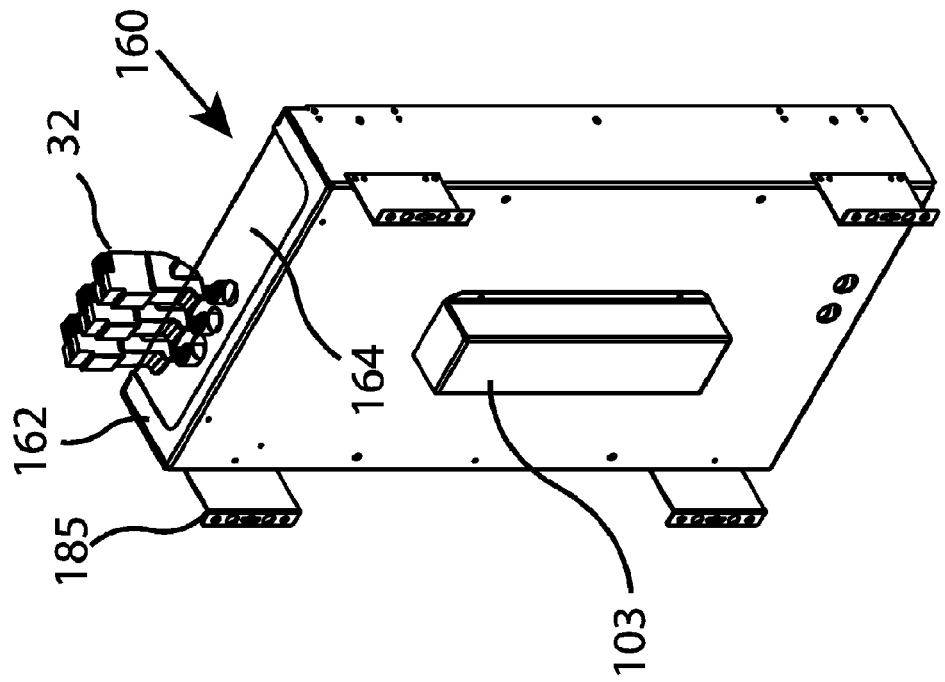
FIG. 67 is a back isometric view of the other exemplary low voltage power supply unit that may be used with exemplary embodiments of the integrated electrical assembly according to aspects of the present invention or may be provided as a standalone unit.
Figure 66:
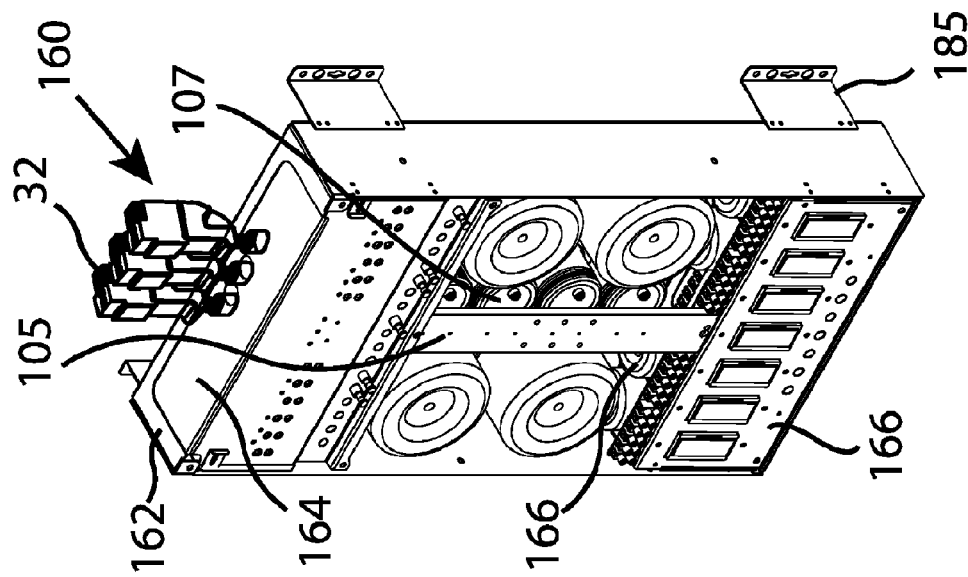
FIG. 66 is a front isometric view of the other exemplary low voltage power supply unit that may be used with exemplary embodiments of the integrated electrical assembly according to aspects of the present invention or may be provided as a standalone unit.
Figure 72:
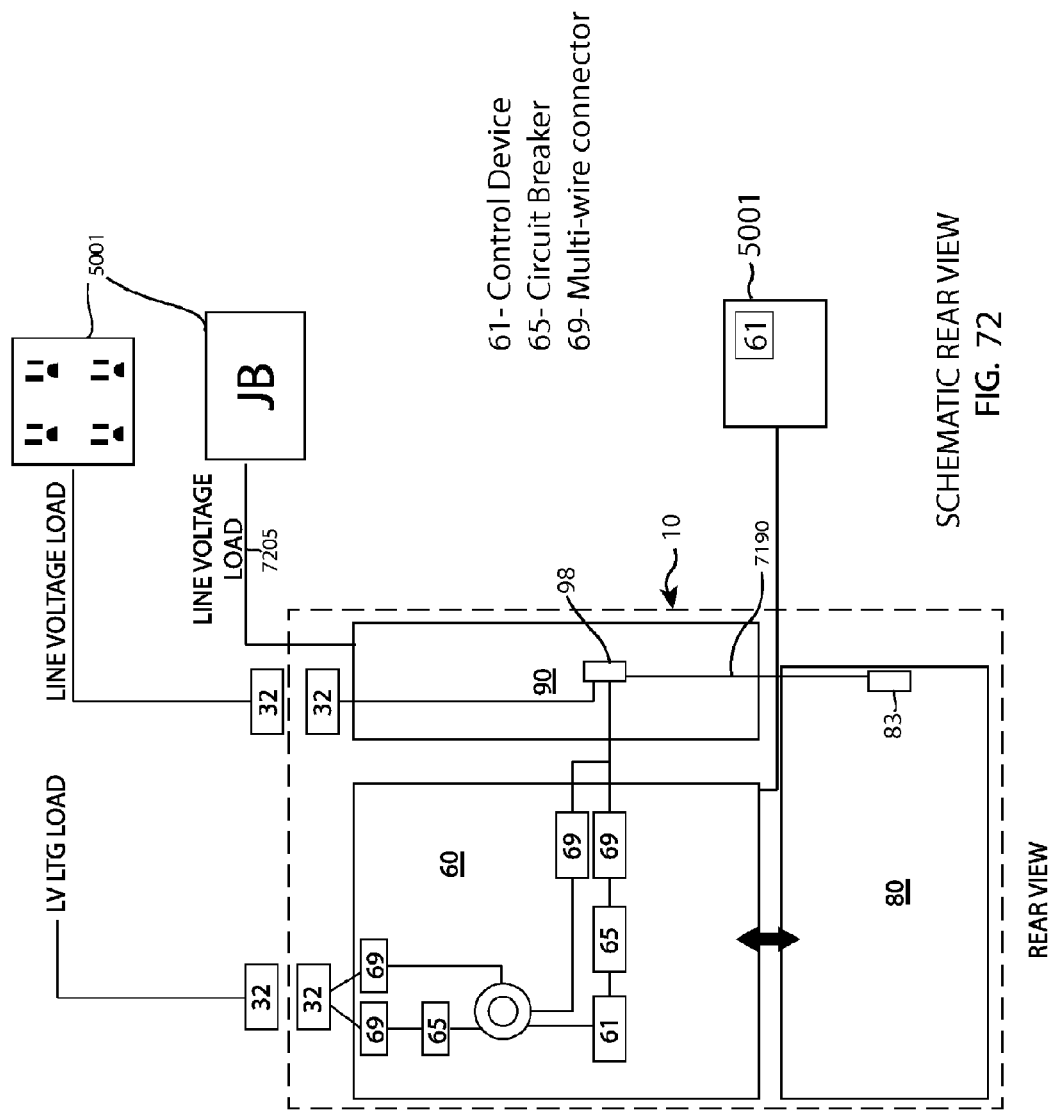
FIG. 72 is a generalized schematic view of exemplary electrical connections between exemplary components of the exemplary embodiments of the integrated electrical assembly according to the present invention.

Referring now to FIGS. 13, 14, 14A and 14B, the integrated electrical assembly 10 may also include a master tub 50 positioned therein for containing one or more components that may be located and/or secured in the integrated electrical assembly 10. The integrated electrical assembly 10 may also include an access panel 30 that provides for access to an area located above the master tub 50 in order to permit connections between wiring coming from the integrated electrical assembly 10 to the individual unit to be made. For example, one or more cable connectors 32, as shown in FIGS. 14, 14A and 14B, may be positioned in the area accessible through the access panel 30 in order to allow for the appropriate connections to be made. The one or more cable connectors 32 may be pre-wired whip connectors and/or color coded MC cable connectors. Referring now to FIG. 72 exemplary connections between one or more cable connectors 32 connected to one or more components, for example a low voltage power supply unit 60 and load center 90, and loads within the individual unit of the integrated electrical assembly 10 are shown. Since the cable connectors 32 are used to make the wiring connections between the components of the integrated electrical assembly 10 and loads of the individual unit, for example outlets, lighting, appliances, etc., the wiring from the components of the integrated electrical assembly 10 to the loads of the individual unit may be efficiently made. Furthermore, the one or more components of the integrated electrical assembly 10 can be easily removed and/or replaced for upgrade and/or repair since the components are pre-wired and connected to the loads of the individual unit through the cable connectors 32. This also reduces the amount of labor time required to install the integrated electrical assembly 10, because the connections can be made to prewired loads within the individual unit. The prewired loads of the individual unit could for example be contained in one or more junction boxes 5001 throughout the individual unit, and the junction boxes and related wiring may be prewired into the walls of the individual unit prior to construction of the individual unit within the building structure.

As further shown in FIGS. 13, 14, and 14B the integrated electrical assembly 10 may be secured to the wall supports 24 by one or more support brackets 31. The support brackets 31 are configured so as to be able to be adjustably secured to the wall supports 24 in a manner that allows for adjustment at both the wall support 24 and/or the integrated electrical assembly 10 through use of one or more support fasteners 44 configured to connect the support brackets 31 to the integrated electrical assembly 10. The support brackets 31 and connections between the support brackets 31, integrated electrical assembly 10 and wall supports 24 are configured so that the loading and stress of the integrated electrical assembly 10 may be shared between the wall 22 and the wall supports 24. In this manner, the integrated electrical assembly 10 may be preinstalled on a wall 22, and then the wall 22 may be transported to the building structure site and installed in the building structure with the potentially 300-700 lbs. integrated electrical assembly 10 being secured to the wall during transport and installation.

Referring now to FIGS. 25-29, the exemplary master tub 50 that may be used in the integrated electrical assembly 10 is shown in greater detail. The master tub 50 may contain one or more enclosures 51, 62, 74 that are configured and positioned to each contain at least one component that may be used in the integrated electrical assembly 10. The master tub 50 may also include a load center housing collar 95 that is configured to secure a load center to the master tub 50, as discussed further below. The enclosures 51, 62, 74 and load center housing collar 95 of the master tub 50 may be secured to each other by suitable means, such as by welding, bolting or riveting the enclosures 51, 62, 74 and load center housing collar 95 together in order to form the master tub 50. The one or more enclosures of the master tub 50 may include a main electrical feed enclosure 51, a low voltage enclosure 62 and/or a data-com enclosure 74. Each of the enclosures 51, 62, 74 and the load center housing collar 95 may include one or more securing holes 52 that may be used to secure the master tub 50 to the integrated electrical assembly 10 at one or more locations by suitable fastening devices (not shown), such as screws, bolts, pins or rivets. Each enclosure 51, 62, 74 may also include one or more opening/knock-out 53 in order to allow wiring and other connections to be made to the components contained within the master tub 50. The enclosures 51, 62, 74 may also include ventilation ports 54 in order to provide air cooling and/or circulation for the components that may be installed in each enclosure 51, 62, 74. The master tub 50 provides for separate enclosures 51, 62, 74 and the load center housing collar 95 for the various components that may be included in the integrated electrical assembly 10 in order to allow for separate National Recognized Testing Laboratory (NRTL) or foreign equivalent listings for each enclosure. The integrated electrical assembly 10 may be configured so as to provide an inherently protected type NRTL listing that requires zero clearance to combustible materials for installation in wood stud wall and clothing closets with closes in direct contact with such enclosures 51, 62, 74. The master tub 50 may also include a removable access panel 59 that is removable from the main electrical feed enclosure 51. The removable access panel 59 is configured to provide access to the power distribution blocks 43 of the master feed enclosure 40 in order to allow for installation of electrical feeds to the power distribution blocks 43 in the master integrated electrical assembly 10. The removable access panel 59 also provides for access to the power distribution blocks 43 so as to allow for maintenance, such as tightening of connections made by the power distribution blocks 43.

Referring now to FIGS. 30-35, exemplary components that may be installed in the master tub 50 are shown. For example, the exemplary components may include a low voltage power supply unit 60, a data-com component 70, a main electrical feed unit 80 and/or a load center 90. Each one of these components may be configured to obtain a separate NEMA 1 or equivalent NRLT listing for dry environments. It is understood that the present invention is not limited to any particular type of component or number of components that may be included in the master tub 50 and/or the integrated electrical assembly 10. It is contemplated that a variety of types of components, configuration of components and number of components may be used in various aspects of the present invention, and it is understood that the components and component configurations herein discussed and shown are merely exemplary.

Referring now to FIGS. 36-43 and 43A, an exemplary low voltage power supply unit 60 that may be installed in the integrated electrical assembly 10 according to the present invention or used as a standalone unit is shown. The low voltage power supply unit 60 may be installed in the low voltage enclosure 62 of the master tub 50 or include a separate low voltage enclosure 62. It is understood that by providing the low voltage power supply unit 60 with the capability of being installed in the low voltage enclosure 62 of the master tub 50, a power tray 64 of the low voltage power supply unit 60 can be pre-wired and pre-fabricated, and then merely attached to the low voltage enclosure 62 of the master tub 50 of the integrated electrical assembly 10. In addition, in the event that the low voltage power supply unit 60 needs to be replaced for upgrade and/or repair the power tray 64 of the low voltage power supply unit 60 can be easily removed and replaced. The low voltage power supply unit 60 may also be provided with a low voltage cover 63 for installation over the power tray 64 position within the low voltage enclosure 62.

Still referring to FIGS. 36-43 and 43A, the power tray 64 is configured to contain one or more components of the low voltage power supply unit 60. For example, the power tray 64 may include a line voltage control compartment 66 with a fold-out door for accessibility to the line voltage control compartment 66, and a low voltage connection compartment 68 that may also include a fold-out door for accessibility to the low voltage connection compartment 68. However, it is understood that the line voltage control compartment 66 and the low voltage connection compartment 68 may also not be provided with a fold-out door, as shown for example in FIG. 43, and in this configuration the components within the compartments may be secured directly to the compartments. It is also understood that separating the line voltage from the low voltage components provides for additional electronic shock safety. The low voltage connection compartment 68 may be configured for making appropriate low voltage connections between the low voltage power supply unit 60 and low voltage devices of the building structure and/or individual units of the building structure. The line voltage control compartment 66 may include one or more control devices 61, for example dimmers, timers and/or switches that may be manually, wired or wirelessly controlled, for example by RF control. The line voltage control compartment 66 may also include one or more multi-wire connectors 69. The low voltage connection compartment 68 may also include one or more multi-wire connectors 69 that are configured to connect wiring from the one or more cable connectors 32 that may be installed on the low voltage power supply unit 60.

Figure 73:
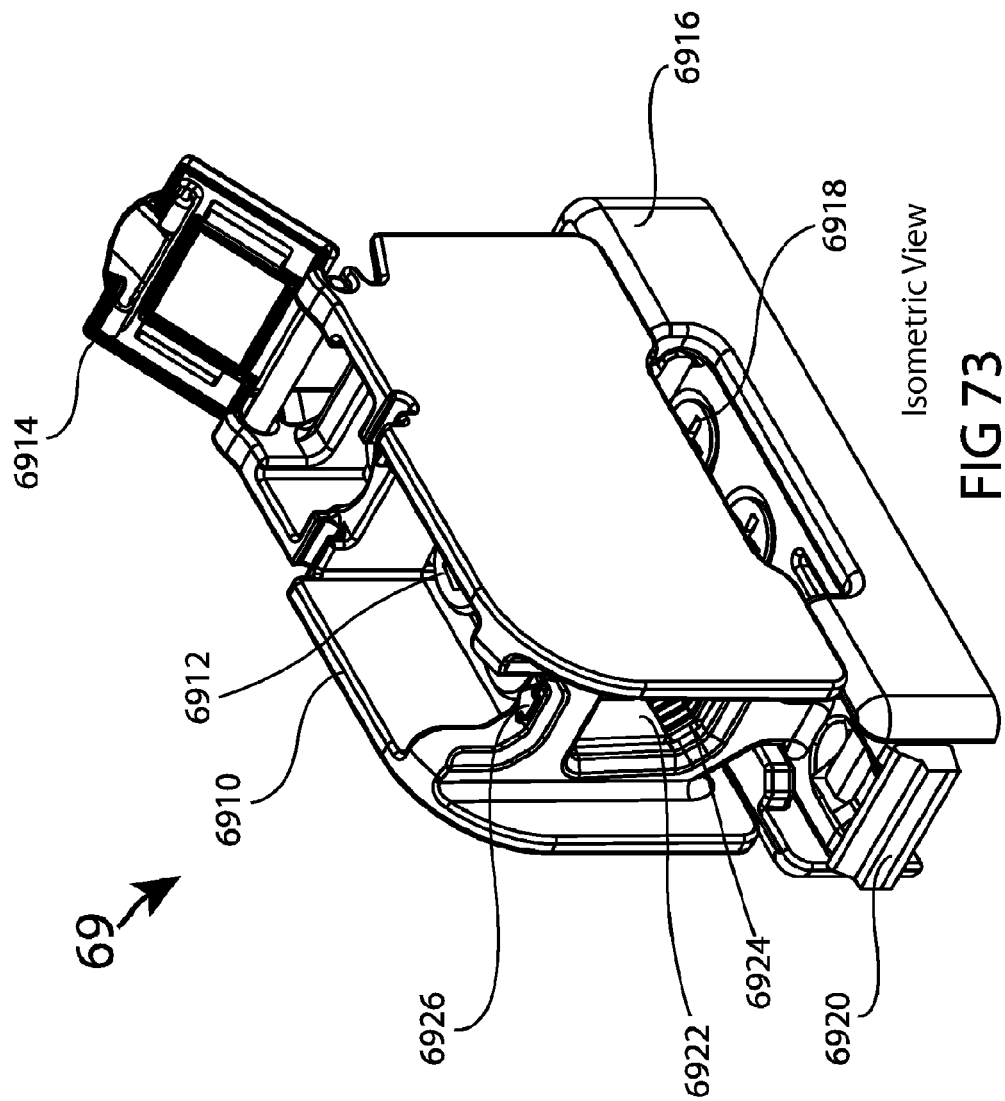
FIG. 73 is an isometric view of an exemplary multi-wire connector that may be used with the integrated electrical assembly according to the present invention.

An exemplary multi-wire connector 69 that may be used with the low voltage power supply unit 60 is shown in detail in FIGS. 73-85 and 75A-81A. The multi-wire connector 69 may include a terminal block 6922 that contains at least two set screws 6912 that can be loosened and tightened relative to the terminal block 6922. The terminal block 6922 may be made from tin or nickel plated copper or copper alloy, and the set screws 6912 may be made from a stainless steel. The terminal block 6922 may preferably have one or more grooves 6924 formed in a bottom surface of the terminal block 6922. The grooves 6924 are configured and positioned within the terminal block 6922 so as to provide an improved frictional surface for the capture of wires installed in the terminal block. The multi-wire connector 69 may also include a housing 6910 that is dimensioned to receive and contain the terminal block 6922, but allow for ventilation space 6935 between the housing 6910 and the terminal block 6922. The ventilation space 6935 is configured for dissipation of heat that may be generated by the terminal block 6922 while in use, and reduces the amount of heat that may be retained by the housing 6910 of the multi-wire connector. Since ampacity is determined by temperature rise, the ventilation space 6935 provides for higher ampacity ratings for multi-wire connector 69, lower operating temperatures and an increased level of safety. The housing 6910 may be made from a polycarbonate resin thermoplastic, and may preferably be transparent and/or clear, which facilitates installation and inspection by allowing increased visualization of the components of the multi-wire connector 69. The housing 6910 may include a strip length guide 6926 in order to facilitate proper installation of wiring into the multi-wire connector 69. The housing 6910 of the multi-wire connector 69 may also include a set screw cover 6914 positioned over at least one of the set screws 6912 and configured for movement between an open (e.g FIG. 73) and a closed position (e.g. FIG. 78). The set screw cover 6914 may also contain an indication (not shown) that provides information regarding the multi-wire connector 69. The set screw cover 6914 also provides an openable cover to prevent an installer from adjusting and/or loosening of a set screw 6912 that may connect to wiring that has been pre-wired prior to installation of the multi-wire connector 69, a color coded plug in (not shown) may also be inserted into the set screw 6912 to provide additional visual indications. The housing 6910 of the multi-wire connector 69 may also include mounting tabs 6928, 6930 that are configured to secure the housing 6910 to a base mount 6916 that may also be included in the multi-wire connector 69. The base mount 6916 may include a housing lock and release tab 6920, the operation and function of which will be discussed further below. The base mount 6916 may be made from polycarbonate resin thermoplastic.

Referring particularly to FIGS. 73-83, which show the housing 6910 of the multi-wire connector 69 attached to the base mount 6916, one of the mounting tabs 6930 may slide into the base mount 6916, and then the housing 6910 pressed towards the base mount 6916 in order to cause the other mounting tab 6928 to be secured by the housing lock and release tab 6920. The housing lock and release tab 6920 may be configured to snap onto the mounting tab 6928 in order to removably secure the housing 6910 to the base mount 6916, as shown for example in FIGS. 76B and 76C. Base mount 6916 allows for inspection during installation, facilitates maintenance and shortens installation time. Furthermore, one or more base mounts 6916 may be molded together in order to provide a bank of base mounts 6916 for one or more housings 6910 to be secured to.

Figure 80:
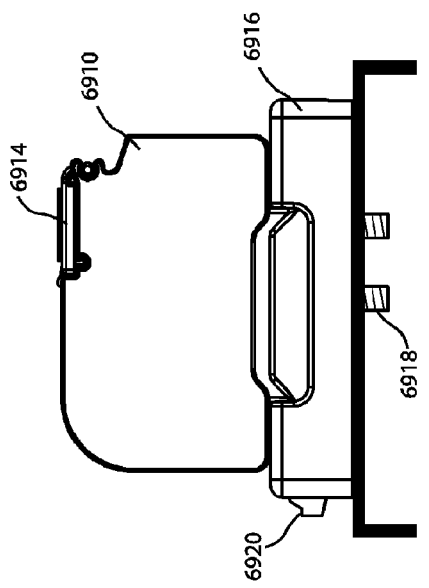
FIG. 80 is a front view of the exemplary multi-wire connector that may be used with the integrated electrical assembly according to the present invention mounted to an exemplary surface.
Figure 81:
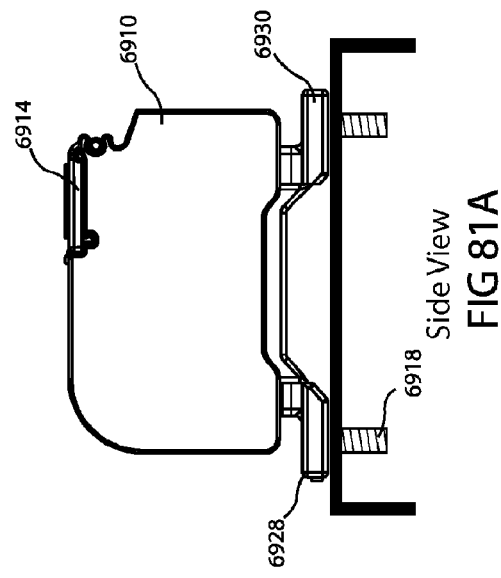
FIG. 81 is a side view of the exemplary multi-wire connector that may be used with the integrated electrical assembly according to the present invention mounted to an exemplary surface.
Figure 80A:
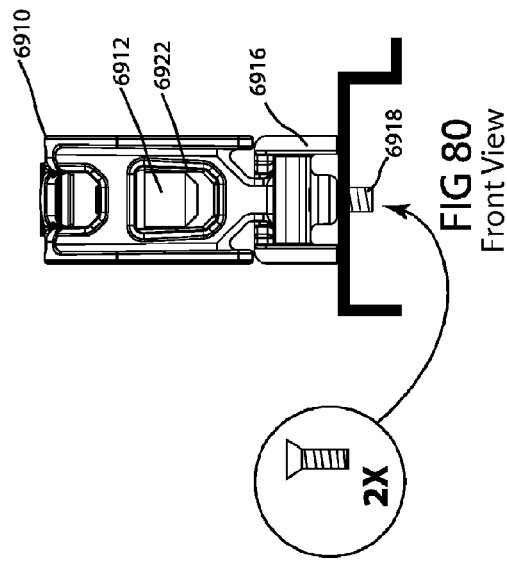
FIG. 80A is a front view of the exemplary multi-wire connector without a base mount that may be used with the integrated electrical assembly according to the present invention mounted to an exemplary surface.
Figure 81A:
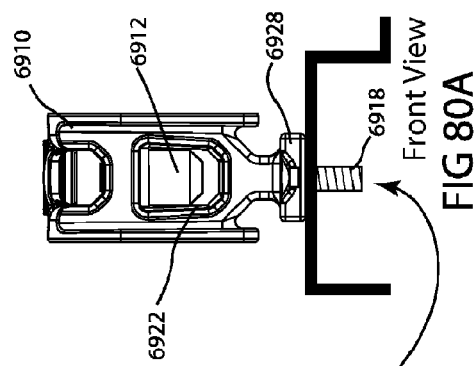
FIG. 81A is a side view of the exemplary multi-wire connector without a base mount that may be used with the integrated electrical assembly according to the present invention mounted to an exemplary surface.

Referring now to FIGS. 80-81, the multi-wire connector 69 may be secured to a surface by one or more mounting fasteners 6918 secured to the base mount 6916 and the surface. In this configuration, the multi-wire connector 69 may be removed from the base mount 6916 in order to facilitate wiring connections made with the multi-wire connector 69. In the alternative, as shown in FIGS. 80A-81A, the multi-wire connector 69 may be secured directly to a surface by one or more mounting fasteners 6918 through the mounting tabs 6928, 6930. The mounting fasteners 6918 may be any known fasteners, such as screws or bolts.

The multi-wire connector 69 is configured to secure at least one wire to the terminal block 6922 by one of the set screws 6912, and then at least one other wire to the terminal block 6922 by the other set screws 6912. Preferably, two set screws 6912 may be used to secure more than one wire to the terminal block 6922. For example, the multi-wire connector 69 may be configured to accommodate any combination of wire types and sizes, and preferably may be configured to be Underwriters Laboratories (UL) listed as a recognized component that can accommodate any wire size from No. 18 AWG to No. 1/0, and even more preferably may be configured to accommodate at least 1-2 No. 4 AWG, 1-4 No. 6 AWG, 1-6 No. 8 AWG, 1-10 No. 10 AWG, 1-16 No. 12 AWG, 1-25 No. 14 AWG, 1-40 No. 16 AWG and/or 1-65 No. 18 AWG. The multi-wire connector 69 may also be configured for voltages up to and including 600V, and amperage up to and including 150 amps. The multi-wire connector 69 may also be configured to obtain UG ratings of B, C and/or D. A multi-wire connector terminal block greatly improves the quality of installation, shortens installation time and thereby lowers labor related costs.

Referring now to FIG. 72, in which an exemplary use of the multi-wire connector 69 for the integrated electrical assembly 10 is shown. The multi-wire connector 69 may be used to connect one or more wires coming from the load center 90 to the low voltage power supply unit 60. In this manner, the connections from the components of the low voltage supply unit 60 have already been made to the multi-wire connector 69 so that all that is required to connect the load center 90 wiring to the low voltage power supply unit 60 is connections between the wiring and the multi-wire connector 69.

Referring again to FIGS. 36-43 and 43A, the power tray 64 may also be configured to contain one or more transformers, for example torrodial transformers, current transformers, bridge rectifiers, capacitors, inductors, such as chokes, electronic drivers, for example electronic LED drivers and dimmers. The power tray 64 of the low voltage power supply unit 60 may be configured for AC or DC output depending upon the load requirements to the individual unit of the building structure. For example, the low voltage power supply unit 60 may be configured to supply the lighting systems of the individual unit and/or building structure. Some advantages of low voltage lighting include that it is safer than line voltage lighting, allows for smaller fixtures, reduces noise, has minimal EMF and allows for live conductors to be used, such as cable or rail conductor systems. It is generally understood that low voltage refers to voltage levels of 30V or less, which many believe to be healthier than higher voltages. The power tray 64 may also include one or more 120/120V isolated power supplies for hospital related purposes. As shown for example in FIGS. 41-43 and 43A the power tray 64 of the low voltage power supply unit 60 may include at least one transformer 67 and may include at least one inductor 6. The low voltage power supply unit 60 may also include one or more circuit breakers 65, which may be provided to protect line voltage and/or low voltage circuits.

Referring now to FIGS. 63-67, another exemplary low voltage power supply unit 160 that may be installed in the integrated electrical assembly 10 according to the present invention or used as a standalone unit is shown. The low voltage power supply unit 160 may be installed in the low voltage enclosure 62 of the master tub 50 or include a separate low voltage enclosure 162. The low voltage power supply unit 160 may also be provided with a low voltage cover 163 for installation over the low voltage enclosure 62, 162. In order to provide the low voltage power supply unit 160 as a standalone unit, one or more surface wall mounting brackets 185 may be affixed to the low voltage enclosure 162 in order to provide a mechanism for securing the low voltage power supply unit 160 to a wall surface. The power tray 164 may include a line voltage control compartment 166 with a fold-out door for accessibility to the line voltage control compartment 166, and a low voltage connection compartment 168 that may also include a fold-out door for accessibility to the low voltage connection compartment 168. The low voltage connection compartment 168 may be configured for making appropriate low voltage connections between the low voltage power supply unit 160 and low voltage devices of the building structure and/or individual units of the building structure. The line voltage control compartment 166 may include one or more control devices 161, for example dimmers, timers and/or switches that may be manually, wired or wirelessly controlled, such as RF controlled. The line voltage control compartment 166 may also include one or more multi-wire connectors (not shown). The low voltage connection compartment 168 may also include one or more multi-wire connectors (not shown) that are configured to connect wiring from the one or more connectors (not shown) that may be installed on the low voltage power supply unit 160. In this exemplary embodiment of the low voltage power supply unit 160, the power tray 164 may include at least one transformer 167, at least one inductor 106, at least one capacitor 107 and at least one bridge rectifier 105 or combinations thereof. However, it is understood that the present invention is not limited to any particular combinations or types of components installed in the power tray 164 of the low voltage power supply unit 160. Instead, it is understood that any combination of transformers, inductors, capacitors, rectifiers and/or dimmers may be included in the low voltage power supply unit 160. In the event that one or more capacitors 107 are included in the low voltage power supply unit 160, the low voltage enclosure 162 may include an extension cover 103 for covering the part of the capacitors 107 that may extend out of the low voltage enclosure 162. The low voltage power supply unit 160 may also include one or more circuit breakers 165, which may be provided to protect line voltage and/or low voltage circuits.

Figure 70:
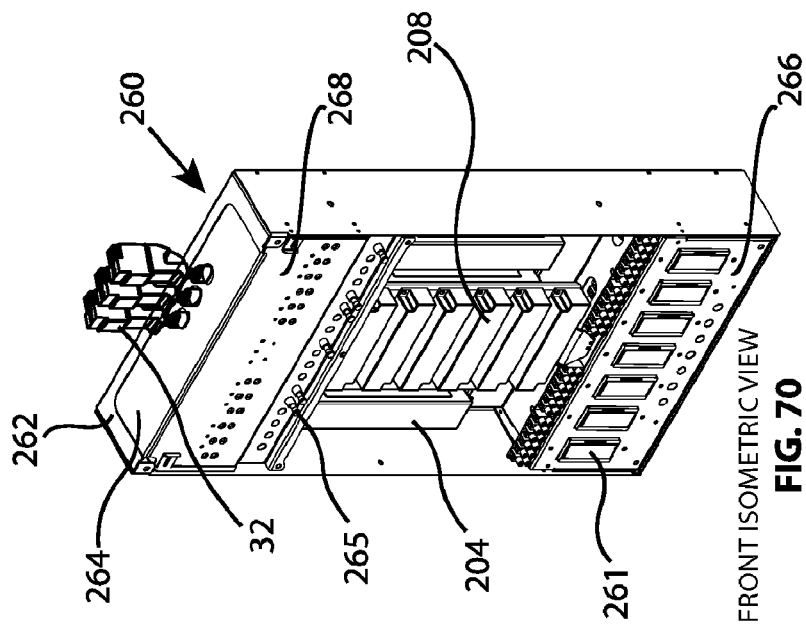
FIG. 70 is a front isometric view of the other exemplary low voltage power supply unit that may be used with exemplary embodiments of the integrated electrical assembly according to aspects of the present invention or may be provided as a standalone unit.
Figure 69:
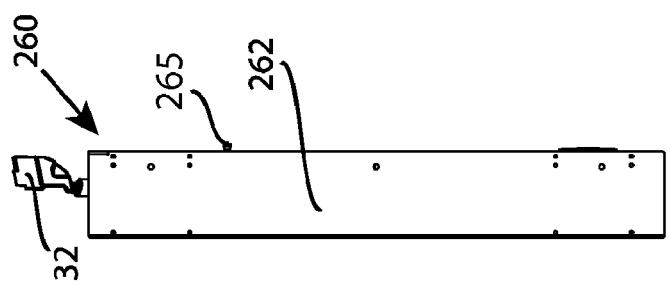
FIG. 69 is a side view of the other exemplary low voltage power supply unit that may be used with exemplary embodiments of the integrated electrical assembly according to aspects of the present invention or may be provided as a standalone unit.
Figure 68:
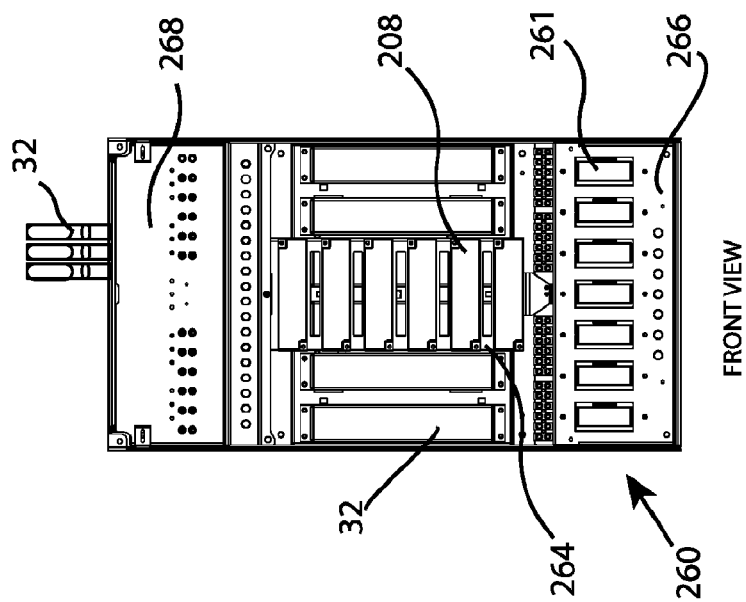
FIG. 68 is a front view of yet another exemplary low voltage power supply unit that may be used with exemplary embodiments of the integrated electrical assembly according to aspects of the present invention with a front panel removed.

Referring now to FIGS. 68-70, another exemplary low voltage power supply unit 260 that may be installed in the integrated electrical assembly 10 according to the present invention or used as a standalone unit is shown. The low voltage power supply unit 260 may be installed in the low voltage enclosure 62 of the master tub 50 or include a separate low voltage enclosure 262. The low voltage power supply unit 260 may also be provided with a low voltage cover (not shown) for installation over the low voltage enclosure 62, 262. The low voltage power supply unit 260 may include a power tray 264. The power tray 264 may include a line voltage connection compartment 266 with a fold-out door for accessibility to the line voltage connection compartment 266, and a low voltage connection compartment 268 that may also include a fold-out door for accessibility to the low voltage connection compartment 268. The low voltage connection compartment 268 may be configured for making appropriate low voltage connections between the low voltage power supply unit 260 and low voltage devices of the building structure and/or individual units of the building structure. The line voltage connection compartment 266 may include one or more control devices 261, for example dimmers, timers and/or switches that may be manually, wired or wirelessly controlled, such as RF controlled. The line voltage connection compartment 266 may also include one or more multi-wire connectors (not shown). The low voltage connection compartment 268 may also include one or more multi-wire connectors (not shown) that are configured to connect wiring from the one or more connectors (not shown) that may be installed on the low voltage power supply unit 260. In this exemplary embodiment of the low voltage power supply unit 260, the power tray 264 may include at least one electronic LED driver 204 and may include at least one driver dimmer 208. However, it is understood that the present invention is not limited to any particular combinations or types of components installed in the power tray 264 of the low voltage power supply unit 260. Instead, it is understood that any combination of transformers, inductors, capacitors, rectifiers and/or dimmers may be included in the low voltage power supply unit 260. The low voltage power supply unit 260 may also include one or more circuit breakers 265, which may be provided to protect line voltage and/or low voltage circuits.

Referring now to FIGS. 44, 44A-44D and 45-47, an exemplary data-com component 70 that may be installed in the integrated electrical assembly 10 according to the present invention is shown. The data-come component 70 may be installed in the data-com enclosure 74 of the master tub 50. The data-com component 70 may include an access door 72, which may be formed from solid steel, have a steel frame with a plastic door or be formed from a clear plastic or similar material, and a data-com panel 76 configured for allowing appropriate connections to be made to the data-com component 70. The data-com panel 76 is configured for removal from the data-com component 70 in order to allow installation and/or repair of the wiring connected to the data-com panel 76. In addition, since the data-com panel 76 may be removal, the data-com panel 76 can be upgraded to accommodate newer technologies. The data-com component 70 may also include one or more openings/knock-outs 77 in order to allow wiring and/or other parts of the data-com component 70 to be connected to other locations outside of the data-com component 70. The data-com component 70 within the data-com enclosure 74 may be a Class 2 enclosure, and the data cables provided to the enclosure may be run inside flexible plastic conduit. This allows for efficient re-wiring of the data-com component 70 in the event of repair and/or upgrade to the wiring of the data-com component 70. Exemplary wires and components that may be run into and included in the data-com component include television wires, such as coaxial cables, fiber optics, CAT 5 or higher communication wires, routers, and other entertainment, WI-FI and telephone wires and components. For example, as shown in FIG. 86, the data-com component 70 of the integrated electrical assembly 10 may be configured to receive one or more data-com wires and/or conduits from a data-com distribution panel of the building structure. The data-com wire for the individual unit of the integrated electrical assembly 10 may then be connected to the data-com panel 76 of the data-com component 70 in order to provide the appropriate data-com services to the ports of the data-com panel 76. Additional data-com wires and/or conduits are passed through the data-com component 70 of the integrated electrical assembly 10 and into one or more low voltage risers 57 (shown in greater detail in FIGS. 14C, 14D and 14E) that are connected to another integrated electrical assembly 10 on a separate floor of the building structure. The additional data-corn wires and/or conduits are then appropriately connected to the data-corn panel 76 of the data-corn component 70 for that integrated electrical assembly 10. Since the data-corn components 70 of the integrated electrical assemblies 10 of the building structure are connected in this manner it allows for efficient re-wiring of the data-corn components 70 from the data-corn distribution panel in order to allow for upgrades and/or repairs to be made to the data-corn system of the building structure.

Now referring to FIGS. 48, 48A, 49, 50A, 50B and 51, an exemplary main electrical feed unit 80 that may be installed in the integrated electrical assembly 10 according to the present invention is shown. The main electrical feed unit 80 of the integrated electrical assembly includes an electrical assembly power distribution block 83 that is configured for connection to an electrical feed line from an electrical room, if the integrated electrical assembly 10 is acting as the master electrical distribution node for slave integrated electrical assemblies 10, or to an electrical feed line from the master integrated electrical assembly 10 acting as the electrical distribution node. These arrangements are shown for example in FIG. 71, in which the electrical feed line 7101 for the master integrated electrical assembly 10 is connected to the electrical assembly power distribution block 83, and the other feed lines 7102, 7103, 7104, 7105, 7106 are connected to the power distribution blocks 43 of the master integrated electrical assembly 10, and then connected to each respective slave integrated electrical assembly 10 by the high voltage risers 56 containing wiring connected to the power distribution blocks 43 of the master integrated electrical assembly 10 and the electrical assembly power distribution blocks 83 of the slave integrated electrical assemblies 10. The electrical assembly power distribution block 83 is also configured for connection to one or more lugs 98 of the load center of the integrated electrical assembly 10, as discussed further below.

Referring again to FIGS. 48, 48A, 49, 50A, 50B and 51, the main electrical feed unit 80 may also include a high voltage feed cover 8005 positioned to form a compartment within the main electrical feed unit 80 for the electrical assembly power distribution block 83 and the high voltage lines connected to the electrical assembly power distribution block 83. The main electrical feed unit 80 may also be configured in order to provide back-up and/or emergency power to other components of the integrated electrical assembly 10 in the event of loss of power. For example, the main electrical feed unit 80 may include a power inverter 84 with a battery unit, for example a 120V inverter. The power inverter 84 may be an emergency power pack inverter providing 120V in order to provide power to transformers, LED drivers to power the building structure's exterior lighting systems, individual units' interior lighting systems and/or emergency lighting systems. Thereby, the lighting systems may be used during normal operation and for emergency lighting. The power inverter 84 may be replaced with a transformer to power hospital outlets in order to provide isolated 120V power. The main electrical feed unit 80 may include a low voltage and/or data-corn conduit 81 and a removable cover 82, which may be ventilated. The main electrical feed unit 80 may also include one or more openings/knock-outs 801 for running appropriate wiring to and/or from the alternative power unit. The main electrical feed unit 80 may also include an electronic driver and/or dimmer module 86 that includes one or more electronic LED drivers 804 and, if desired, one or more driver dimming modules 808, and a switch 88 coupled to a torrodial transformer and/or the electronic driver and/or dimmer module 86 that activates low voltage lighting strip 17 when the swing door 12 is opened. The main electrical feed unit 80 may also include one or more plug-in transformers 87 to provide low voltage Class 2 power to electronic devices in the data-com component 70 and other compartments as required or to remote external locations within an individual unit. The main electrical feed unit 80 may also include one or more plugs 89 so that additional electronic devices can be plugged directly into the main electrical feed unit 80.

Referring now to FIGS. 52-56, an exemplary load center 90 that may be installed in the integrated electrical assembly 10 according to the present invention is shown. The load center 90 may include a load center door 91, which may be formed from a clear plastic, a load center panel cover 92, a panel 94, a load center housing 96 and lugs 98 for connecting the panel 94 to electrical wiring 7190 (FIGS. 71 and 72) that may be connected to electrical assembly power distribution block 83 of the main electrical feed unit 80. The electrical wiring 7190, shown in simplified form in FIGS. 71 and 72, may be pre-wired to the lugs 98 of the load center 90 so that all that is required during installation of the load center 90 and/or integrated electrical assembly 10 is connection of the wiring 7190 to the electrical assembly power distribution block 83. However, it is understood that such wiring 7190 may also be preconnected to the electrical assembly power distribution block 83 prior to installation of the integrated electrical assembly 10. Thus all feed risers are pre-wired in the factory, thereby reducing installation time on site. The panel 94 may include typical components found on an electrical panel, such as a supplemental or primary main disconnect, breakers, surge protection devices, grounding bars and neutral bars. In addition to including the typical components, the panel 94 may also be formed in such a manner so as to provide for a wire channel 99 within the load center 90 for at least the wiring 7190 (FIGS. 71 and 72). Referring still to FIGS. 52-56, the load center 90 may also include current transformers or other current monitoring devices on the main feeds and/or on one or more circuits protected by circuit breakers to monitor electrical usage. This may allow for users to review information regarding energy usage, and conserve energy as a result. Furthermore, demand sensing control devices may also be included in order to limit and/or control energy usage. The load center housing 96, panel 94 and load center panel cover 92 are configured to be installed and secured to the load center housing collar 95 by one or more fasteners 97. The fasteners 97 may be preinstalled on the load center housing 96, and then the head of the fasteners 97 may be positioned within tapered openings 93 of the load center housing collar 95 and then the fasteners 97 may be tightened in order to secure the load center housing 96 to the load center housing collar 95. Since the load center housing 96 and the panel 94 may be prewired with the appropriate wiring for the building structure and/or individual unit in which the load center 90 will be installed, it is understood that all that is required is for the load center housing 96 to be installed to the load center housing collar 95 in the manner discussed above, and the appropriate connections made between the wiring of the panel 94 to the electrical systems of the building structure and/or individual unit within the building structure. This exemplary design allows for labor related cost savings since much of the required wiring will have been connected in a controlled factory environment. As shown in FIG. 72, wiring from the load center 90 may be connected to the low voltage power supply unit 60 and/or loads of the individual unit, for example outlets, lighting, appliances, etc. The loads of the individual unit may be connected to the load center 90 either through cable connectors 32 or through hard-wired connections 7205. For example, the cable connectors 32 may be for pre-wired circuits of the individual unit having certain Amp ratings, e.g. 20 Amps or less and the hard-wired connections 7205 may allow for greater Amp ratings, e.g. 20 Amps or more. The connections may be made to one or more junction boxes 5001 that supply the loads of the individual unit. The junction boxes 5001 may be prewired in the walls of the individual unit prior to construction of the building structure. Since the load center 90 may be prewired to connectors 32 that are used to make connections to at least some of the loads of the individual unit, the load center 90 can be efficiently installed and/or removed from the integrated electrical assembly 10.

Exemplary junction boxes 5001 and 5101 that may be used with the integrated electrical assembly 10 are shown in detail in FIGS. 87-99, 87A-91A and 96A-99A. Referring to FIGS. 87-91 and 95, the junction box 5001 may include a back panel 5003 with at least four threaded adjustment lug 5006, a body 5009, at least one switch 5015, an interior cover 5019 configured to secure to the body 5009 so as to cover the components housed within the junction box 5001 and a decorative cover 5017 that may be configured to magnetically attach to the junction box 5001 by at least one magnet 5021. The magnet 5021 may preferably be a rare-earth magnet, such as a neodymium magnet. The at least one switch 5015 may also be other electrical components commonly found in junction boxes, such as outlets. The back panel 5003 and/or the body 5009 of the junction box 5001 may include one or more knock-outs 5011, and the back panel 5003 and the body 5009 may be secured to each other by suitable welding techniques. Referring now to FIGS. 89A-91A and 95, the decorative cover 5017 of the junction box 5001 may be removably secured to the junction box 5001 by one or more of the magnets 5021. As shown in FIGS. 89A-91A, even when the decorative cover 5017 is removed from the junction box 5001, the interior of the junction box 5001 is still covered by the interior cover 5019 so that the components therein are not exposed and thus the junction box 5001 without the decorative cover 5017 is configured for UL listing.

Referring now to FIGS. 92-94, the installation and adjustment of the junction box 5001 on an exemplary wall 5020 will now be discussed. As shown for example in FIG. 92, the junction box 5001 may be configured for installation from the back surface of the wall 5020. This exemplary design allows for simple cut-out in wall 5020, to be pre-wired and NRLT listed in a controlled factory environment, to be secured from rear of each junction box 5001, depth adjusted and acoustically sealed. In order to provide the junction box 5001 at the appropriate depth so that the decorative cover 5017 may be flushly secured to the junction box 5001 against the wall 5020. In order to adjust the junction box 5001 to the appropriate depth within the wall 5020, the tightening or loosening of the adjustment posts 5005 will cause the back panel 5003 to be pulled closer or pushed farther away from the wall 5020 as a result of the operative engagement between the adjustment posts 5005 and the threaded adjustment lugs 5006 on the back panel 5003. This configuration allows for adjustment and leveling of the junction box 5001 within the wall 5020. Then the junction box 5001 is secured to the wall 5020 by one or more fasteners 5027 placed through the slotted openings 5007 of the back panel 5003. A bead of acoustical putty 5023 may be placed between the back panel 5003 of the junction box 5001 and the wall 5020, and a layer of the acoustical putty 5023 may also be placed over the back panel 5003 of the junction box 5001 in order to reduce noise transfer through the junction box 5001. Once the junction box 5001 has been adjusted so that it is flush with the wall 5020, the decorative cover 5017 can be applied through use of the magnets 5021. In the event that additional materials and or decorations are added or removed from the walls, the junction box 5001 can be adjusted through the use of the adjustment posts 5005 and threaded adjustment lugs 5006. Furthermore, since the decorative cover 5017 is merely secured by magnets, wall treatments and/or wall panels placed on the wall 5020 can be efficiently and easily moved by simply removing and replacing the decorative cover 5017 on the junction box 5001. Referring particularly to FIG. 94, the knock-outs 5011 of the junction box 5001 may be positioned on the back panel 5003 and/or body 5009 so as to allow conduit 5025 running into and out of the junction box 5001 to be placed on the same plane so that the space required between walls 5020 to accommodate conduit from separate junction boxes 5001 is reduced. Referring now to FIGS. 96-99 and 96A-99A, therein illustrated is another exemplary embodiment of a junction box, generally indicated by reference numeral 5101 according to the present invention. The junction box 5101 contains the same construction, features and functionality as the junction box 5001 discussed above, but is configured in a 2-gang configuration. However, it is understood that the junction box according to the present invention may include any number of gangs as required for its application. FIG. 100 shows an alternative mounting configuration for the junction box 5101 in which the junction box 5101 may be surface mounted to the wall 5020.

Referring now to FIGS. 15-24, an alternative use for the integrated electrical assembly 10 is shown in which the integrated electrical assembly 10 is installed on a wall above the floor and/or ground level. The integrated electrical assembly 10 may be installed in such a configuration through use of additional support brackets 33 positioned on the bottom of the integrated electrical assembly 10. The additional support brackets 33 are similar to the support brackets 31 in that they allow the integrated electrical assembly 10 to be secured to the wall supports 24 while allowing for adjustment, for example leveling, of the integrated electrical assembly 10. The integrated electrical assembly 10 may also include a removable cover 36 for a conductor compartment for running wiring to additional floors. It is understood that the integrated electrical assembly 10 shown in FIGS. 15-24 may include all of the same components and features of the integrated electrical assemblies discussed above. The access cover 4005 has been removed in FIGS. 17 and 22 for clarity. It is further understood that the integrated electrical assembly 10 may be configured so as to provide an inherently protected type IC NRTL listing that requires zero clearance to combustible materials for installation in wood stud walls and clothing closets with clothes in direct contact with the enclosures.

Now referring to FIGS. 57-62, therein illustrated is another exemplary embodiment of an integrated electrical assembly, generally indicated by reference numeral 1010, according to the present invention. The integrated electrical assembly 1010 may be configured for installation in a dry location, for example an indoor location, and may include a ventilated door 1013. The integrated electrical assembly 1010 may be installed to structural members 1025 of a wall, for example wood or steel stud framing, or other structure by mounting brackets 1085. The integrated electrical assembly 1010 may include a master tub 1050 configured to contain one or more components of the integrated electrical assembly 1010. The components that may be included in the integrated electrical assembly 1010 include, but are not limited to, a low voltage power supply unit 1060, a data-com component 1070, an alternative power unit 1080 and a load center 1090. The integrated electrical assembly 1010 may also include an access panel 1100 positioned so as to allow accessibility to the wiring and other parts of the components that may be connected to other integrated electrical assemblies and or building systems. It is understood that the integrated electrical assembly 1010 and components thereof contain substantially the similar parts and construction as discussed above with respect to the integrated electrical assembly 10, however it is understood that he integrated electrical assembly 1010 may include less components then the integrated electrical assembly 10 due to its suitability for dry location use. For example, the integrated electrical assembly 1010 may not include a door and/or a frame as included in integrated electrical assembly 10. It is further understood that the integrated electrical assembly 1010 may be configured so as to provide an inherently protected type IC NRTL listing that requires zero clearance to combustible materials for installation in wood stud walls and clothing closets with clothes in direct contact with the enclosures.

Referring now to FIGS. 101-103 and 103A, therein illustrated is an exemplary embodiment of an integrated electrical assembly, generally indicated by reference numeral 510, according to the present invention. The integrated electrical assembly 510 may for example be master electrical distribution node for a building structure and/or a subspace (individual unit) within the building structure, such as one or more living units, hospital rooms, retail spaces, flex warehousing and the like, that integrates one or more electrical, lighting and/or data-com systems together. The integrated electrical assembly 510 may also be configured as a slave integrated electrical assembly 510 that receives wiring from the master electrical distribution node. It is understood that unless otherwise discussed, the integrated electrical assembly 510 has the same functionality as the integrated electrical assembly 10 discussed above, and that the integrated electrical assembly 510 is configured to receive and contain the same components as discussed above with respect to the integrated electrical assembly 10.

Still referring to FIGS. 101-103 and 103A, the integrated electrical assembly 510 may include a frame 511, a swing door 512 attached to the frame 511 by a hinge 518 and a mounting flange 516 extending around the periphery of the frame 511. Preferably, the hinge 518 may be a continuous piano hinge that may be formed from a non-corrosive or corrosion resistant metal, such as stainless steel. Even more preferably, the hinge 518 may be configured so as to support a heavy durable door, such as the swing door 512, and provide for pressure relief and/or reduction from high pressure water sprays/jet, for example from power washings of the building structure, in order to allow the integrated electrical assembly 510 to obtain at least a NEMA 4 listing. The mounting flange 516 may be constructed from a unitary piece of material, or may be assembled from several pieces of material that are connected by continuous weld seems. Preferably, when the mounting flange 516 is connected to the frame 511 the connections between the mounting flange 516 and the frame 511 and any pieces of the mounting flange 516 are watertight. The mounting flange 516 may include one or more compression gaskets 502 around the perimeter of the mounting flange 516. The compression gasket 502 may be adhesive backed so that it adheres to the surface to which the mounting flange 516 is installed. Furthermore, a single compression gasket 502 with a width substantially the same as the width of the mounting flange 516 may alternatively be used instead of multiple thinner compression gaskets 502. The compression gasket 502 may be formed from any suitable foam, rubber or silicon material or combinations thereof. The integrated electrical assembly 510 may also include a bottom panel 514 that may contain an outlet 19 with a watertight/water proof cover. For example, the outlet 19 may be a watertight twist lock receptacle, and may preferably be a NEMA 4 rated watertight twist lock receptacle. If the integrated electrical assembly 510 is acting as the master node for the building structure, the integrated electrical assembly 510 may also include a master feed enclosure 40 that may be positioned behind the bottom panel 514. The master feed enclosure 40 is shown in greater detail in FIGS. 13A and 13B, and has been discussed above with respect to integrated electrical assembly 10. It is understood that the master feed enclosure 40 has the same components and functions in the same manner with the integrated electrical assembly 510 as it does with the integrated electrical assembly 10. For example, one or more high voltage risers (not shown) may extend from the master feed enclosure 40 and be configured to connect to another integrated electrical assembly 510 within the building structure.

Referring now to FIGS. 101-107, 107A and 108-113, the swing door 512 of the integrated electrical assembly 510 may contain a door handle 521 for permitting access to and closing of the swing door 512, and the door handle 521 may contain a locking mechanism, such as a keyed tumbler, in order to allow for restricting access to the integrated electrical assembly 510. The door handle 521 may be swing handle, such as Swing Handle No. 1154 available from EMKA Inc. of Middletown, Pa. The swing door 512 may also include additional locking mechanisms 521*a* that may be quarter-turn compression latches, such as Quarter-Turn Assembly Nos. 1000 available from EMKA Inc. The locking mechanisms 521*a* may be operable through the use of a key or tool. Each of the door handle 521 and locking mechanisms 521*a* may each be operatively connected to a latching mechanism 537, for example cam latches, configured to secure the swing door 512 to the frame 511 when the swing door 512 is in a closed position. Preferably the combination of the door handle 521, locking mechanisms 521*a* and latching mechanisms 537 may be configured to provide for a three-point closure, in which there is at least one latching mechanism 537 located towards the top, bottom and middle of the swing door 512. It is understood that while separate locking mechanisms are shown for each latching mechanisms 537, the present invention may also include configurations in which a single locking mechanism 521*a* and/or handle 521 controls the operation of multiple latching mechanisms 537. The latching mechanisms 537 may engage with corresponding receptacles 538*a* in the frame 511 of the integrated electrical assembly 510. Each of the receptacles 538*a* may be a sealed-container with an opening on one side for receiving the corresponding latching mechanism 537. The receptacles 538*a* are sealed to the frame 511 and enclosed so that they form a watertight compartment separated from the interior of the integrated electrical assembly 510. Furthermore, the receptacles 538*a* may include a convex surface (not shown) configured for engagement with the corresponding latching mechanism 537 so as to provide an additional camming surface to facilitate tight closure of the swing door 512 again the frame 511 of the integrated electrical assembly 510. The swing door 512 may also include one or more removable panels 539 in order to permit access to the one or more latching mechanisms 537 and interior components of the door handle 521 and locking mechanisms 521*a* for maintenance and/or repair when the swing door 512 is in an open position. The removable panels 539 may be gasketed onto the swing door 512 in order to provide a watertight seal. The swing door 512 of the integrated electrical assembly 510 may also include one or more threaded plugs 535 that are configured to threadenly engage with a threaded fastener (not shown) in order to allow items, such as rain and/or decorative door panels (not shown), to be secured to the swing door 512 and/or the integrated electrical assembly 510. The threaded plugs 535 may be configured such that the threaded plugs 535 are compressed when the threaded fastener is tightened onto the threaded plugs 535 so as to seal the threaded plugs 535 against the swing door 512. The swing door 512 of the integrated electrical assembly 510 may also include a low voltage lighting strip (not shown), for example an LED strip or similar, that provides illumination to the integrated electrical assembly 510 when the swing door 512 of the integrated electrical assembly 510 is in an open position. The swing door 512 may also include at least one I-beam 529, or other structural member such as a pair of C-channels, formed or fabricated within the swing door 512 so as to provide structural rigidity to the swing door 512, and to prevent heat warping of the swing door 512. The space within the swing door 512 may be at least partially filled with insulation (not shown) so that the integrated electrical assembly 510 is resistive to heat and/or cold transfer from outside the integrated electrical assembly 510 to the components within the integrated electrical assembly. It is understood that the swing door 512 may be configured to be opened to 180°, but that the swing door 512 may include mechanisms (not shown) in order to permit the swing door 512 to only open a certain amount so as to prevent accidental damage to nearby objects and/or persons, or may include fixed and/or adjustable stops (not shown) that are configured to hold the swing door 512 open at a particular open position, for example at 90°. The swing door 512 may also include a continuous peripheral lip 558 that flares outwardly from the non-hinge side, top and bottom of the swing door 512 in order to produce a shoulder formation on the non-hinge side, top and bottom of the swing door 512. The peripheral lip 558 acts to engage a gasket 534e (FIGS. 115A, 115B & 116A) on the frame 511 of the integrated electrical assembly 510 when the swing door 512 is closed in order to contribute to a watertight seal between the swing door 512 and the frame 511, as discussed further below.

Referring now to FIGS. 114 and 117-119, the integrated electrical assembly 510 may be configured for installation in an exemplary wall 20, which may be for example an exterior wall. The integrated electrical assembly 510 may be positioned in an opening formed in the wall 20 that may be flanked by one or more wall supports 24 and a floor surface 22 on the bottom of the opening, as shown in FIGS. 118 and 119. The wall support 24 may be an industry standard steel stud or a formed metal stud, for example a roll formed and stamped steel stud such as a DELTASTUD available from Steelform Building Products Inc. The floor surface 22 may be any suitable building flooring surface and/or structure, and may be for example concrete. In the alternative, the integrated electrical assembly 510 may be installed on a wall 20 above the floor and/or ground level, as shown in FIGS. 114, 117 and 120. The integrated electrical assembly 510 may be installed in such a configuration through use of support brackets (not shown) positioned on the bottom of the integrated electrical assembly 510, in the same manner that the integrated electrical assembly 10 discussed above is supported on a wall above the floor and/or ground level.

Referring now to FIGS. 114A, 118A, 119A and 120A, the opening in the wall 20 may preferably be bordered along its perimeter by a metallic wall plate 559 that is affixed to the wall 20 by one or more fasteners (not shown), such as screws or nails, through a wall plate mounting holes 571 spaced about the perimeter of the metallic wall plate 559. The metallic wall plate 559 may also include one or more mounting holes 523a through which fasteners used to attach the integrated electrical assembly 510 to the wall may be passed. The metallic wall plate 559 may be formed by one or more panels or strips, or may by formed from a unitary piece of material. Preferably, the metallic wall plate 559 is made from a non-corrosive or corrosion resistant material, such as stainless steel or galvanized steel. A bead of a sealant (not shown), such as silicon, polyurethane, acrylic, adhesive, epoxy, may be placed between the metallic wall plate 559 and the wall 20 so as to provide for a water tight seal between the metallic wall plate 559 and the wall 20. In the alternative, a gasket (not shown) may be provided on the metallic wall plate 559 in order to seal the metallic wall plate 559 to the wall 20. The metallic wall plate 559 acts to provide a known mounting surface on which the integrated electrical assembly 510 may be mounted regardless of the material used for the wall 20.

Referring again to FIGS. 114 and 117-119, the integrated electrical assembly 510 may be secured to the metallic wall plate 559 and the wall 20 through use of one or more fasteners 526, such as nails, screws, bolts, lag screws, lag bolts or a combination thereof, that are passed through the mounting holes 523 in the mounting flange 516. It is understood that the integrated electrical assembly 510 should preferably be secured to the metallic wall plate 559 and the wall 20 such that the compression gasket 502 forms a watertight seal between the mounting flange 516 and the metallic wall plate 559 so as to prevent the infusion of liquids into the integrated electrical assembly 510. A vertical rain channel 573 may also be installed on the integrated electrical assembly 510 by the one or more fasteners 526 on the side of the frame 511 opposite the hinge 518. The vertical rain channel 573 acts to divert liquids away from the joint between the swing door 512 and the frame 511, as well as provide a transition for any decorative panels (not shown) that may be installed on the swing door 512 and/or the wall 20. A hinge side rain channel 575 may also be included on the on the hinge 518 side of the frame to divert liquids away from the hinge 518 and to provide a transition for any decorative panels (not shown) that may be installed on the swing door 512 and/or the wall 20. A top rain shield drip edge 547 may also be installed above the swing door 512 on the top edge of the integrated electrical assembly 510 in order to prevent and/or reduce moisture, such as rain, from running down the wall 20 onto the integrated electrical assembly 510.

Referring now to FIGS. 106, 107, 107A, 108, 115A, 115B, 116, 116A, 116B, 121, 122, 122A and 122B, the construction and interaction of the swing door 512 and the frame 511 of the integrated electrical assembly 510 to provide for a watertight coupling will now be discussed. The top, bottom and sides of the swing door 512 are sealed to the frame 511 when the swing door 512 is shut by a series of gasket-structure interactions. From the outer perimeter of the door towards the inner area of the frame 511 these gasket-structure interactions are as follows: (1) gasket 534e—continuous peripheral lip 558, (2) door gasket 534f—housing lip 527, outside perimeter blade 578 and inside perimeter blade 579 and (3) inner frame gasket 534a—interior door blade 585. The first interaction between the swing door 512 and the frame 511, as mentioned above, is the interaction between the gasket 534e on the frame 511 and the continuous peripheral lip 558 on the swing door 512. It is understood that due to the presence of the hinge 518, this interaction is only present on the non-hinge side, top and bottom of the swing door 512. The continuous peripheral lip 558 extends at an angle relative to the perimeter of the swing door 512, which acts to facilitate directing fluids away from the gasket 534e when the continuous peripheral lip 558 is engaged with the gasket 534e. When the swing door 512 is in a closed position relative to the frame 511 of the integrated electrical assembly 510 the continuous peripheral lip 558 engages with and may be embedded into the gasket 534e so that a watertight seal is formed between the continuous peripheral lip 558. The second interaction between the swing door 512 and the frame 511 is the interaction between a housing lip 527 extending around the inside perimeter of the mounting flange 516, which includes an outside perimeter blade 578 and an inside perimeter blade 579 extending around the outside perimeter and inside perimeter respectively of the housing lip 527 and a door gasket 543f positioned in a door channel 528 extending around the perimeter of the swing door 512. The outside perimeter blade 578 and inside perimeter blade 579 are positioned substantially parallel to each other, and extend substantially perpendicular to the mounting flange 516. The outside perimeter blade 578 and inside perimeter blade 579 extend away from the mounting flange 516 a greater distance than the housing lip 527 so that the housing lip 527 is recessed relative to the heights of the outside perimeter blade 578 and the inside perimeter blade 579. This extension of the outside perimeter blade 578 and the inside perimeter blade 579 relative to the housing lip 527 facilitates engagement and compression of the door gasket 534f when the swing door 512 is closed. The outside perimeter blade 578 and the inside perimeter blade 579 provides two points of contact with the door gasket 534f so as to assure a watertight seal is formed when the swing door 512 is closed. The outside perimeter blade 578 and the inside perimeter blade 579 act to focus compression of the door gasket 534f, instead of spreading compression of the door gasket 534f over a larger area. However, it is understood that the door gasket 534f may be positioned and/or sized such that it also contacts the housing lip 527 to provide an additional surface on which it may be sealed. It is understood that the second interaction discussed above occurs around the entire perimeter of the swing door 512, i.e. top, bottom, hinge side and non-hinge side. The third interaction between the swing door 512 and the frame 511 is the interaction between the interior door blade 585 extending around an inside perimeter edge of the back of the swing door 512 and the inner frame gasket 534a positioned on the inside perimeter of the door opening in the frame 511 adjacent to the inside perimeter blade 579 and housing lip 527. The interior door blade 585 extends around the entire inside perimeter edge of the back of the swing door 512 and is raised relative to the back of the swing door 512 so that when the swing door 512 is closed, the interior door blade 585 contacts the inner frame gasket 534a prior to any contact by the back of the swing door 512 with the inner frame gasket 534a. This extension of the interior door blade 585 relative to the back of the swing door 512 facilitates engagement and compression of the inner frame gasket 534a when the swing door 512 is closed. While it is understood that any of the interactions discussed above are sufficient to produce a watertight seal, and that not all of the interactions are necessary to provide a watertight seal, it may be desirable to include one or more of the interactions in the integrated electrical assembly in order to provide a backup system should one of the interactions fail due to wear, manufacturing defects or damage. Furthermore, another interaction between a door top gasket 534g and an inner drip edge blade 507 may also be provided as another option to increase the water tightness of the top edge of the integrated electrical assembly 510. In addition to engaging with and compressing the door top gasket 534g to produce a watertight seal, the inner drip edge blade 507 may also act as a channel to redirect any water that may penetrate the gasket 534e—continuous peripheral lip 558 interaction away from the top edge of the opening to the integrated electrical assembly 510.

Referring now specifically to FIGS. 116 and 116B, it should be particularly noted that the positioning of the hinge 518 relative to the swing door 512 and the frame 511 of the integrated electrical assembly 510 is such that the hinge 518 is positioned outside of the door gasket 534f—housing lip 527, outside perimeter blade 578 and inside perimeter blade 579 interaction, and the inner frame gasket 534a—interior door blade 585 interaction. Such positioning, in particular having one side of the hinge 518 lay flat on the mounting flange 516 of the integrated electrical assembly 510 ensures that at least two watertight interactions are positioned after the hinge 518 so that it is not necessary that the hinge 518 itself be watertight. However, it is contemplated that watertight hinges are not excluded from the present invention.

As mentioned above, it is understood that the integrated electrical assembly 510 has substantially the same functionality and construction as discussed above with respect to the integrated electrical assembly 10 unless otherwise noted. For example, the integrated electrical assembly 510 may be used for and/or replace the uses of the integrated electrical assembly 10 with respect to decorative panels shown in and discussed with respect to FIGS. 2A and 6A, any and/or all components 30, 60, 70, 80, 90 shown in and discussed with respect to FIGS. 9-10 and 13, the wiring connections shown in and discussed with respect to FIGS. 14C, 14D, 14E and 23-24, the master tub 50 shown in and discussed with respect to FIGS. 25-29 and the systems shown in and discussed with respect to FIGS. 71-72. Accordingly, it is understood that such discussions and drawings are not being repeated, but that the integrated electrical assembly 510 can be used in a manner and for any purpose discussed and/or shown in relation to integrated electrical assembly.

It is understood that the integrated electrical assemblies and components thereof are not limited to any particular material and/or construction, but it is preferable that the integrated electrical assemblies be constructed of substantially durable materials to suit their intended purposes. It may also be preferable that the materials used to form or manufacture the integrated electrical assemblies and components thereof be treated and prepared so as to resist corrosion or physical damage, for example by preparation through suitable powder-coating techniques. Preferably, the frames and swing doors of the integrated electrical assemblies 10 and 510 may be formed from galvannealed steel with a powder-coating sufficient to obtain a NEMA X rating for salt spray, such as a NEMA 4X rating.

It will thus be seen that the objects set forth above, among those made apparent from the preceding description, are efficiently attained and, since certain changes may be made in the above article without departing from the scope of this invention, it is intended that all matter contained in this disclosure or shown in the accompanying drawings, shall be interpreted, as illustrative and not in a limiting sense. It is to be understood that all of the present figures, and the accompanying narrative discussions of corresponding embodiments, do not purport to be completely rigorous treatments of the invention under consideration. It is to be understood that the above-described arrangements are only illustrative of the application of the principles of the present invention. Numerous modifications and alternative arrangements may be devised by those skilled in the art without departing from the scope of the present invention.

What is claimed is:

1. An integrated electrical assembly, comprising:
  a frame having a first side, a second side, a third side and a fourth side defining a periphery of the frame;
  a mounting flange extending around the periphery of the frame;
  a lip extending from the frame and positioned within the periphery of the frame;
  a swing door coupled to the frame by a hinge and configured for positioning in a closed position relative to the frame, and wherein the swing door comprises a channel extending at least partially around the perimeter of the swing door and configured for positioning over at least a portion of the lip when the swing door is in the closed position;

a first gasket positioned within the channel of the swing door so as to be between the channel of the swing door and the lip of the frame when the swing door is in the closed position;

a second gasket extending along the first side, second side and third side of the frame and positioned so as to be between the perimeter of the swing door and the frame when the swing door is in the closed position; and a third gasket positioned adjacent to the lip and recessed within the frame relative to the lip so as to be between the swing door and the frame when the swing door is in the closed position; and a master tub configured for attachment to the frame, wherein the master tub includes a plurality of coupled enclosures, wherein each of the plurality of enclosures is configured to receive at least one electrical component.

2. The integrated electrical assembly of claim 1, wherein the swing door includes three latching mechanisms, wherein the three latching mechanisms are each proximate an edge of the swing door.

3. The integrated electrical assembly of claim 2, wherein the frame includes three sealed receptacles configured to receive one of the three respective latching mechanisms.

4. The integrated electrical assembly of claim 1, wherein the enclosure is configured to be installed in an opening of a wall, wherein the opening is bordered by a metallic wall plate, the metallic wall plate configured to be coupled to the mounting flange.

5. The integrated electrical assembly of claim 1, wherein the swing door further includes a lip around the perimeter of the swing door, wherein the lip flares outwardly to engage with the first gasket when the swing door is in the closed position.

6. The integrated electrical assembly of claim 1, wherein the hinge couples the swing door to the frame at the fourth side of the frame.

7. The integrated electrical assembly of claim 1, further comprising at least one shield positioned along the first side, second side and/or fourth side of the frame.

8. The integrated electrical assembly of claim 7, wherein each of the at least one shields is configured to provide a physical barrier to the integration of fluid onto the perimeter of the swing door.

9. The integrated electrical assembly of claim 1, wherein each of the first gasket, the second gasket and the third gasket are configured for compression between the frame and the swing door to produce a seal that is substantially air, water and/or dust tight.

* * * * *